(12) United States Patent
Cook

(10) Patent No.: US 12,336,185 B2
(45) Date of Patent: Jun. 17, 2025

(54) MEMORY DEVICE ASSEMBLY WITH NON-IMPINGED LEAKER DEVICES

(71) Applicant: Micron Technology, Inc., Boise, ID (US)

(72) Inventor: Beth R. Cook, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 505 days.

(21) Appl. No.: 17/815,420

(22) Filed: Jul. 27, 2022

(65) Prior Publication Data

US 2023/0397435 A1 Dec. 7, 2023

Related U.S. Application Data

(60) Provisional application No. 63/365,639, filed on Jun. 1, 2022.

(51) Int. Cl.
*H10B 53/30* (2023.01)
*G11C 11/22* (2006.01)

(52) U.S. Cl.
CPC .................... *H10B 53/30* (2023.02)

(58) Field of Classification Search
None
See application file for complete search history.

(56) References Cited

U.S. PATENT DOCUMENTS

2023/0397433 A1* 12/2023 Simsek-Ege ........... H10B 53/30
2023/0397434 A1* 12/2023 Mariani ............... H10B 12/033

* cited by examiner

*Primary Examiner* — Tan T. Nguyen
(74) *Attorney, Agent, or Firm* — Harrity & Harrity, LLP

(57) ABSTRACT

Implementations described herein relate to various structures, integrated assemblies, and memory devices. In some implementations, an integrated assembly includes a cell plate, a top electrode, and an insulator that separates the top electrode from bottom electrodes. The integrated assembly may include a first group of bottom electrodes that are coupled to the cell plate via a corresponding first group of leaker devices, wherein a first region between the first group of leaker includes the top electrode and the insulator. The integrated assembly may include a second group of bottom electrodes that are electrically coupled to the cell plate via a corresponding second group of leaker devices, wherein a second region between the second group of leaker devices does not include the top electrode and does not include the insulator. The first group of leaker devices and the second group of leaker devices have substantially identical electrical properties.

25 Claims, 36 Drawing Sheets

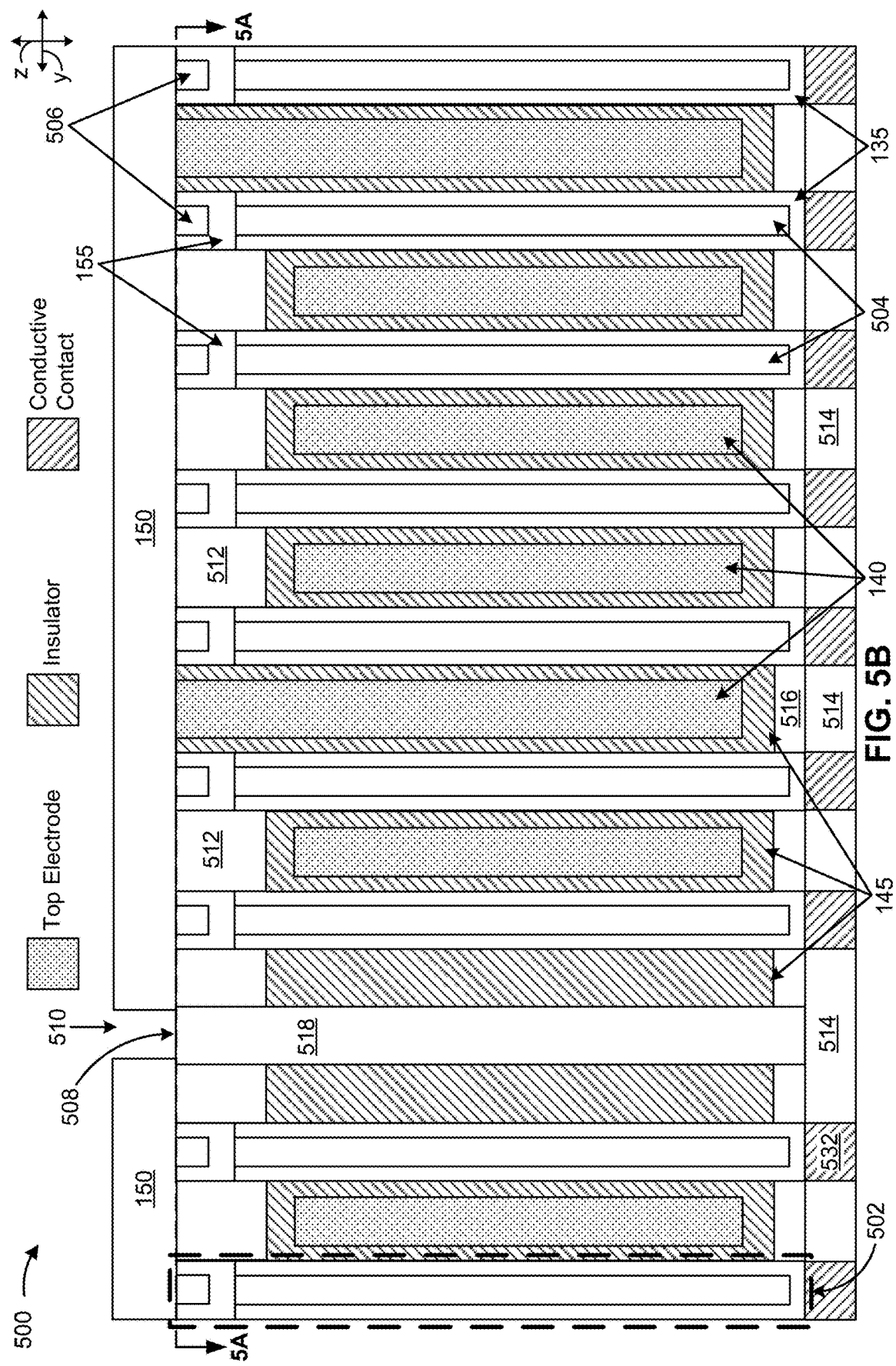

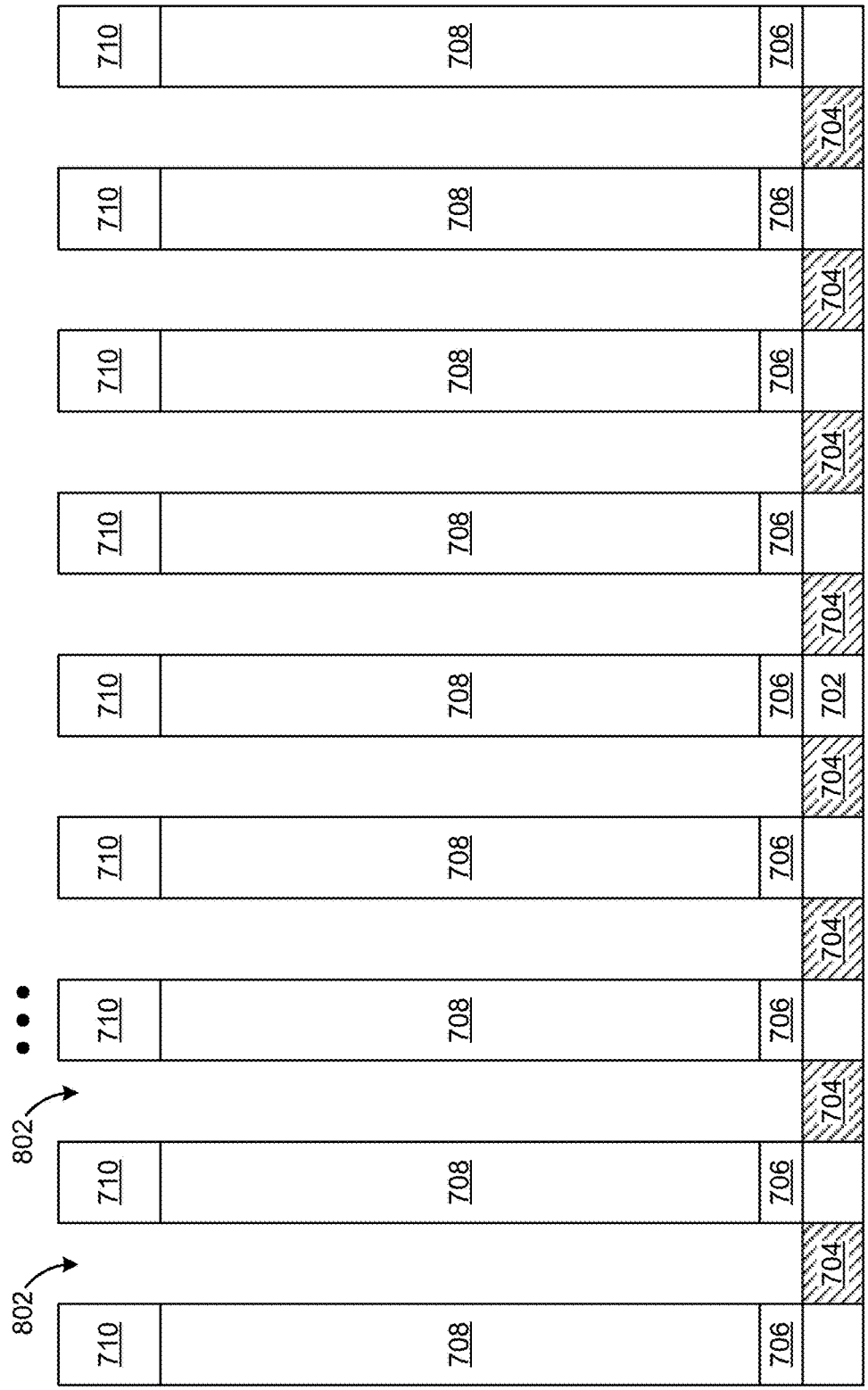

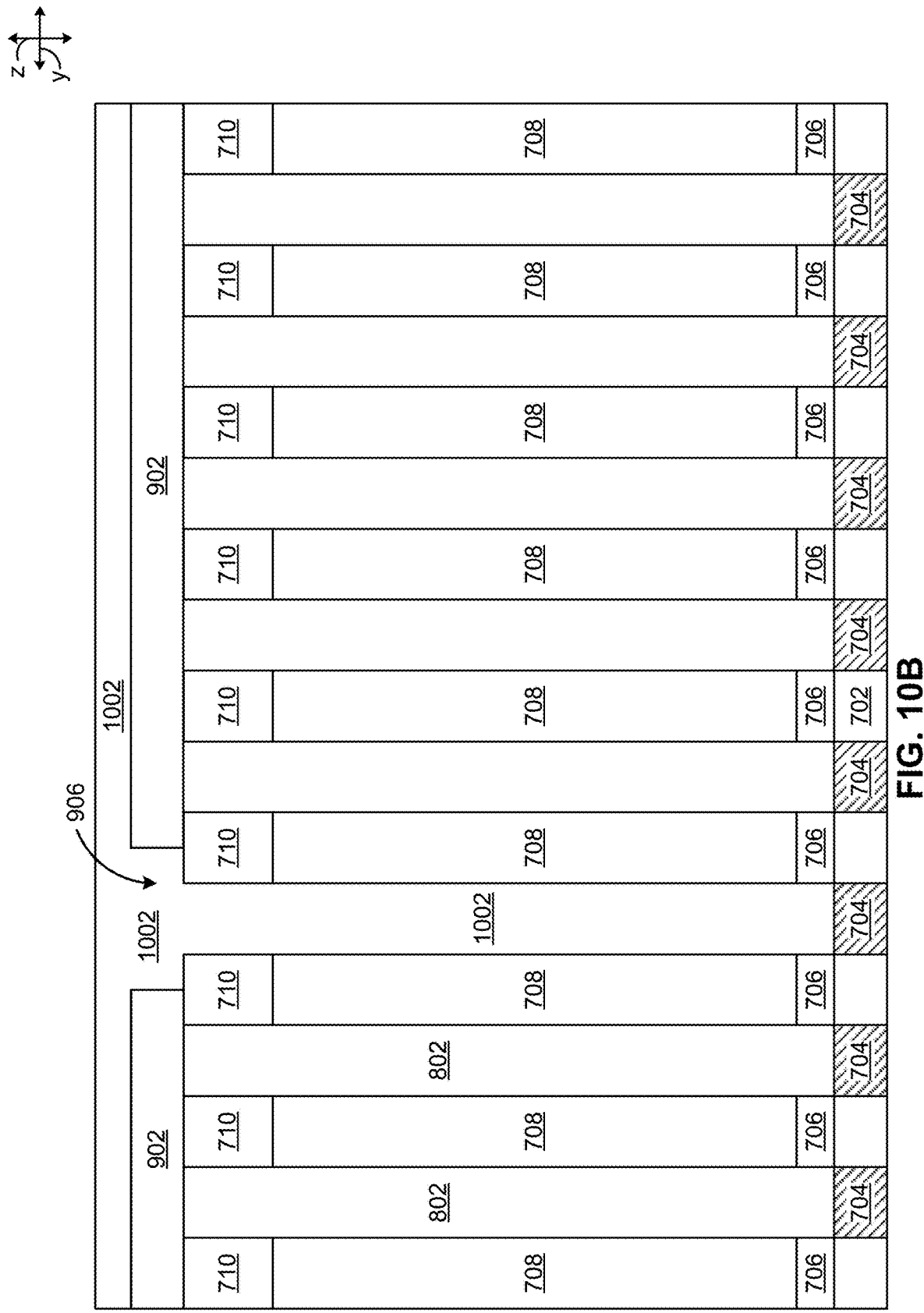

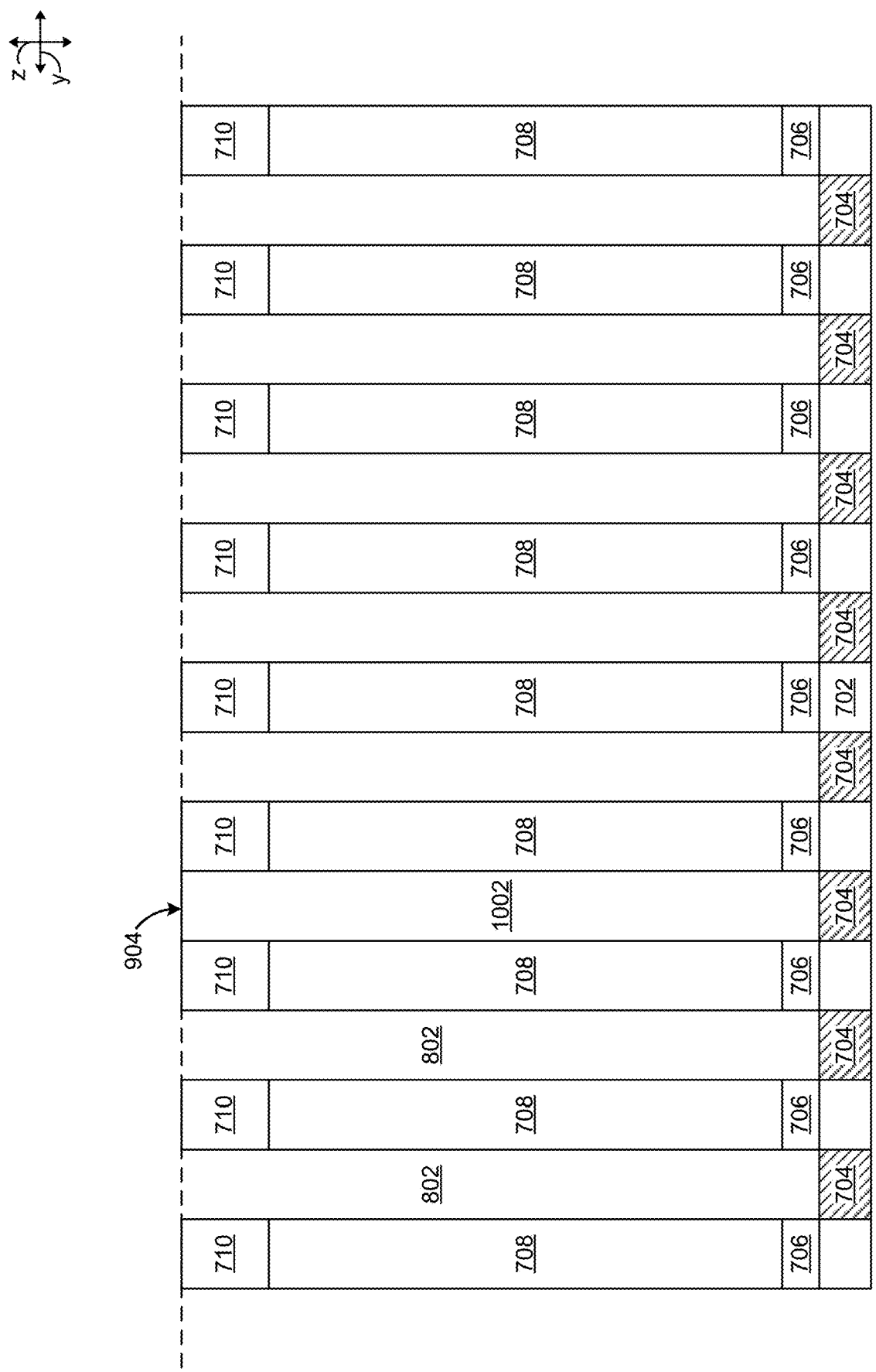

MEMORY DEVICE ASSEMBLY WITH NON-IMPINGED LEAKER DEVICES

CROSS-REFERENCE TO RELATED APPLICATION

This Patent Application claims priority to U.S. Provisional Patent Application No. 63/365,639, filed on Jun. 1, 2022, and entitled "MEMORY DEVICE ASSEMBLY WITH NON-IMPINGED LEAKER DEVICES." The disclosure of the prior Application is considered part of and is incorporated by reference into this Patent Application.

TECHNICAL FIELD

The present disclosure generally relates to semiconductor devices and methods of forming semiconductor devices. For example, the present disclosure relates to a memory device assembly with non-impinged leaker devices.

BACKGROUND

Memory devices are widely used to store information in various electronic devices. A memory device includes memory cells. A memory cell is an electronic circuit capable of being programmed to a data state of two or more data states. For example, a memory cell may be programmed to a data state that represents a single binary value, often denoted by a binary "1" or a binary "0." As another example, a memory cell may be programmed to a data state that represents a fractional value (e.g., 0.5, 1.5, or the like). To store information, the electronic device may write, or program, a set of memory cells. To access the stored information, the electronic device may read, or sense, the stored state from the set of memory cells.

Various types of memory devices exist, including random access memory (RAM), read only memory (ROM), dynamic RAM (DRAM), static RAM (SRAM), synchronous dynamic RAM (SDRAM), ferroelectric RAM (FeRAM), magnetic RAM (MRAM), resistive RAM (RRAM), flash memory (e.g., NAND memory and NOR memory), and others. A memory device may be volatile or non-volatile. Non-volatile memory (e.g., flash memory) can store data for extended periods of time even in the absence of an external power source. Volatile memory (e.g., DRAM) may lose stored data over time unless the volatile memory is refreshed by a power source. A binary memory device may, for example, include a charged or discharged capacitor. A charged capacitor may, however, become discharged over time through leakage currents, resulting in the loss of the stored information. Some features of volatile memory may offer advantages, such as faster read or write speeds, while some features of non-volatile memory, such as the ability to store data without periodic refreshing, may be advantageous.

FeRAM may use similar device architectures as volatile memory but may have non-volatile properties due to the use of a ferroelectric capacitor as a storage device. For example, FeRAM has advantages of faster write speeds and endurance for repeated memory access with lower power consumption than other types of non-volatile memory. FeRAM can provide non-volatile functionality comparable to that of flash memory with a speed and architecture comparable to that of dynamic random access memory (DRAM). Thus, FeRAM devices may have improved performance compared to other types of non-volatile memory and/or volatile memory.

BRIEF DESCRIPTION OF THE DRAWINGS

FIGS. 5A and 5B are diagrammatic views of an example structure described herein. FIG. 5A is a top cross-sectional view along the line 5A-5A of FIG. 5B, and FIG. 5B is a side cross-sectional view along the line 5B-5B of FIG. 5A.

FIG. 7A is a top view, and FIG. 7B is a cross-sectional view along the line 7B-7B of FIG. 7A.

FIGS. 8A and 8B are diagrammatic views showing formation of the structure of FIGS. 5A-5B at an example process stage that is after the example process stage of FIGS. 7A and 7B. FIG. 8A is a top view, and FIG. 8B is a cross-sectional view along the line 8B-8B of FIG. 8A.

FIG. 9A is a top view, and FIG. 9B is a cross-sectional view along the line 9B-9B of FIG. 9A.

FIGS. 10A and 10B are diagrammatic views showing formation of the structure of FIGS. 5A-5B at an example process stage that is after the example process stage of FIGS. 9A and 9B. FIG. 10A is a top view, and FIG. 10B is a cross-sectional view along the line 10B-10B of FIG. 10A.

FIGS. 11A and 11B are diagrammatic views showing formation of the structure of FIGS. 5A-5B at an example process stage that is after the example process stage of FIGS. 10A and 10B. FIG. 11A is a top view, and FIG. 11B is a cross-sectional view along the line 11B-11B of FIG. 11A.

FIG. 12A is a top view, and FIG. 12B is a cross-sectional view along the line 12B-12B of FIG. 12A.

FIG. 13A is a top view, and FIG. 13B is a cross-sectional view along the line 13B-13B of FIG. 13A.

FIG. 14A is a top view, and FIG. 14B is a cross-sectional view along the line 14B-14B of FIG. 14A.

FIG. 15A is a top view, and FIG. 15B is a cross-sectional view along the line 15B-15B of FIG. 15A.

FIG. 16A is a top view, and FIG. 16B is a cross-sectional view along the line 16B-16B of FIG. 16A.

16A and 16B. FIG. 17A is a top view, and FIG. 17B is a cross-sectional view along the line 17B-17B of FIG. 17A.

FIG. 18A is a top view, and FIG. 18B is a cross-sectional view along the line 18B-18B of FIG. 18A.

FIG. 19A is a top view, and FIG. 19B is a cross-sectional view along the line 19B-19B of FIG. 19A.

FIG. 20A is a top view, and FIG. 20B is a cross-sectional view along the line 20B-20B of FIG. 20A.

DETAILED DESCRIPTION

Read disturb errors in memory cells can occur due to the accumulation of excess charge within a memory cell. For example, excess charge may accumulate at a bottom electrode of a capacitor included in the memory cell. Such accumulation may occur in FeRAM or other types of memory devices as a result of, for example, plate glitch, access transistor leakage, interactions among memory cells, and/or other factors.

Some implementations described herein use leaker devices to dissipate excess charge that has accumulated at bottom electrodes of capacitors in memory cells. Furthermore, some implementations described herein enable leaker devices to be formed with reduced variation in electrical properties and physical dimensions across different leaker devices, which enables more robust and reliable memory device operation. Additionally, some implementations described herein may reduce process variation during memory device fabrication and/or may increase manufacturing yield.

Figure 1:
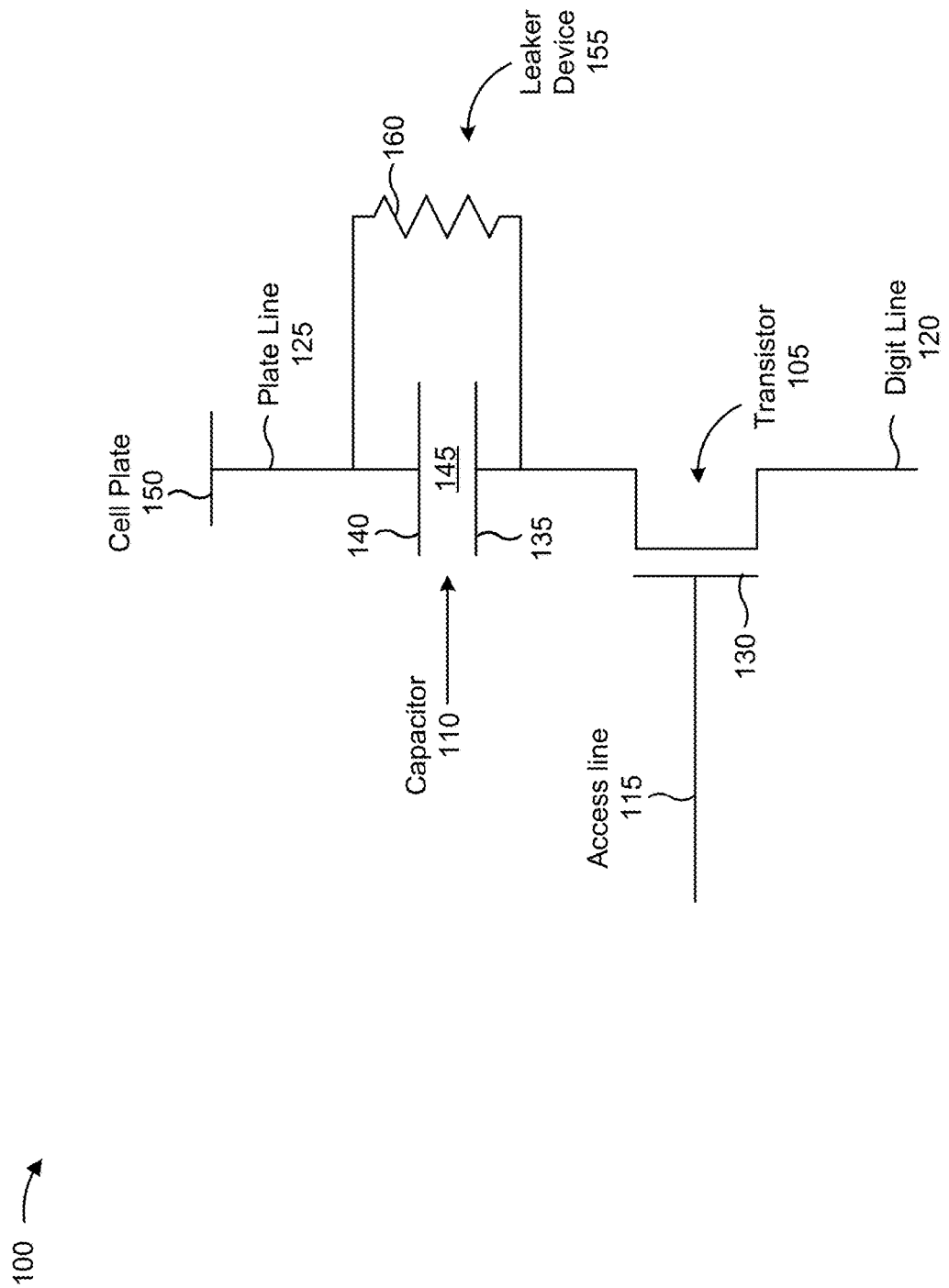
FIG. 1 is a circuit diagram of an example memory cell.

FIG. 1 is a circuit diagram of an example memory cell 100. In some implementations, the memory cell 100 is a ferroelectric memory cell. As shown in FIG. 1, the memory cell 100 may include a transistor 105 (or another type of selection circuit) and a capacitor 110. The memory cell 100 may be accessed (e.g., written to, read from, and/or erased) using signals on a combination of lines that are coupled to the memory cell 100, shown as an access line 115 (sometimes called a "word line"), a digit line 120 (sometimes called a "bit line"), and a plate line 125.

The transistor 105 (sometimes called an access transistor) may include a gate 130. The capacitor 110 includes a bottom electrode 135 and a top electrode 140 separated by an insulator 145. In some implementations, the capacitor is a ferroelectric capacitor, and the insulator 145 is a ferroelectric insulator that comprises, consists of, or consists essentially of ferroelectric material. When the access line 115 is activated (e.g., when a voltage is applied to the access line 115), the gate 130 coupled to the access line 115 may be activated. When the gate 130 is activated, the transistor 105 couples the digit line 120 to the bottom electrode 135 of the capacitor 110. A state of the memory cell 100 may then be written or read via the digit line 120.

The top electrode 140 of the capacitor 110 may be coupled to the plate line 125 and a cell plate 150. To write to (or program) the memory cell 100, the access line 115 may be activated, and a voltage may be applied across the capacitor 110 by controlling the voltage of the top electrode 140 (via the plate line 125 and/or the cell plate 150) and/or the bottom electrode 135 (via the digit line 120). The applied voltage creates an electric field, and the atoms in the ferroelectric material of the insulator 145 respond to the electric field to become arranged in a particular state (e.g., a particular orientation or polarization), which is representative of a data state (e.g., a logic "0" state or a logic "1" state). In some implementations, data may be stored using the capacitor 110 by controlling a voltage difference and/or a polarity difference of the capacitor 110 (e.g., of the insulator 145 between the bottom electrode 135 and the top electrode 140). For example, a voltage of the cell plate 150 and the digit line 120 may be controlled. In some implementations, a negative polarity of the insulator 145 as compared to the cell plate 150 results in a logic "0" state being stored in the capacitor 110, and a positive polarity of the insulator 145 as compared to the cell plate 150 results in a logic "1" state being stored in the capacitor 110.

To read the memory cell 100 (e.g., a state stored by the capacitor 110), the access line 115 may be activated, and a voltage may be applied to the plate line 125. Applying a voltage to the plate line 125 may cause a change in the stored charge on the capacitor 110. The magnitude of the change in stored charge may depend on the stored state of capacitor 110 (e.g., whether the stored state is a logic "1" state or a logic "0" state). This may or may not induce a threshold change in the voltage of the digit line 120 based on the charge stored on the capacitor 110. The change in voltage or lack of change in voltage of the digit line 120 (or a magnitude of the change in voltage) may be used to determine the stored state of the capacitor 110. For example, if the change in voltage satisfies a threshold, then the read operation indicates that a first state was stored in the capacitor 110, whereas if the change in voltage does not satisfy the threshold, then the read operation determines that a second state was stored in the capacitor 110. In some cases, multiple threshold voltages may be used, such as when the capacitor is capable of storing more than two data states (e.g., for a multi-level cell, a triple-level cell, and so on).

In some cases, excess charge may build up or accumulate at the bottom electrode 135 of the memory cell 100, which may disrupt or disturb the reading of the stored state of the memory cell 100, and in some cases may cause incorrect data to be read from the memory cell 100. This excess charge buildup is sometimes called a memory cell disturbance, and a resulting read of the memory cell 100 affected by a memory cell disturbance is sometimes called a read disturbance.

As an example, excess charge may accumulate at the bottom electrode 135 of a memory cell 100 when the memory cell 100 is not accessed (e.g., the access line 115 and the gate 130 are deactivated), but one or more other memory cells coupled to the digit line 120 are accessed. When the accessed memory cells are read, the voltage applied to the plate line(s) 125 coupled to the accessed memory cells causes a corresponding voltage on the digit line 120 because the capacitors of the accessed memory cells discharge the plate line voltage through the gates of the accessed memory cells to the digit line 120. If the non-accessed memory cell 100 is coupled to a leaky transistor 105, then the voltage on the digit line 120 may leak through the transistor 105 to the bottom electrode 135 of the non-accessed memory cell 100. Repeated accesses to memory cells that share the digit line 120 with the non-accessed memory cell 100 may cause further accumulation in charge on the bottom electrode 135 of the non-accessed memory cell 100. As a result, reading of the memory cell 100 becomes less reliable, and the capacitor 110 may even become depolarized from an intended (e.g., programmed) state.

Some implementations described herein use a leaker device 155 to dissipate excess charge from the bottom electrode 135. The leaker device 155 may couple the bottom electrode to a cell plate 150. The leaker device 155 may include a resistor 160 configured with appropriate resistance to discharge excess charge from the bottom electrode 135 to the cell plate 150 without discharging too much charge from the bottom electrode 135 (e.g., such that the capacitor 110 can maintain an appropriate charge or polarity to store correct data). Furthermore, some implementations described herein enable leaker devices 155 associated with different memory cells 100 (e.g., a first leaker device 155 coupled to a first memory cell 100, a second leaker device 155 coupled to a second memory cell, and so on) to be formed with reduced variation in electrical properties and physical dimensions across those leaker devices, which enables more robust and reliable memory device operation. In some implementations, leaker devices 155 associated with different memory cells 100 may be formed with one or more substantially identical electrical properties (e.g., with less than a threshold degree of variation), such as a substantially identical conductivity, a substantially identical resistance, or the like. Additionally, or alternatively, leaker devices 155 associated with different memory cells 100 may be formed with substantially identical physical dimensions (e.g., with less than a threshold degree of variation), such as a substantially identical height, a substantially identical width, or the like. Additionally, some implementations described herein may reduce process variation during memory device fabrication and/or may increase manufacturing yield. For example, some implementations described herein may reduce the likelihood that a leaker device 155 is impinged or otherwise rendered ineffective at discharging excess charge, such as by forming other parts of the memory cell 100 (e.g., the insulator 145 and/or the top electrode 140) in a manner that does not impinge the leaker device 155 (and that results in substantially identical electrical properties and/or physical dimensions of leaker devices 155 across memory cells 100).

As indicated above, FIG. 1 is provided as an example. Other examples may differ from what is described with respect to FIG. 1.

Figure 2:
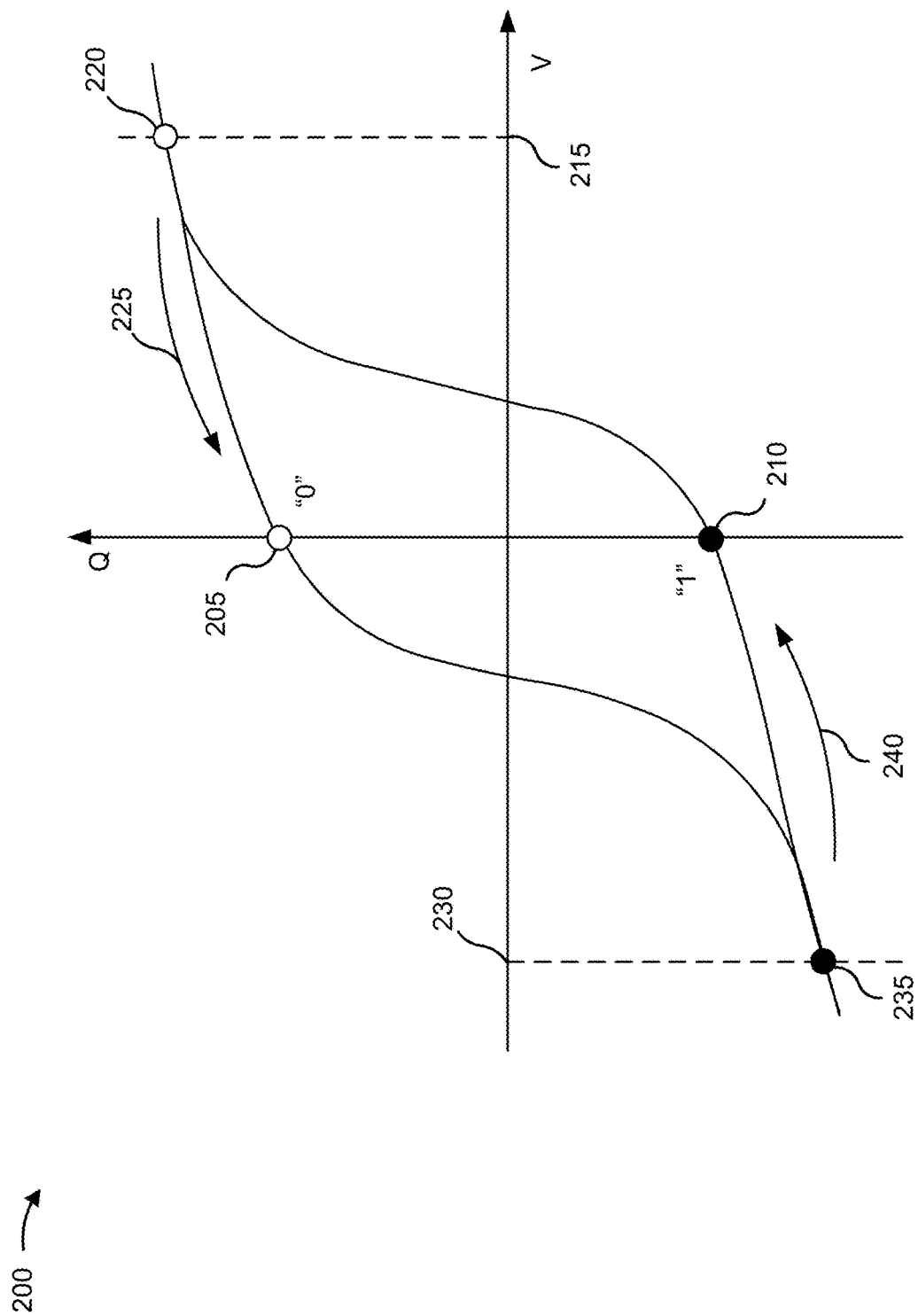
FIG. 2 is a diagram illustrating an example of electrical properties of ferroelectric materials.

FIG. 2 is a diagram illustrating an example 200 of electrical properties of ferroelectric material. The example 200 shows an example hysteresis curve for a ferroelectric material. The hysteresis curve shows a charge (Q) stored on a capacitor (e.g., capacitor 110) as a function of a voltage difference (V) across the capacitor 110 (e.g., across the bottom electrode 135 and the top electrode 140).

A ferroelectric material is characterized by spontaneous electric polarization that can be reversed by the application of an external electric field. A ferroelectric material maintains a non-zero electric polarization in the absence of an external electric field. In contrast, a linear dielectric material or a paraelectric material exhibits polarization only in the presence of an electric field. Electric polarization within a ferroelectric capacitor 110 (e.g., within the ferroelectric material of the insulator 145) results in a charge, at surfaces of the ferroelectric material, that attracts opposite charges from the capacitor electrodes. Thus, charge is stored at the interface of the insulator 145 and the bottom electrode 135, and charge is stored at the interface of the insulator 145 and the top electrode 140.

As shown in FIG. 2, the ferroelectric material may maintain a positive or negative charge with a zero voltage difference across the capacitor 110, resulting in two possible charge states: charge state 205 and charge state 210. In the example 200 of FIG. 2, charge state 205 represents a logic "0" state, and charge state 210 represents a logic "1" state. In some examples, the logic values of the respective charge states may be reversed.

A logic "0" or a logic "1" may be written to the memory cell 100 by controlling the electric polarization of the insulator 145, and thus the charge on the capacitor electrodes 135 and 140, by applying a voltage across the capacitor 110. For example, applying a positive voltage 215 across the capacitor 110 results in positive charge accumulation until charge state 220 is reached. As the positive voltage 215 is removed, the charge state of the insulator 145 changes from charge state 220 to charge state 205 (e.g., along the path 225), which is reached at zero volts and represents a logic "0" state. Similarly, applying a negative voltage 230 across the capacitor 110 results in negative charge accumulation until charge state 235 is reached. As the negative voltage 230 is removed, the charge state of the insulator 145 changes from charge state 235 to charge state 210 (e.g., along the path 240), which is reached at zero volts and represents a logic "1" state. Charge states 205 and 210 may also be referred to as the remnant polarization (Pr) values, which is the remaining polarization (and thus the charge) upon removing the external bias (e.g., voltage).

As indicated above, FIG. 2 is provided as an example. Other examples may differ from what is described with respect to FIG. 2.

Figure 3:
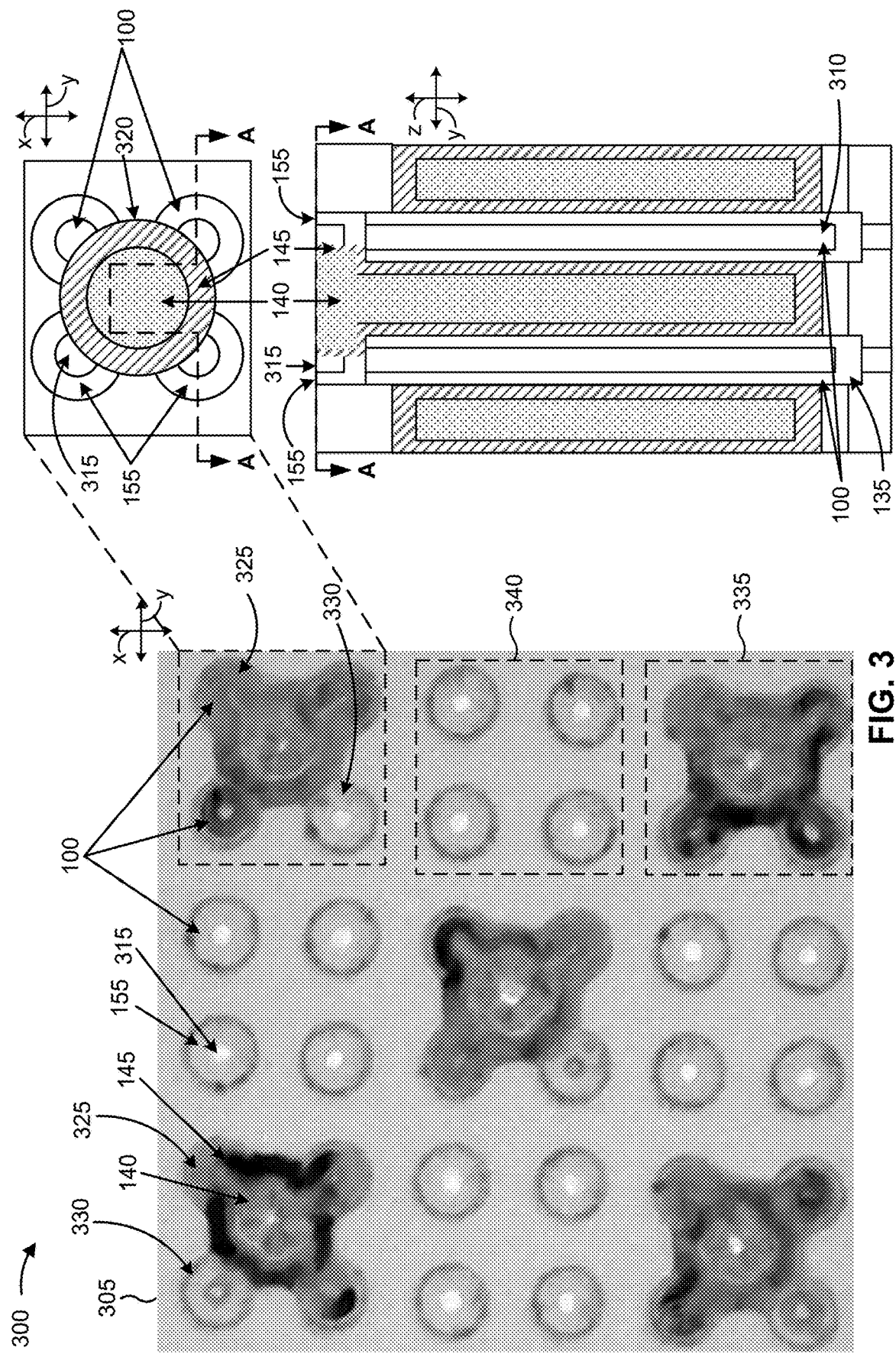
FIGS. 3 and 4 are diagrams illustrating examples of impinged leaker devices.

FIG. 3 is a diagram illustrating examples of impinged leaker devices. FIG. 3 shows a structure 300 that is a portion of a memory array 305 that includes multiple memory cells 100. As described above in connection with FIG. 1, a memory cell 100 may include a transistor (not shown) and a capacitor that includes a bottom electrode 135, a top electrode 140, and an insulator 145. The bottom electrode may be coupled to a leaker device 155. The leaker device may be coupled to a cell plate (not shown), which may be on top of a top surface of the leaker device 155. In some implementations, a support pillar 310 and/or leaker fill material 315 may support the memory cell 100.

During a manufacturing process, an opening 320 may be formed after forming bottom electrodes 135 (and support pillars 310, if included in the structure 300). The opening 320 may be used to fill the structure 300 with the insulator 145 and the top electrode 140. Due to process variation and/or a manner in which the opening 320 is formed, the insulator 145 and/or the top electrode 140 may impinge one or more leaker devices 155, which impacts electrical properties of those leaker devices 155. For example, an impinged leaker device may have a different electrical resistance (e.g., lower or higher, depending on manner of the impingement) and/or a different electrical conductivity (e.g., lower or higher, depending on a manner of the impingement) than a non-impinged leaker device. Impingement of a leaker device 155 may result from removal of a portion of the leaker device 155 when the opening 320 is formed, which may result in formation (e.g., deposition) of the insulator 145 and/or the top electrode 140 on top of all or a portion of the leaker device 155. This impingement may alter an electrical property of the leaker device 155, such as a conductivity of the leaker device 155, a resistance of the leaker device 155, an amount of excess charge that the leaker device 155 is capable of discharging from the bottom electrode 135 to the cell plate, and/or a rate at which the leaker device 155 is capable of discharging excess charge from the bottom electrode 135 to the cell plate. In some cases, differences in electrical properties across different leaker devices 155 may be due to different amounts of surface area of those leaker devices 155 that are in contact with the cell plate and/or the bottom electrode 135. For example, a particular leaker device 325 may have a smaller amount of surface area in contact with the cell plate and/or a bottom electrode, and a second leaker device 330 may have a greater amount of surface area in contact with the cell plate and/or a bottom electrode.

Furthermore, one or more leaker devices included in a first group 335 of leaker devices with the insulator and/or the top electrode between the first group 335 of leaker devices (e.g., at a top surface of the leaker devices) may have different electrical properties than one or more leaker devices included in a second group 340 of leaker devices that do not have the insulator and/or the top electrode between the second group 340 of leaker devices (e.g., at a top surface of the leaker devices). In this case, leaker devices in the first group 335 may be impinged, while leaker devices in the second group 340 may be non-impinged. This impingement may be due to leaker devices in the first group 335 having less surface area in contact with the cell plate and/or corresponding bottom electrodes as compared to leaker devices in the second group 340.

Some implementations described herein reduce impingement of leaker devices. This may result in leaker devices with substantially identical electrical properties across leaker devices with the insulator and/or the top electrode between them (e.g., across leaker devices included in the first group 335). Additionally, or alternatively, this may result in leaker devices with substantially identical electrical properties across the entire memory array (e.g., across leaker devices included in the first group 335 and the second group 340). This enables more reliable and predictable operation of the memory array.

As indicated above, FIG. 3 is provided as an example. Other examples may differ from what is described with respect to FIG. 3.

Figure 4:
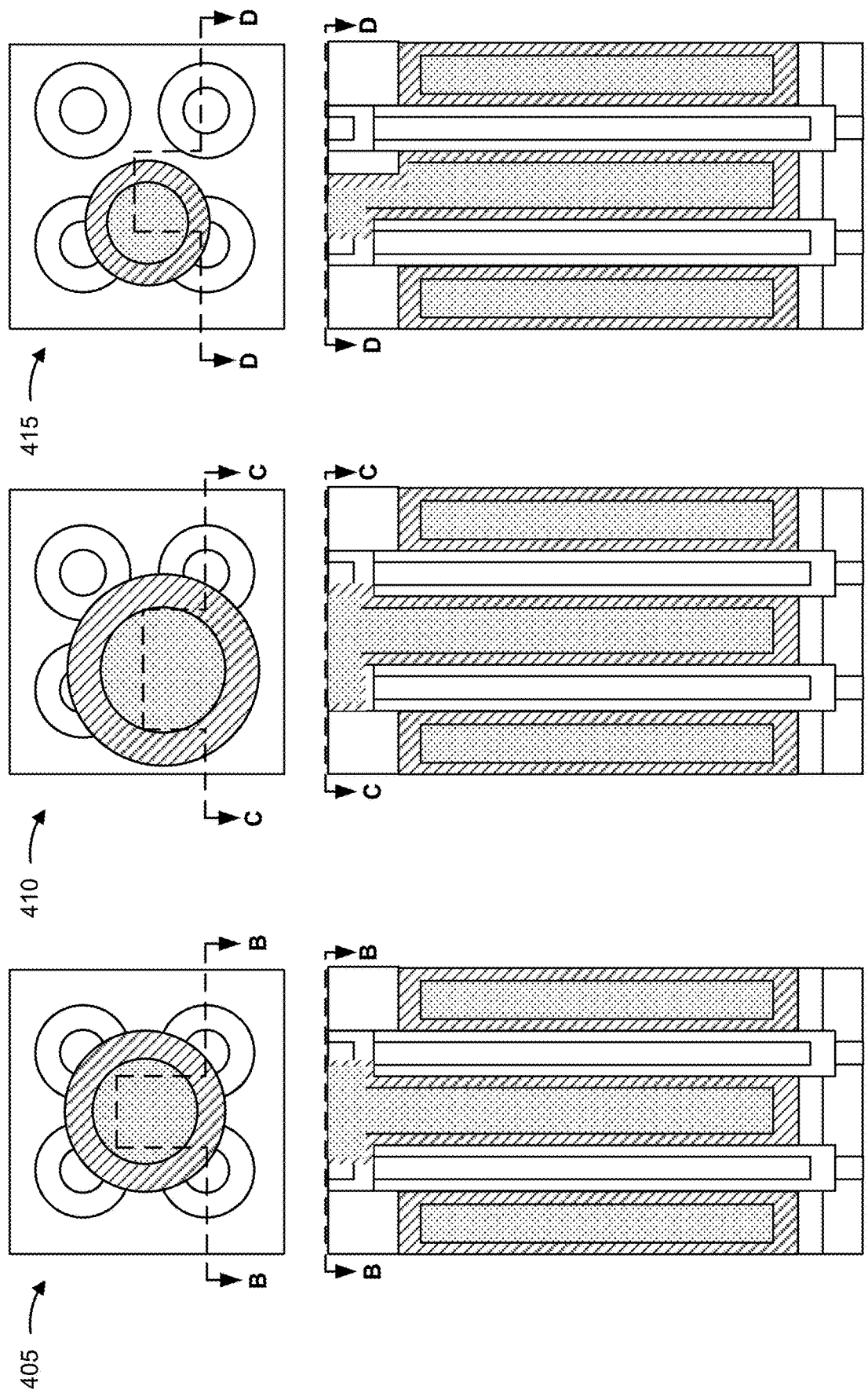

FIG. 4 is a diagram illustrating additional examples of impinged leaker devices. Example 405 shows a larger opening with an ideal placement (e.g., centered between four leaker devices), example 410 shows a larger opening with a misaligned placement (e.g., not centered between the four leaker devices), and example 415 shows a smaller opening with a misaligned placement.

In example 405, the larger opening results in impingement of the leaker devices by the insulator and the top electrode, as described in greater detail above in connection with FIG. 3.

In example 410, one of the leaker devices is completely impinged, meaning that the leaker device does not couple the bottom electrode to the cell plate, and is not capable of discharging any excess charge from the bottom electrode to the cell plate. In this example, the insulator and the top electrode are entirely on top of the leaker device, blocking the coupling of the leaker device to the cell plate.

In example 415, the smaller opening results in partial impingement of two of the leaker devices and non-impingement of the other two leaker devices. Furthermore, the smaller opening may cause pinch-off, where the insulator and/or the top electrode are not sufficiently formed (e.g., deposited) within the structure via the smaller opening, which may cause structural and/or electrical issues.

Some implementations described herein reduce impingement of leaker devices in these and other examples. Furthermore, some implementations described herein reduce the likelihood of pinch-off, resulting in a more robust and reliable memory device.

As indicated above, FIG. 4 is provided as an example. Other examples may differ from what is described with respect to FIG. 4.

Figure 5A:
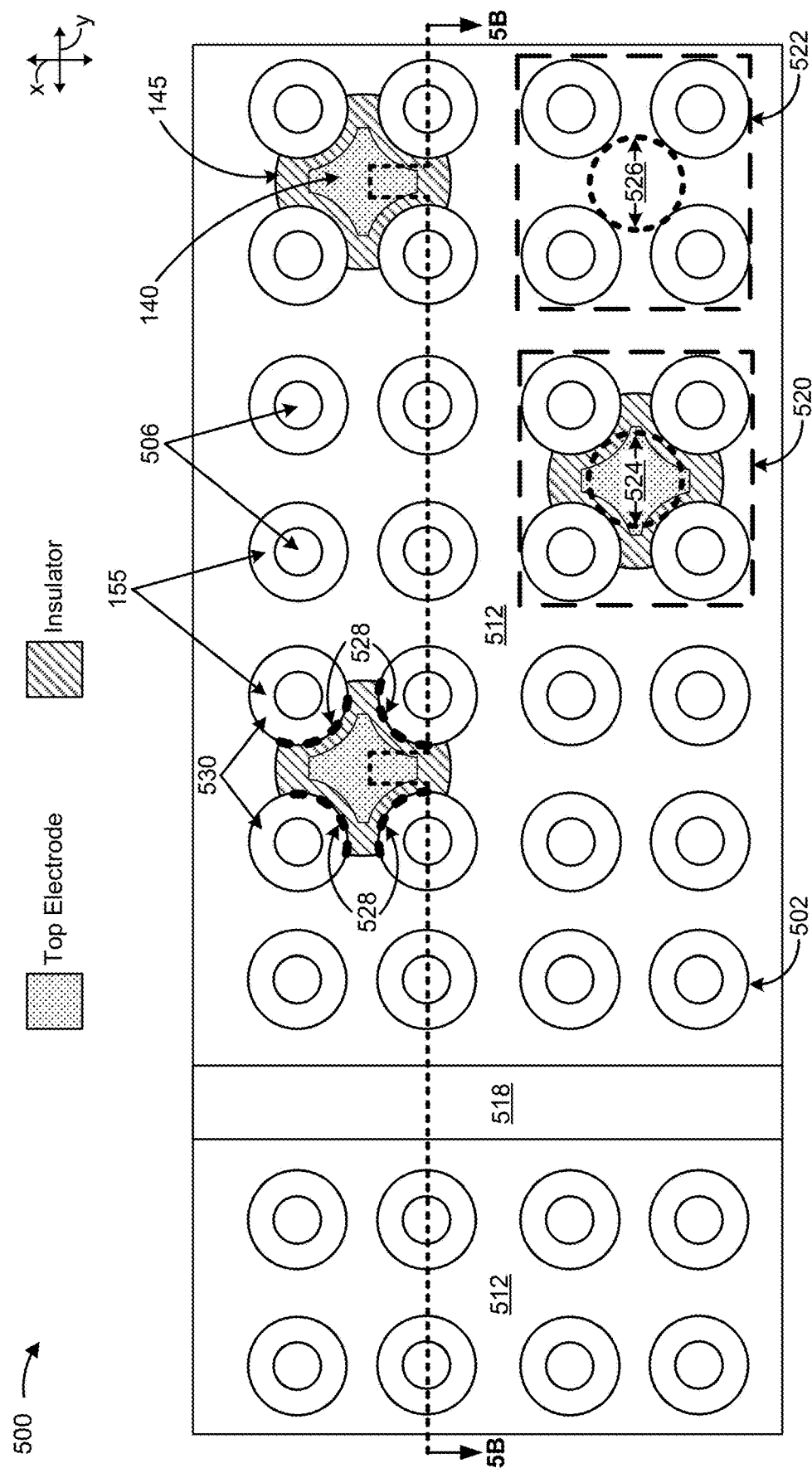

FIGS. 5A and 5B are diagrammatic views of an example structure 500. The structure 500 may be part of an integrated assembly, such as a memory array, a portion of a memory array, or a memory device that includes the memory array and one or more other components (e.g., sense amplifiers, a row decoder, a column decoder, a row address buffer, a column address buffer, one or more data buffers, one or more clocks, one or more counters, and/or a memory controller).

As shown in FIGS. 5A-5B, the structure 500 includes multiple pillars 502. A pillar 502 includes a bottom electrode 135 and a leaker device 155. In some implementations (as shown), a pillar 502 (e.g., each pillar 502) includes a support pillar 504 and/or leaker fill material 506. As further shown, the structure 500 includes multiple top electrodes 140, multiple insulators 145, and multiple cell plates 150. For example, the structure 500 may include multiple bounded regions, and each bounded region may include a single top electrode 140, a single insulator 145, and a single cell plate 150. The cell plates 150 may be directly on top of a horizontal surface 508 and may be separated by a gap 510. As further shown, the structure 500 may include a lattice structure 512, an insulative layer 514, an insulative layer 516, and a separation structure 518. In some cases, the bottom electrode may be called a first electrode or a lower electrode. Similarly, the top electrode may be called a second electrode or an upper electrode.

As shown in FIG. 5A, the structure 500 may include a first group 520 of pillars 502 (and, for example, multiple first groups 520) and a second group 522 of pillars 502 (and, for example, multiple second groups 522). Furthermore, the structure 500 may include a first region 524 (sometimes called an opened region) between pillars included in the first group 520 (e.g., between leaker devices 155 included in the first group 520 and/or at a top surface of the first group 520). The first region 524 includes a top electrode 140 and an insulator 145. As further shown in FIG. 5A, the structure 500 may include a second region 526 (sometimes called an unopened region) between pillars included in the second group 522 (e.g., between leaker devices 155 included in the second group 522 and/or at a top surface of the second group 522). The second region 526 does not include a top electrode 140 and does not include an insulator 145. Rather, the second region 526 may include the lattice structure 512.

The support pillar 504 has a top surface, a bottom surface, and a circumferential surface. In some implementations, the shape of the support pillar 504 is a cylinder (within reasonable tolerances of manufacturing and measurement). In other words, the support pillar 504 may be substantially cylindrical in shape. In this case, the top surface is a top horizontal surface of the cylinder (e.g., having a circular shape or an elliptic shape), the bottom surface is the bottom horizontal surface of the cylinder (e.g., having a circular shape or an elliptic shape), and the circumferential surface is the vertical surface of the cylinder (e.g., having a tube shape that connects the circular or elliptic shapes on either end). The circumferential surface extends vertically from the top surface to the bottom surface along the entire circumference of the cylinder. As used herein, a "cylinder" may refer to a circular cylinder or an elliptic cylinder. Similarly, "cylindrical" may refer to a circular cylindrical shape or an elliptic cylindrical shape.

The support pillar 504 may be an electrical insulator, an electrical conductor, or a semiconductor, and may comprise, consist of, or consist essentially of insulative material, conductive material, or semiconductive material. For example, the support pillar 504 may comprise, consist of, or consist essentially of titanium silicon nitride, silicon nitride, silicon dioxide, and/or silicon (e.g., polycrystalline silicon).

The bottom electrode 135 has a top surface, a bottom surface, an interior circumferential surface, and an exterior circumferential surface. In some implementations, the shape of the bottom electrode 135 is an open top cylinder (within reasonable tolerances of manufacturing and measurement). An open top cylinder is a cylinder with one open end (e.g., the top end) and one closed end (e.g., the bottom end), and can be thought of as having the shape of a container or cup. In this case, the top surface is a top horizontal surface of the open top cylinder (e.g., having a ring shape or an annular shape), the bottom surface is the bottom horizontal surface of the open top cylinder (e.g., having a circular shape, a disc shape, or an elliptic shape), the interior circumferential surface is the interior vertical surface of the open top cylinder (e.g., having a tube shape that forms an interior wall of the open top cylinder), and the exterior circumferential surface is the exterior vertical surface of the open top cylinder (e.g., having a tube shape that forms an exterior wall of the open top cylinder). The interior circumferential surface extends vertically from the bottom surface of the support pillar 504 to the top surface of the bottom electrode 135 along the entire circumference of the smaller concentric circle of the annulus that forms the top surface. The exterior circumferential surface extends vertically from the bottom surface of the bottom electrode 135 to the top surface of the bottom electrode 135 along the entire circumference of the larger concentric circle of the annulus that forms the top surface. As used herein, an "annulus" may refer to a circle annulus or an ellipse annulus. Similarly, "annular" may refer to a circular annular shape or an elliptic annular shape.

As shown in FIG. 5B, in some implementations, the top surface of the bottom electrode 135 is substantially horizontally aligned with the top surface of the support pillar 504. However, in some implementations, the top surface of the bottom electrode 135 is vertically higher than the top surface of the support pillar 504. In this case, a portion of the leaker device may be contained within the open top cylinder shape of the bottom electrode 135 (e.g., the leaker device may extend vertically below the top surface of the bottom electrode). In some implementations, the interior circumferential surface of the bottom electrode 135 interfaces with the circumferential surface of the support pillar 504. For example, the interior circumferential surface of the bottom electrode 135 may be along and abutting the circumferential surface of the support pillar 504. Additionally, or alternatively, the interior circumferential surface of the bottom electrode 135 may be substantially vertically aligned with the circumferential surface of the support pillar 504. As further shown, the bottom surface of the bottom electrode 135 is below the bottom surface of the support pillar 504. In some implementations, the support pillar 504 is contained within the open top cylinder shape of the bottom electrode 135. Although the bottom surface of the bottom electrode 135 is shown as being substantially horizontally aligned with the bottom surface of the insulative layer 516 (and/or the top surface of the insulative layer 514), in some implementations, the bottom surface of the bottom electrode 135 is below the bottom surface of the insulative layer 516 (and/or the top surface of the insulative layer 514).

The bottom electrode 135 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride or titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the bottom electrode 135 comprises, consists of, or consists essentially of titanium nitride.

The leaker device 155 has a top surface, a bottom surface, and an exterior circumferential surface. In some implementations, the leaker device 155 has an interior circumferential surface. In some implementations, the shape of the leaker device 155 is an open top cylinder (within reasonable tolerances of manufacturing and measurement). In this case, the top surface is a top horizontal surface of the open top cylinder (e.g., having a ring shape or an annular shape), the bottom surface is the bottom horizontal surface of the open top cylinder (e.g., having a circular shape or an elliptic shape), the interior circumferential surface is the interior vertical surface of the open top cylinder (e.g., having a tube shape that forms an interior wall of the open top cylinder), and the exterior circumferential surface is the exterior vertical surface of the open top cylinder (e.g., having a tube shape that forms an exterior wall of the open top cylinder). The interior circumferential surface extends vertically from a bottom surface of the leaker fill material 506 to the top surface of the leaker device 155 along the entire circumference of the smaller concentric circle of the annulus that forms the top surface. The exterior circumferential surface extends vertically from the bottom surface of the leaker device 155 to the top surface of the leaker device 155 along the entire circumference of the larger concentric circle of the annulus that forms the top surface.

As shown in FIG. 5B, in some implementations, the bottom surface of the leaker device 155 interfaces with the top surface of the bottom electrode 135 and/or the top surface of the support pillar 504. For example, the bottom surface of the leaker device 155 may abut and/or may be substantially horizontally aligned with the top surface of the bottom electrode 135 and/or the top surface of the support pillar 504. In some implementations, the bottom surface of the leaker device 155 does not extend vertically below the top surface of the bottom electrode 135 and/or the top surface of the support pillar 504. For example, in some implementations, the bottom surface of the leaker device 155 does not extend vertically below the top surface of the bottom electrode 135 and does not extend vertically below the top surface of the support pillar 504, as shown in FIG. 5B. In such implementations, the bottom surface of the leaker device 155 does not contact any surface of the bottom electrode 135 other than the top surface of the bottom electrode 135. For example, in some implementations, the bottom surface of the leaker device 155 does not contact the interior circumferential surface of the bottom electrode 135. Similarly, in some implementations, the bottom surface of the leaker device 155 does not contact the exterior circumferential surface of the bottom electrode 135. In this case, the bottom surface of the leaker device 155 may be substantially horizontal.

However, in some implementations, the bottom surface of the leaker device 155 extends vertically below the top surface of the bottom electrode 135, but does not extend vertically below the top surface of the support pillar 504. For example, the leaker device 155 may be partially contained within the open top cylinder shape of the bottom electrode 135 (e.g., and may abut the top surface of the support pillar 504). This may increase a surface area of the leaker device 155 in contact with the bottom electrode 135, which may impact a resistance of the leaker device 155. In such implementations, the top surface of the support pillar 504 is vertically lower than and not substantially horizontally aligned with the top surface of the bottom electrode 135. Furthermore, in such implementations, the leaker device 155 may contact a portion of the interior circumferential surface of the bottom electrode 135. In this case, the bottom surface of the leaker device 155 may not be substantially horizontal. For example, a first portion of the bottom surface of the leaker device 155 may abut the top surface of the bottom electrode 135, and a second portion of the bottom surface of the leaker device 155 may abut the top surface of the support pillar 504 (e.g., where the second portion is vertically lower than the first portion). In this case, the open top cylinder shape of the leaker device 155 may have a bottom that is not flat (e.g., not substantially horizontal). In some implementations, the bottom surface of the leaker device 155 is less than or equal to approximately 5 nanometers below the top surface of the bottom electrode 135. In some implementations, the bottom surface of the leaker device 155 does not extend vertically below a bottom surface of the lattice structure 512 and/or a bottom surface of a first horizontal extension and a second horizontal extension of the separation structure 518 (if such horizontal extensions are present in the structure 500, as described below).

As further shown, the exterior circumferential surface of the leaker device 155 may be substantially vertically aligned with the exterior circumferential surface of the bottom electrode 135. For example, the exterior circumferential surface of the leaker device 155 may be substantially vertically aligned with the exterior circumferential surface of the bottom electrode 135 along an entire circumference of the exterior circumferential surface and an entire circumference of the exterior circumferential surface.

The leaker device 155 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, and/or a metal carbide), and/or a conductively-doped semiconductor material (e.g., conductively-doped silicon, conductively-doped germanium, and/or conductively-doped gallium arsenide). In some implementations, the leaker device 155 may be a same material as or a different material than the bottom electrode 135.

The leaker fill material 506 has a bottom surface, a top surface, and a circumferential surface. In some implementations, the shape of the leaker fill material 506 is a cylinder (within reasonable tolerances of manufacturing and measurement). In other words, the leaker fill material 506 may be substantially cylindrical in shape. In this case, the top surface is a top horizontal surface of the cylinder (e.g., having a circular shape or an elliptic shape), the bottom surface is the bottom horizontal surface of the cylinder (e.g., having a circular shape or an elliptic shape), and the circumferential surface is the vertical surface of the cylinder (e.g., have a tube shape that connects the circular or elliptic shapes on either end). The circumferential surface extends vertically from the top surface to the bottom surface along the entire circumference of the cylinder.

As shown in FIG. 5B, in some implementations, the top surface of the leaker fill material 506 is substantially horizontally aligned with the top surface of the leaker device 155. In some implementations, the interior circumferential surface of the leaker device 155 interfaces with the circumferential surface of the leaker fill material 506. For example, the interior circumferential surface of the leaker device 155 may be along and abutting the circumferential surface of the leaker fill material 506. Additionally, or alternatively, the interior circumferential surface of the leaker device 155 may be substantially vertically aligned with the circumferential surface of the leaker fill material 506. As further shown, the bottom surface of the leaker device 155 is below the bottom surface of the leaker fill material 506. In some implementations, the leaker fill material 506 is contained within the open top cylinder shape of the leaker device 155.

In some implementations, the leaker fill material 506 is not present in the structure. For example, the leaker device 155 may be constructed or configured to achieve certain electrical properties, such as an electrical resistance that enables excess charge to be discharged from the bottom electrode 135 to the cell plate 150 without draining all or too much charge from the bottom electrode 135 to the cell plate 150. If the leaker device 155 is to be configured with an electrical resistance that enables less than a threshold amount of current to flow (e.g., less than 20 amps) or with greater than a threshold amount of resistance, then the leaker fill material 506 may be used to achieve this objective. The size of the leaker fill material 506 (e.g., a diameter or height) may be configured to control the electrical resistance of the leaker device 155. In some implementations, if the leaker device 155 is to be configured with an electrical resistance that enables greater than a threshold amount of current to flow (e.g., more than 20 amps) or with less than a threshold amount of resistance, then the leaker fill material 506 may not be formed in the structure 500. In this case, the shape of the leaker device 155 may be a cylinder (within reasonable tolerances of manufacturing and measurement).

The leaker fill material 506 may be an electrical insulator, an electrical conductor, or a semiconductor, and may comprise, consist of, or consist essentially of insulative material, conductive material, or semiconductive material. For example, the leaker fill material 506 may comprise, consist of, or consist essentially of silicon nitride and/or silicon (e.g., polycrystalline silicon). In some implementations, the leaker fill material 506 has a higher etch resistivity than an oxide (e.g., is not silicon dioxide).

The insulator 145 has a top surface, a bottom surface, and a plurality of vertical surfaces. In some implementations, the top surface of the insulator 145 is substantially horizontally aligned with the top surface of the leaker device 155 and/or the top surface of the leaker fill material 506. Additionally, or alternatively, the top surface of the insulator 145 may be vertically higher than the top surface of the support pillar 504 and/or the top surface of the bottom electrode 135. However, in some implementations, the insulator 145 (e.g., insulative material of the insulator) is not above or on top of the support pillar 504 and/or the bottom electrode 135. In other words, in some implementations, the insulator 145 is not present in an area above the bottom electrode 135 bounded by an imaginary upward extension of the exterior circumferential surface of the bottom electrode 135. Similarly, in some implementations, the insulator 145 is not present in an area above the support pillar 504 bounded by an imaginary upward extension of the circumferential surface of the support pillar 504.

In some implementations, the bottom surface of the insulator 145 is vertically higher than the bottom surface of the support pillar 504 and/or the bottom surface of the bottom electrode 135. As shown in FIG. 5B, the bottom surface of the insulator 145 may interface with the insulative layer 516. For example, the bottom surface of the insulator 145 may abut and/or may be substantially horizontally aligned with a top surface of the insulative layer 516.

In some implementations, each vertical surface of the insulator 145 interfaces with a respective bottom electrode 135. For example, each vertical surface of the insulator 145 may interface with the exterior circumferential surface of a different bottom electrode 135. For example, a vertical surface of the insulator 145 may be along, may abut, and/or may be in contact with the exterior circumferential surface of a bottom electrode 135. In some implementations, the vertical surface of the insulator 145 wraps completely around a circumference of the exterior circumferential surface of the bottom electrode 135 (although not necessarily along an entire height of the exterior circumferential surface of the bottom electrode 135). As further shown, the insulator 145 may interface with (e.g., may be along, may abut, may be in contact with, and/or may wrap completely around) the exterior circumferential surfaces of multiple bottom electrodes 135 (e.g., all bottom electrodes 135 that are between consecutive separation structures 518, with no intervening separation structures 518).

In some implementations, one or more vertical surfaces of the insulator 145 may interface with one or more respective leaker devices 155. For example, a vertical surface of the insulator 145 may interface with (e.g., may be along, may abut, and/or may be in contact with) an exterior circumferential surface of a leaker device 155. In some implementations, such a vertical surface of the insulator 145 wraps partially around a circumference of the exterior circumferential surface of the leaker device 155 (along an entire height of the exterior circumferential surface of the leaker device 155, in some implementations). As further shown, the insulator 145 may interface with (e.g., may be along, may abut, may be in contact with, and/or may wrap partially around) the exterior circumferential surfaces of multiple leaker devices 155 (e.g., all leaker devices 155 that are adjacent to an opening used to fill the structure 500 with the insulator 145 and/or the top electrode 140).

The insulator 145 may be an electrical insulator and may comprise, consist of, or consist essentially of insulative material. The insulative material may comprise, consist of, or consist essentially of silicon dioxide, silicon nitride, aluminum oxide, and/or hafnium oxide, among other examples. In some implementations, the insulator 145 comprises, consists of, or consists essentially of ferroelectric material. The ferroelectric material may comprise, consist of, or consist essentially of hafnium oxide, hafnium zirconium oxide, barium titanate, lead titanate, lead zirconate titanate, and/or strontium bismuth tantalate, among other examples.

The top electrode 140 has a bottom surface, a top surface, and a plurality of vertical surfaces. In some implementations, the top surface of the top electrode 140 is substantially horizontally aligned with the top surface of the insulator 145. Additionally, or alternatively, the top surface of the top electrode 140 may be substantially horizontally aligned with the top surface of the leaker device 155 and/or the top surface of the leaker fill material 506. Additionally, or alternatively, the top surface of the top electrode 140 may be vertically higher than the top surface of the support pillar 504 and/or the top surface of the bottom electrode 135. However, in some implementations, the top electrode 140 (e.g., conductive material of the top electrode 140) is not above or on top of the support pillar 504 and/or the bottom electrode 135. In other words, in some implementations, the top electrode 140 is not present in an area above the bottom electrode 135 bounded by an imaginary upward extension of the exterior circumferential surface of the bottom electrode 135. Similarly, in some implementations, the top electrode 140 is not present in an area above the support pillar 504 bounded by an imaginary upward extension of the circumferential surface of the support pillar 504.

In some implementations, a vertical surface of the top electrode 140 interfaces with (e.g., is along, abutting, and/or in contact with) a vertical surface of the insulator 145 (e.g., along an entire height of that vertical surface of the top electrode 140) and/or is substantially vertically aligned with the vertical surface of the insulator 145. As further shown, the bottom surface of the insulator 145 is below the bottom surface of the top electrode 140.

The insulator 145 may separate (e.g., physically separate and/or be a barrier between) the top electrode 140 and a plurality of bottom electrodes 135. For example, the top electrode 140 may be shared among multiple bottom electrodes 135 (e.g., all bottom electrodes 135 that are between consecutive separation structures 518, with no intervening separation structures 518), and the insulator may separate the top electrode 140 from those multiple bottom electrodes 135. In some implementations, the structure 500 includes a single top electrode 140 between consecutive separation structures 518. Each bounded region of the structure that is bounded by separation structures 518 and/or array edges may include a corresponding top electrode 140 that is shared among all bottom electrodes 135 and/or memory cells 100 within that bounded region. The voltage of a cell plate 150 may be controlled to control a voltage of a top electrode 140 coupled to the cell plate 150. The bottom electrodes 135 may be separately controlled from one another (e.g., via respective digit lines 120) so that a voltage difference between top and bottom electrodes can be controlled by manipulating the voltage of the cell plate 150 and the voltage of digit lines 120.

The top electrode 140 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal nitride, such as titanium nitride, titanium silicon nitride, and/or a metal carbide), and/or a conductively-doped semiconductor material (e.g., conductively-doped silicon, conductively-doped germanium, and/or conductively-doped gallium arsenide), among other examples. In some implementations, the top electrode 140 comprises, consists of, or consists essentially of titanium nitride and/or titanium silicon nitride.

The cell plate 150 may interface with (e.g., may be along, abutting, and/or in contact with) the horizontal surface 508. The horizontal surface 508 may span across multiple memory cells (e.g., a large number of memory cells), such as an entire memory array (although the cell plate 150 may not span across the entire memory array due to gaps between cell plates, as described below). As shown in FIG. 5B, the horizontal surface 508 may be substantially horizontally aligned with the top surface of the top electrode 140, the top surface of the insulator 145, the top surface of the leaker device 155, and/or the top surface of the leaker fill material 506.

In some implementations, a gap 510 may be formed between cell plates 150. The gap 510 may extend along the x-direction illustrated in FIG. 5A. In some implementations, a width of the gap 510 (in the illustrated y-direction) may be less than or equal to approximately 50 nanometers, or may be between approximately 10 nanometers and approximately 50 nanometers, inclusive. As a result of forming the gap 510, multiple cell plates 150 may be present in the structure 500. Each cell plate 150 may span and/or cover a portion of the memory array. The cell plates 150 may be electrically isolated from one another. Thus, each cell plate 150 may be configured to independently interact with a portion of memory cells in the memory array (e.g., may interact with top electrode(s) 140 associated with those memory cells). A cell plate 150 may be coupled with a top electrode 140 that is associated with all memory cells in a bounded region of the memory array, where the bounded region is bounded by consecutive separation structures 518 (and/or one or more edges of the memory array). Different cell plates 150 may be coupled with different top electrodes 140 (e.g., a first cell plate 150 may be coupled with a first top electrode 140, a second cell plate 150 may be coupled with a second top electrode 140, and so on). Additionally, or alternatively, the cell plate 150 may extend horizontally along a top surface of a top electrode 140 and/or along top surfaces of multiple leaker devices 155. Having different cell plates 150 in the memory device allows different voltages to be applied to different groups of memory cells (e.g., that share a top electrode 140).

A leaker device 155 may couple a bottom electrode 135 to the cell plate 150. The leaker device 155 may be configured to discharge excess charge (or at least a portion of excess charge) from the bottom electrode 135 to the cell plate 150. The leaker device 155 may be configured with an electrical resistance to enable removal of excess charge from the bottom electrode 135 without removing too much charge from the bottom electrode 135 (e.g., without electrically shorting the bottom electrode 135 to the cell plate 150). In some implementations, a resistance of the leaker device 155 may be configured by forming the leaker device 155 with a particular interior circumference (e.g., of the smaller concentric circle that forms the annulus of the top surface of the leaker device 155), with a particular exterior circumference (e.g., of the larger concentric circle that forms the annulus of the top surface of the leaker device 155), with a particular height of the leaker fill material 506 contained within the leaker device 155 (or without any leaker fill material 506 contained within the leaker device 155), with a particular height of the leaker device 155 (e.g., from the top surface to the bottom surface), with a particular alignment with the bottom electrode 135 (e.g., vertically aligned or not vertically aligned), and/or with a particular material, among other examples.

The cell plate 150 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the cell plate 150 is a different material than the bottom electrode 135, the top electrode 140, and/or the leaker device 155. In some implementations, the structure 500 may be formed such that the structure 500 is filled with conductive material of the cell plate 150 (e.g., via the opening and after filling the opening with the insulator 145 and the top electrode 140). In this case, the conductive material of the cell plate 150 may be along, abutting, and/or in contact with a vertical surface of a top electrode 140.

As shown in FIG. 5A, the structure 500 includes a first group 520 of pillars 502 and a second group 522 of pillars 502. The first group 520 of pillars 502 includes a first group of bottom electrodes 135 (e.g., with one bottom electrode 135 per pillar 502) and a corresponding first group of leaker devices 155 (e.g., with one leaker device 155 per pillar 502) that electrically couple the first group of bottom electrodes 135 to the cell plate 150. For example, the first group 520 of pillars 502 may include a first pillar that includes a first bottom electrode and a first leaker device that couples the first bottom electrode to the cell plate, a second pillar that includes a second bottom electrode and a second leaker device that couples the second bottom electrode to the cell plate, a third pillar that includes a third bottom electrode and a third leaker device that couples the third bottom electrode to the cell plate, and a fourth pillar that includes a fourth bottom electrode and a fourth leaker device that couples the fourth bottom electrode to the cell plate. In the example structure 500, the first group of leaker devices 155 includes four leaker devices.

As further shown in FIG. 5A, a first region 524 (sometimes called an opened region) between the first group of leaker devices 155 includes the top electrode 140 and the insulator 145. The first region 524 is along a horizontal plane that touches each leaker device 155 included in the first group of leaker devices 155. In some implementations, the first region 524 may include a portion of the horizontal surface 508 that is substantially horizontally aligned with respective top surfaces of the first group of leaker devices 155, a top surface of the insulator 145, a top surface of the top electrode 140, and/or a top surface of the lattice structure 512. In some implementations, a top surface of the insulator 145 and a top surface of the top electrode 140 are substantially horizontally aligned with respective top surfaces of all of the leaker devices 155 included in the first group of leaker devices 155 (e.g., the first leaker device, the second leaker device, the third leaker device, and the fourth leaker device) in the first region 524. The first region 524 may be created by forming an opening in the lattice structure 512, as described in more detail elsewhere herein.

As further shown in FIG. 5A, the insulator 145 may be in contact with all of the leaker devices 155 included in the first group of leaker devices 155 (e.g., may be in contact with the first leaker device, the second leaker device, the third leaker device, and the fourth leaker device). However, in some implementations, the insulator 145 is not directly on top of any of the leaker devices 155 included in the first group of leaker devices 155 (e.g., is not directly on top of any of the first leaker device, the second leaker device, the third leaker device, or the fourth leaker device). In some implementations, when the leaker devices 155 contain leaker fill material 506, the insulator 145 is not directly on top of any of the leaker fill material 506 contained within any of the leaker devices 155 included in the first group of leaker devices 155 (e.g., is not directly on top of any of first leaker fill material contained within the first leaker device, second leaker fill material contained within the second leaker device, third leaker fill material contained within the third leaker device, or fourth leaker fill material contained within the fourth leaker device).

The top electrode 140 may be separated from each leaker device 155, included in the first group of leaker devices 155, by the insulator 145 (e.g., may be separated from the first leaker device, the second leaker device, the third leaker device, and the fourth leaker device by the insulator 145). In some implementations, the top electrode 140 is not directly on top of any of the leaker devices 155 included in the first group of leaker devices 155 (e.g., is not directly on top of any of the first leaker device, the second leaker device, the third leaker device, or the fourth leaker device). In some implementations, when the leaker devices 155 contain leaker fill material 506, the top electrode 140 is not directly on top of any of the leaker fill material 506 contained within any of the leaker devices 155 included in the first group of leaker devices 155 (e.g., is not directly on top of any of first leaker fill material contained within the first leaker device, second leaker fill material contained within the second leaker device, third leaker fill material contained within the third leaker device, or fourth leaker fill material contained within the fourth leaker device).

As further shown in FIG. 5A, the insulator 145 includes multiple curved portions 528 that abut respective leaker devices 155 included in the first group of leaker devices 155. For example, the insulator 145 may include a first curved portion that abuts the first leaker device, a second curved portion that abuts the second leaker device, a third curved portion that abuts the third leaker device, and a fourth curved portion that abuts the fourth leaker device. As shown, respective top surfaces of the multiple curved portions (e.g., the first curved portion, the second curved portion, the third curved portion, and the fourth curved portion) are substantially horizontally aligned with respective top surfaces of the leaker devices 155 included in the first group of leaker devices 155 (e.g., the first leaker device, the second leaker device, the third leaker device, and the fourth leaker device).

When the structure 500 is formed using techniques described herein, a width of an annulus 530 that forms a top surface of a leaker device 155, included in the first group of leaker devices 155, is substantially identical along an entire circumference of the annulus 530. In other words, the annulus 530 has a substantially identical width along an entire circumference of the annulus 530. Thus, a width of a first annulus that forms a top surface of the first leaker device is substantially identical along an entire circumference of the first annulus, a width of a second annulus that forms a top surface of the second leaker device is substantially identical along an entire circumference of the second annulus, a width of a third annulus that forms a top surface of the third leaker device is substantially identical along an entire circumference of the third annulus, and a width of a fourth annulus that forms a top surface of the fourth leaker device is substantially identical along an entire circumference of the fourth annulus. Thus, in some implementations, each leaker device 155, included in the first group of leaker devices 155, has an annular-shaped top surface with a width that is substantially uniform along an entire circumference of the annular-shaped top surface.

The second group 522 of pillars 502 includes a second group of bottom electrodes 135 (e.g., with one bottom electrode 135 per pillar 502) and a corresponding second group of leaker devices 155 (e.g., with one leaker device 155 per pillar 502) that electrically couple the second group of bottom electrodes 135 to the cell plate 150. For example, the second group 522 of pillars 502 may include a fifth pillar that includes a fifth bottom electrode and a fifth leaker device that couples the fifth bottom electrode to the cell plate, a sixth pillar that includes a sixth bottom electrode and a sixth leaker device that couples the sixth bottom electrode to the cell plate, a seventh pillar that includes a seventh bottom electrode and a seventh leaker device that couples the seventh bottom electrode to the cell plate, and an eighth pillar that includes an eighth bottom electrode and an eighth leaker device that couples the eighth bottom electrode to the cell plate. In the example structure 500, the second group of leaker devices 155 includes four leaker devices.

As shown, a second region 526 (sometimes called an unopened region) between the second group of leaker devices 155 does not include the top electrode 140 and does not include the insulator 145. For example, a top surface of the insulator 145 and a top surface of the top electrode 140 may be horizontally lower than respective top surfaces of each of the leaker devices 155 included in the second group of leaker devices 155 (e.g., respective top surfaces of the fifth leaker device, the sixth leaker device, the seventh leaker device, and the eighth leaker device) in the second region 526. The second region 526 is along a horizontal plane that touches each leaker device 155 included in the second group of leaker devices 155. In some implementations, the second region 526 may include a portion of the horizontal surface 508 that is substantially horizontally aligned with respective top surfaces of the second group of leaker devices 155 and/or a top surface of the lattice structure 512.

The second region 526 (e.g., an entirety of the second region 526) may include the lattice structure 512 (e.g., a lattice material of the lattice structure 512). The lattice structure 512 may be in contact with all of the leaker devices 155 included in the second group of leaker devices 155. The lattice structure 512 may also be in contact with all of the leaker devices 155 included in the first group of leaker devices 155. A top surface of the lattice structure 512 may be substantially horizontally aligned with respective top surfaces of each of the leaker devices 155 included in the second group of leaker devices 155 (e.g., respective top surfaces of the fifth leaker device, the sixth leaker device, the seventh leaker device, and the eighth leaker device) in the second region 526.

In some implementations, the leaker devices 155 included in the first group of leaker devices 155 have substantially identical electrical properties (e.g., within the first group). Additionally, or alternatively, the leaker devices 155 included in the first group of leaker devices 155 and the leaker devices 155 included in the second group of leaker devices 155 may have substantially identical electrical properties (e.g., across the first group and the second group). For example, the first leaker device, the second leaker device, the third leaker device, the fourth leaker device, the fifth leaker device, the sixth leaker device, the seventh leaker device, and the eighth leaker device may all have substantially identical electrical properties. The substantially identical electrical properties may include, for example, a substantially identical electrical conductivity, a substantially identical electrical resistance, a capability to discharge a substantially identical amount of excess charge from a respective bottom electrode, and/or a capability to discharge excess charge at a substantially identical rate of discharge. In some implementations, all of the leaker devices 155 (e.g., across the structure 500, included in different capacitors 110, and/or included in different memory cells 100) may have substantially identical electrical properties. This enables more reliable and predictable operation of the memory array.

Additionally, or alternatively, the leaker devices 155 included in the first group of leaker devices 155 have substantially identical physical dimensions (e.g., within the first group). Additionally, or alternatively, the leaker devices 155 included in the first group of leaker devices 155 and the leaker devices 155 included in the second group of leaker devices 155 may have substantially identical physical dimensions (e.g., across the first group and the second group). For example, the first leaker device, the second leaker device, the third leaker device, the fourth leaker device, the fifth leaker device, the sixth leaker device, the seventh leaker device, and the eighth leaker device may all have substantially identical physical dimensions. The substantially identical physical dimensions may include, for example, a substantially identical height, a substantially identical width, a substantially identical diameter, a substantially identical internal diameter and/or external diameter of an annulus that forms the top surface of the leaker devices 155, a substantially identical depth (e.g., contained within the leaker devices 155), and/or a substantially identical shape. This enables more reliable and predictable operation of the memory array. In some implementations, all of the leaker devices 155 (e.g., across the structure 500, included in different capacitors 110, and/or included in different memory cells 100) may have substantially identical physical dimensions to provide more reliable performance of the memory device.

The separation structure 518 may extend vertically from the insulative layer 514 to a top surface of the separation structure 518, which may be substantially horizontally aligned with the horizontal surface 508 and/or any other surfaces described herein as being substantially horizontally aligned with the horizontal surface 508. Thus, a bottom surface of the separation structure 518 may interface with (e.g., may be along, abutting, and/or in contact with) a top surface of the insulative layer 514. A top surface of the separation structure 518 may interface with (e.g., may be along, abutting, and/or in contact with) respective bottom surfaces of multiple (e.g., two) cell plates 150. For example, the top surface of the separation structure 518 may be substantially horizontally aligned with a bottom surface of a first cell plate and a bottom surface of a second cell plate.

In some implementations, the separation structure 518 may include a first horizontal extension and a second horizontal extension that extend horizontally in opposite directions at a top portion of the separation structure. The top portion of the separation structure 518 may abut the cell plate(s) 150. The first horizontal extension and the second horizontal extension may extend horizontally from a vertical center line of the separation structure 518. Thus, the separation structure 518 may be wider at the top portion than at a vertical middle portion of the separation structure 518 or at a bottom portion of the separation structure 518. In some implementations, a width of the vertical middle portion of the separation structure 518 (in the illustrated y-direction) may be less than or equal to approximately 50 nanometers, or may be between approximately 10 nanometers and approximately 50 nanometers, inclusive.

As shown, a first cell plate (shown on the left of FIG. 5B) may abut the first horizontal extension of the separation structure 518, and a second cell plate (shown on the right of FIG. 5B) may abut the second horizontal extension of the separation structure 518. The gap 510 between the first cell plate and the second cell plate may be above the top portion of the separation structure 518 that is located between the first horizontal extension and the second horizontal extension.

The separation structure 518 may be an electrical insulator and may comprise, consist of, or consist essentially of insulative material. The insulative material may comprise, consist of, or consist essentially of silicon dioxide, silicon nitride, aluminum oxide, and/or hafnium oxide, among other examples. In some implementations, the separation structure 518 may be a different material than the insulator 145.

As further shown in FIG. 5B, the lattice structure 512 may abut a cell plate 150. For example, a top surface of the lattice structure 512 may interface with (e.g., may be along, abutting, and/or in contact with) a bottom surface of a cell plate 150. For example, the top surface of the lattice structure 512 may be substantially horizontally aligned with a bottom surface of a cell plate 150 (and/or the horizontal surface 508 and/or any other surfaces described herein as being substantially horizontally aligned with the horizontal surface 508). In some implementations, the lattice structure 512 may abut one or more bottom electrodes 135. For example, the lattice structure 512 may be between and/or abutting multiple bottom electrodes 135. Alternatively, a bottom surface of the lattice structure 512 may be horizontally aligned with or vertically above the top surface of bottom electrodes 135. In this case, the lattice structure 512 does not abut the bottom electrodes 135 (but still abuts and is in contact with leaker devices 155). The lattice structure 512 may support the bottom electrodes 135, the leaker devices 155, and/or the pillars 502 during a fabrication process.

The lattice structure 512 may be an electrical insulator and may comprise, consist of, or consist essentially of insulative material. The insulative material may comprise, consist of, or consist essentially of silicon dioxide, silicon nitride, and/or doped versions of silicon dioxide and/or silicon nitride (e.g., doped with carbon), among other examples. In some implementations, the lattice structure 512 may be a different material than the separation structure 518 and/or the insulator 145. In some implementations, the lattice structure 512 (e.g., a material of the lattice structure 512) has an etch rate between approximately 3 Angstroms per second and approximately 7 Angstroms per second, inclusive, in an approximately 49% hydrogen fluoride solution. Additionally, or alternatively, the lattice structure 512 may be a nitride.

As shown in FIG. 5B, the structure may be supported by the insulative layer 514. The insulative layer 514 may be an electrical insulator and may comprise, consist of, or consist essentially of silicon dioxide, silicon nitride, aluminum oxide, and/or hafnium oxide, among other examples. In some implementations, the insulative layer 514 may be a different material than the insulator 145. In some implementations, the insulative layer 514 may be a different material than the insulative layer 516. In some implementations, the insulative layer 514 may be a same material as the insulative layer 516.

As further shown, the structure 500 may include multiple conductive contacts 532. A conductive contact 532 may couple a corresponding bottom electrode 135 to a corresponding transistor (not shown, but which may be beneath the structure 500), which may selectively couple that bottom electrode 135 to a digit line 120. As shown, the top surface of a conductive contact 532 may interface with (e.g., may be along, may abut, and/or may be in contact with) the bottom surface of a bottom electrode 135. In some implementations, the conductive contact 532 is a cylinder (within reasonable tolerances of manufacturing and measurement). In other words, the conductive contact 532 may be substantially cylindrical in shape. The conductive contact 532 may be an electrical conductor and may comprise, consist of, or consist essentially of conductive material. The conductive material may comprise, consist of, or consist essentially of a metal (e.g., titanium, tungsten, cobalt, nickel, platinum, and/or ruthenium), a metal composition (e.g., a metal silicide, a metal carbide, and/or a metal nitride, such as titanium nitride or titanium silicon nitride), and/or a conductively-doped semiconductor material (e.g., conductively-doped silicon, conductively-doped germanium, and/or conductively-doped gallium arsenide), among other examples. In some implementations, the conductive contact 532 may be a same material as the cell plate 150.

The insulative layer 516 may separate the insulator 145 from the insulative layer 514 and/or the conductive contacts 532. The insulative layer 516 may be an electrical insulator and may comprise, consist of, or consist essentially of silicon dioxide, silicon nitride, aluminum oxide, and/or hafnium oxide, among other examples. In some implementations, the insulative layer 516 may be a different material than the insulator 145.

In some implementations, the width of the pillar 502 (e.g., a combined width of the support pillar 504 and the bottom electrode 135 and/or a combined width of the leaker device 155 and the leaker fill material 506) along the y-axis and the illustrated cross-section of FIG. 5B, and/or a diameter of the pillar 502, may be less than or equal to approximately 14 nanometers, or may be between approximately 14 nanometers and approximately 20 nanometers, inclusive. In some implementations, a diameter of the insulator 145 at the horizontal surface 508 may be less than or equal to approximately nanometers, or may be between approximately 30 nanometers and approximately 44 nanometers, inclusive. In some implementations, a diameter of the top electrode 140 at the horizontal surface 508 may be less than or equal to approximately 15 nanometers, or may be between approximately 15 nanometers and approximately 29 nanometers, inclusive. The above diameters are examples when the structure is viewed from the cross-sectional view shown in FIG. 5A.

Thus, in some implementations, a pitch of the structure 500 along they-axis may be less than or equal to approximately 38 nanometers. For example, a distance from a left edge of a pillar 502 or a bottom electrode 135 to a left edge of a neighboring pillar 502 or a neighboring bottom electrode 135 (e.g., that shares a top electrode 140 with the pillar 502 or the bottom electrode 135) may be approximately 26 nanometers (or less than 26 nanometers).

In some implementations, a height of the lattice structure 512 may be greater than 100 nanometers, less than 300 nanometers, and/or approximately equal to 200 nanometers. In some implementations, a height of the structure 500 may be greater than 500 nanometers, less than 800 nanometers, and/or approximately equal to 700 nanometers.

The above dimensions are provided as examples, and the described parts of the structure may have different dimensions in some implementations. For example, some widths and diameters are described above in connection with a pitch of 38 nanometers. Respective widths and diameters may be scaled up or scaled down for different sized pitches, such as 48 nanometers, 43 nanometers, 41 nanometers, or 32 nanometers, among other examples.

The structure 500 may extend along the illustrated y-direction. For example, the structure 500 may include multiple pillars 502 (e.g., tens, dozens, or the like) along the illustrated y-direction before another separation structure 518 is present. A pair of consecutive separation structures 518 may contain (between them) tens, dozens, or more of pillars 502 and/or memory cells 100 along the illustrated cross-section of FIG. 5B.

The structure 500 may be part of an integrated assembly, such as a memory array, a portion of a memory array, or a memory device that includes the memory array. For example, a memory device may include multiple memory cells 100 (e.g., an array of memory cells 100). A memory cell 100 may include a capacitor 110 and a transistor 105. The capacitor 110 may include a bottom electrode 135, a top electrode 140, and an insulator 145 that separates the bottom electrode 135 and the top electrode 140. In some implementations, the top electrode 140 is shared among multiple capacitors 110 corresponding to multiple memory cells 100 (e.g., in a bounded region, described elsewhere herein). The transistor 105 (not shown in FIGS. 5A-5B) may enable access to the capacitor 110 (e.g., a bottom electrode 135 of the capacitor) via a digit line 120, as described above in connection with FIG. 1. The memory cell 100 may also include a leaker device 155. The leaker device 155 may couple the bottom electrode 135 and a cell plate 150 that is included in the memory device. The memory device may include an array with a large quantity of structures 500 and/or memory cells 100 (e.g., hundreds, thousands, millions, or more) that are substantially identical to one another. The structures 500 and/or memory cells 100 may extend across the memory array along the illustrated x-axis and the illustrated y-axis to form a grid pattern or an array pattern. The memory device may include multiple cell plates 150. Each cell plate 150 may contact a different plurality of leaker devices 155, corresponding to a plurality of memory cells 100, and may contact a different top electrode 140 shared by those memory cells 100.

The structure 500 may further include the transistor 105 of FIG. 1, the access line 115 of FIG. 1, and the digit line 120 of FIG. 1. For example, the bottom electrodes 135 may be coupled to corresponding transistors 105 by respective conductive contacts 532. Thus, the structure may operate as described above in connection with FIG. 1 and/or FIG. 2 to discharge excess charge from bottom electrodes 135.

Each of the illustrated x-axis, y-axis, and z-axis is substantially perpendicular to the other two axes. For example, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

As indicated above, FIGS. 5A-5B are provided as examples. Other examples may differ from what is described with respect to FIGS. 5A-5B.

Figure 6:
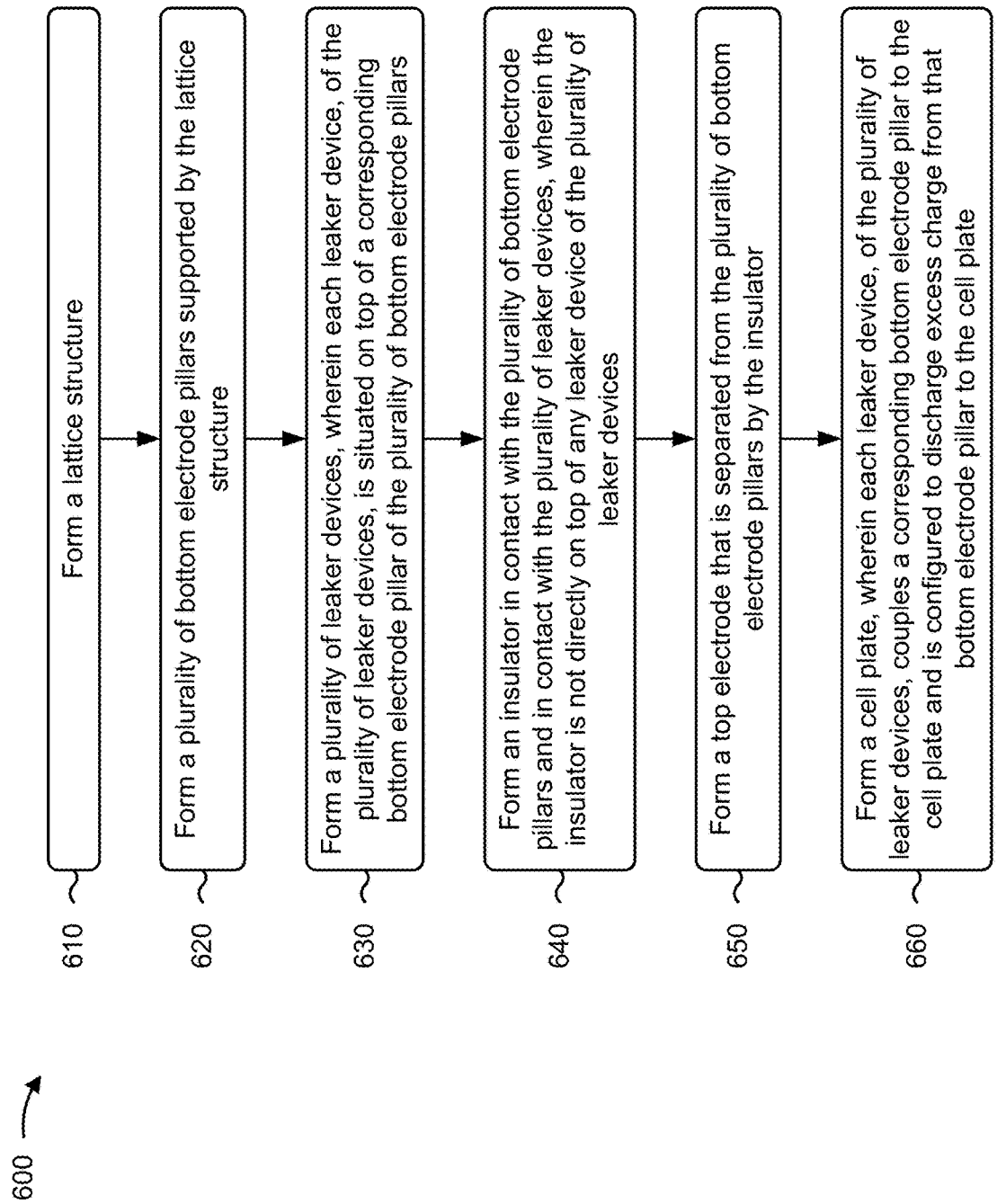
FIG. 6 is a flowchart of an example method of forming an integrated assembly or memory device having non-impinged leaker devices.

FIG. 6 is a flowchart of an example method 600 of forming an integrated assembly or memory device having non-impinged leaker devices. In some implementations, one or more process blocks of FIG. 6 may be performed by various semiconductor manufacturing equipment.

As shown in FIG. 6, the method 600 may include forming a lattice structure (block 610). As further shown in FIG. 6, the method 600 may include forming a plurality of bottom electrode pillars supported by the lattice structure (block 620). As further shown in FIG. 6, the method 600 may include forming a plurality of leaker devices, wherein each leaker device, of the plurality of leaker devices, is situated on top of a corresponding bottom electrode pillar of the plurality of bottom electrode pillars (block 630). As further shown in FIG. 6, the method 600 may include forming an insulator in contact with the plurality of bottom electrode pillars and in contact with the plurality of leaker devices, wherein the insulator is not directly on top of any leaker device of the plurality of leaker devices (block 640). As further shown in FIG. 6, the method 600 may include forming a top electrode that is separated from the plurality of bottom electrode pillars by the insulator (block 650). As further shown in FIG. 6, the method 600 may include forming a cell plate, wherein each leaker device, of the plurality of leaker devices, couples a corresponding bottom electrode pillar to the cell plate and is configured to discharge excess charge from that bottom electrode pillar to the cell plate (block 660).

In some implementations, the method 600 further includes forming an opening in the lattice structure in a region between a group of leaker devices of the plurality of leaker devices. The opening may abut each leaker device included in the group of leaker devices. In some implementations, forming the opening does not remove material of the group of leaker devices. In some implementations, forming the insulator comprises depositing insulative material into the opening. In some implementations, forming the top electrode comprises depositing conductive material into the opening. In some implementations, the opening is formed by forming a first opening using a dry etching process, where the first opening has a size that is smaller than the opening, and expanding the first opening, to form the opening, using a wet etching process. In some implementations, the first opening does not abut any leaker device included in the group of leaker devices.

Although FIG. 6 shows example blocks of the method 600, in some implementations, the method 600 may include additional blocks, fewer blocks, different blocks, or differently arranged blocks than those depicted in FIG. 6. In some implementations, the method 600 may include forming the structure 500, an integrated assembly that includes the structure 500, any part described herein of the structure 500, and/or any part described herein of an integrated assembly that includes the structure 500. For example, the method 600 may include forming one or more of the parts 105-160 and/or 502-532.

FIGS. 7A-7B through 20A-20B are diagrammatic views showing formation of the structure 500 at example process stages of an example process of forming the structure 500. In some implementations, the example process described below in connection with FIGS. 7A-7B through 20A-20B may correspond to the method 600 and/or one or more blocks of the method 600. However, the process described below is an example, and other example processes may be used to form the structure 500, an integrated assembly that includes the structure 500, and/or one or more parts of the structure 500 and/or the integrated assembly.

Figure 7A:
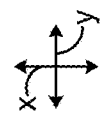
FIGS. 7A and 7B are diagrammatic views showing formation of the structure of FIGS. 5A-5B at an example process stage of an example process of forming the structure.
Figure 7A:
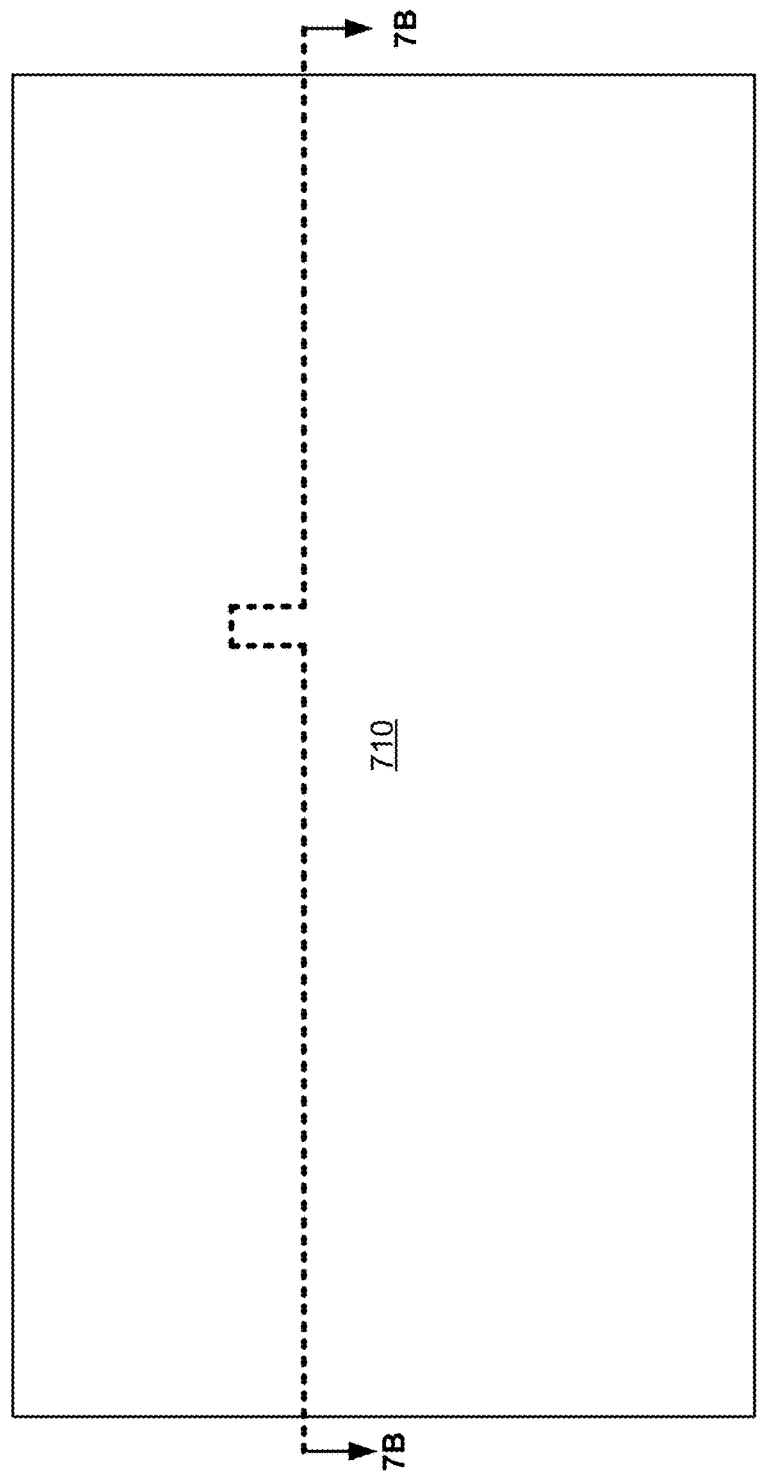
Figure 7B:
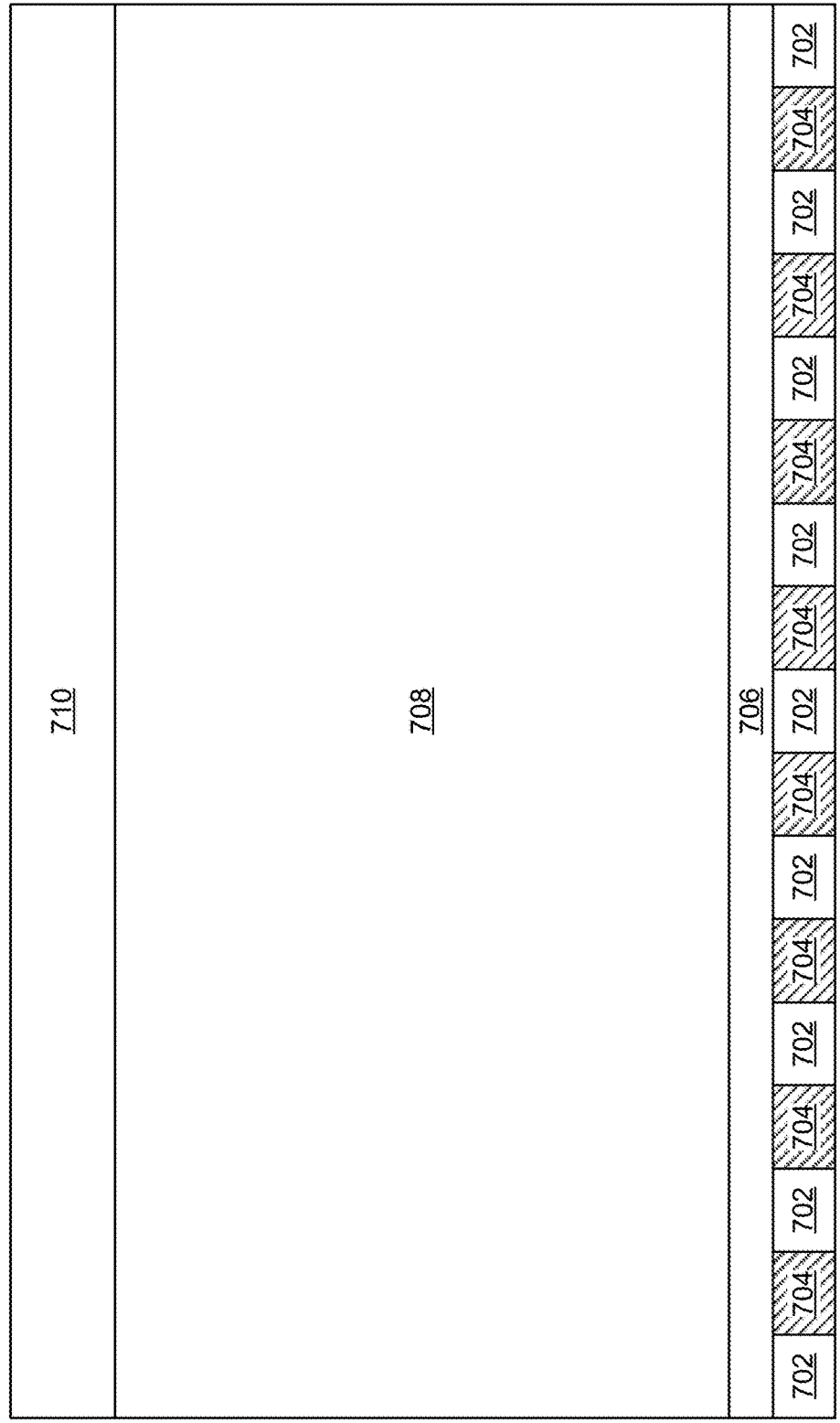

As shown in FIGS. 7A-7B, the process may include forming (e.g., depositing or growing) insulative material 702 on a base structure (not shown, but which may be beneath the insulative material 702). The insulative material 702 may form the insulative layer 514 and may comprise, consist of, or consist essentially of one or more of the materials described above in connection with the insulative layer 514. The base structure may include, for example, transistors 105, access lines 115, and/or digit lines 120.

As shown in FIGS. 7A-7B, the process may include forming (e.g., depositing or growing) electrically conductive material 704 on the base structure. The electrically conductive material 704 may form the conductive contacts 532 and may comprise, consist of, or consist essentially of one or more of the materials described above in connection with the conductive contacts 532.

As shown in FIGS. 7A-7B, the process may include forming (e.g., depositing or growing) insulative material 706 on the insulative material 702 and the electrically conductive material 704. The insulative material 706 may form the insulative layer 516 and may comprise, consist of, or consist essentially of one or more of the materials described above in connection with the insulative layer 516.

As shown in FIGS. 7A-7B, the process may include forming (e.g., depositing or growing) insulative material 708 on the insulative material 706. The insulative material 708 may comprise, consist of, or consist essentially of an oxide (e.g., silicon dioxide), among other examples.

As shown in FIGS. 7A-7B, the process may include forming (e.g., depositing or growing) insulative material 710 on the insulative material 708. The insulative material 710 may form the lattice structure 512, and may comprise, consist of, or consist essentially of one or more of the materials described above in connection with the lattice structure 512.

Figure 8A:
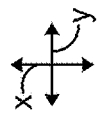
Figure 8A:
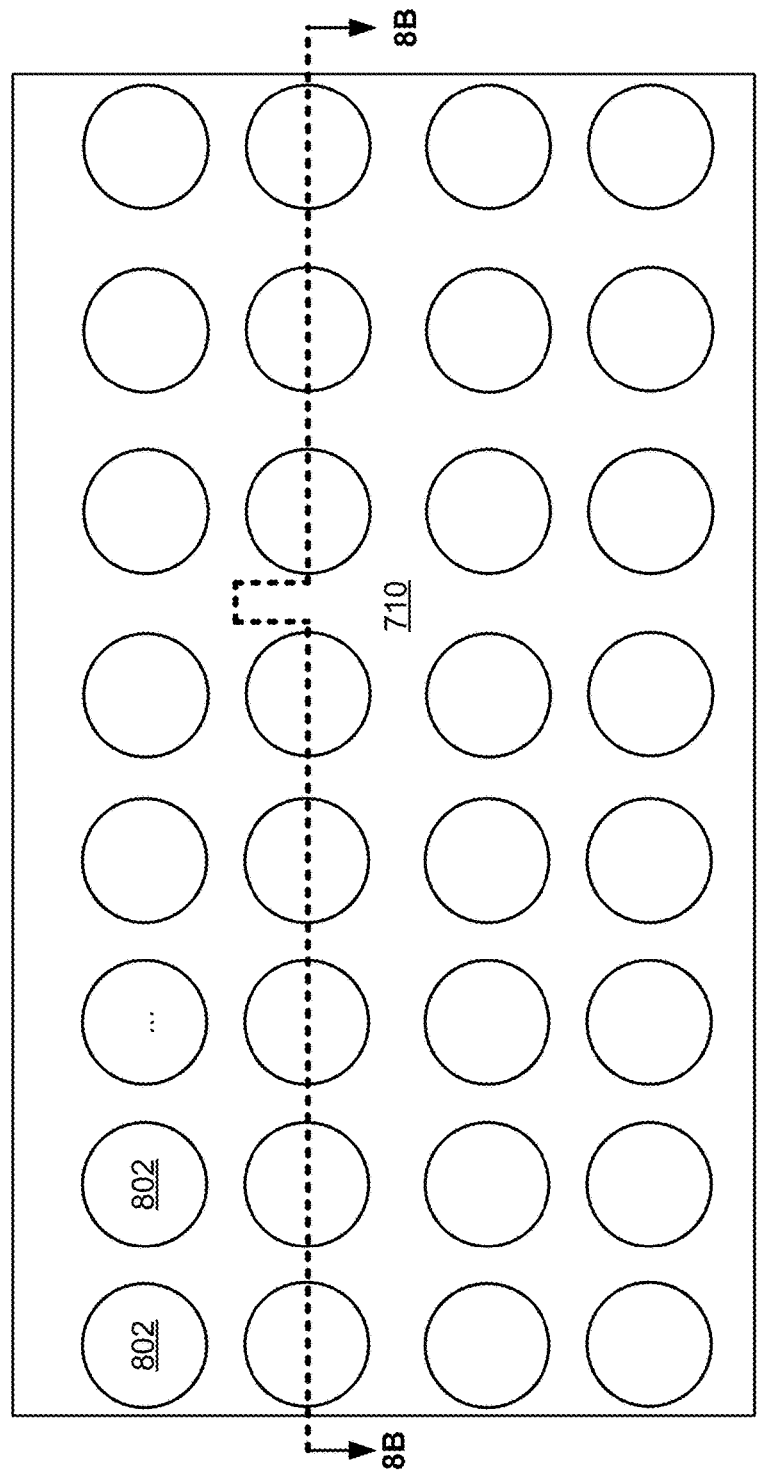

As shown in FIGS. 8A-8B, the process may include removing (e.g., etching) material to form voids 802. The removed material may include insulative material 706, insulative material 708, and insulative material 710. Thus, the removal may be a full stack removal (e.g., a full stack etch) to remove all material in the voids 802 except for the insulative layer 514. As shown, a shape of the voids 802 may be a cylinder. A mask may be used to cover a portion of the structure, and material may be removed (e.g., etched) from unmasked regions to form the voids 802. This step may form pillars of insulative material 706, insulative material 708, and insulative material 710 along the illustrated cross-section of FIG. 8B. Each of these pillars may have substantially the same dimensions.

Figure 9A:
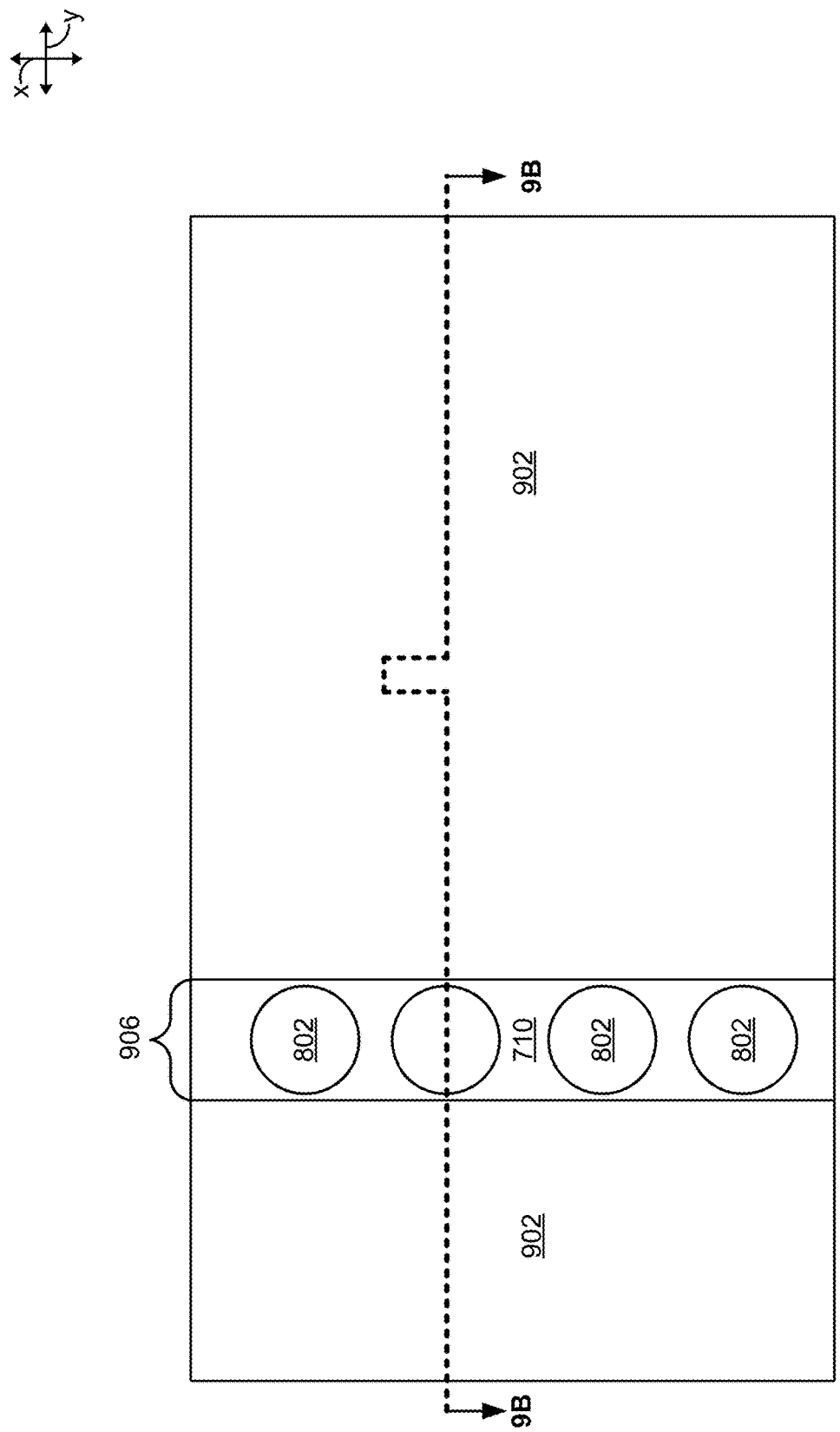
FIGS. 9A and 9B are diagrammatic views showing formation of the structure of FIGS. 5A-5B at an example process stage that is after the example process stage of FIGS. 8A and 8B.
Figure 9B:
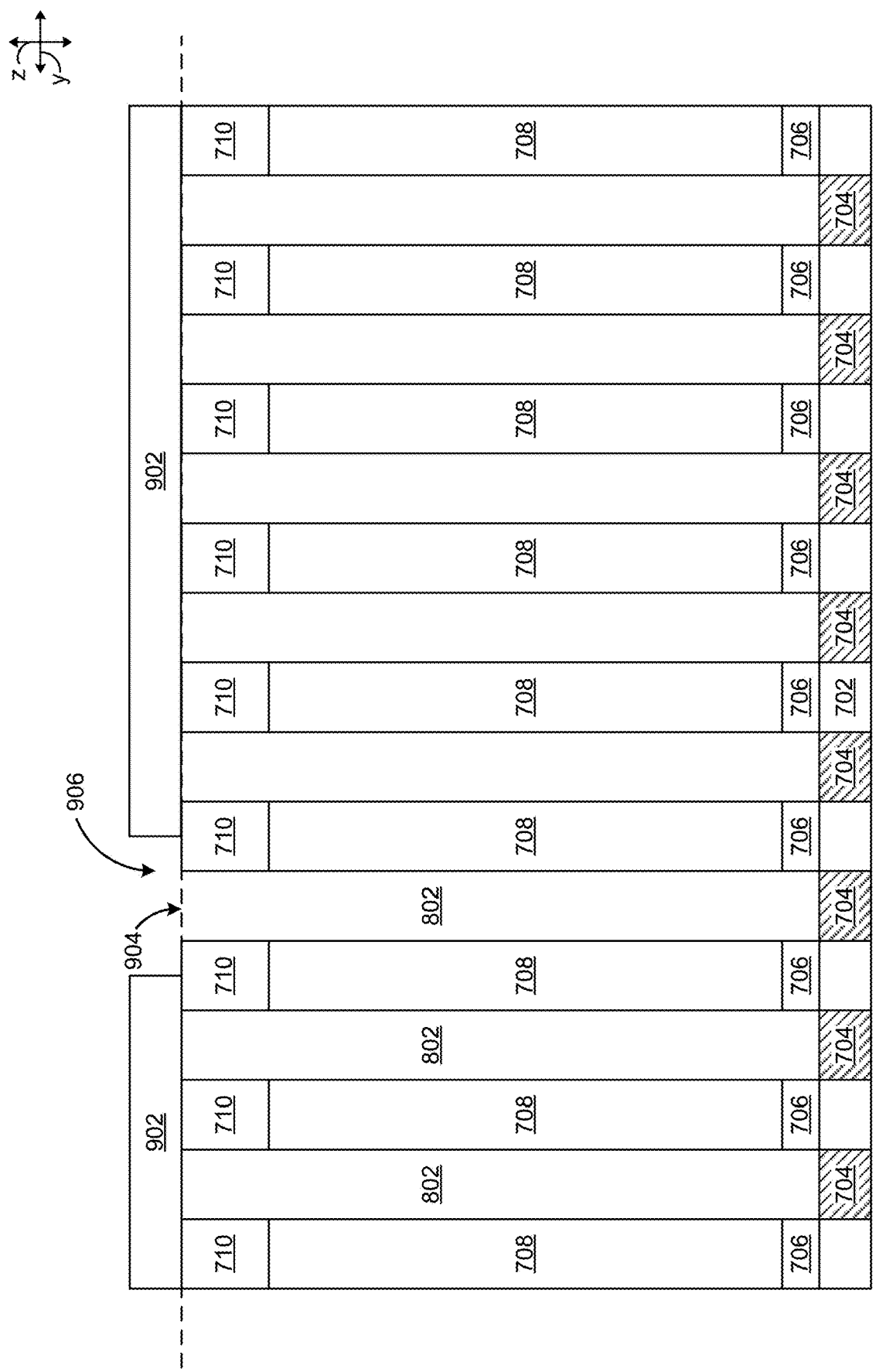

As shown in FIGS. 9A-9B, the process may include forming (e.g., depositing or growing) a mask 902 along a horizontal surface 904 that is substantially horizontally aligned with the top surfaces of the insulative material 710 (e.g., the top surfaces of pillars with the insulative material 710 on top). The mask 902 may comprise, consist of, or consist essentially of carbon (or another hard mask), among other examples. In some implementations, the mask 902 may be applied using a spin-on carbon technique. As further shown, the process may include removing (e.g., etching) material from the mask 902 to form an unmasked trench region 906. In some implementations, the width of the unmasked trench region 906 (e.g., along the y-axis) may be approximately equal to the pitch of the structure 500.

Figure 10A:
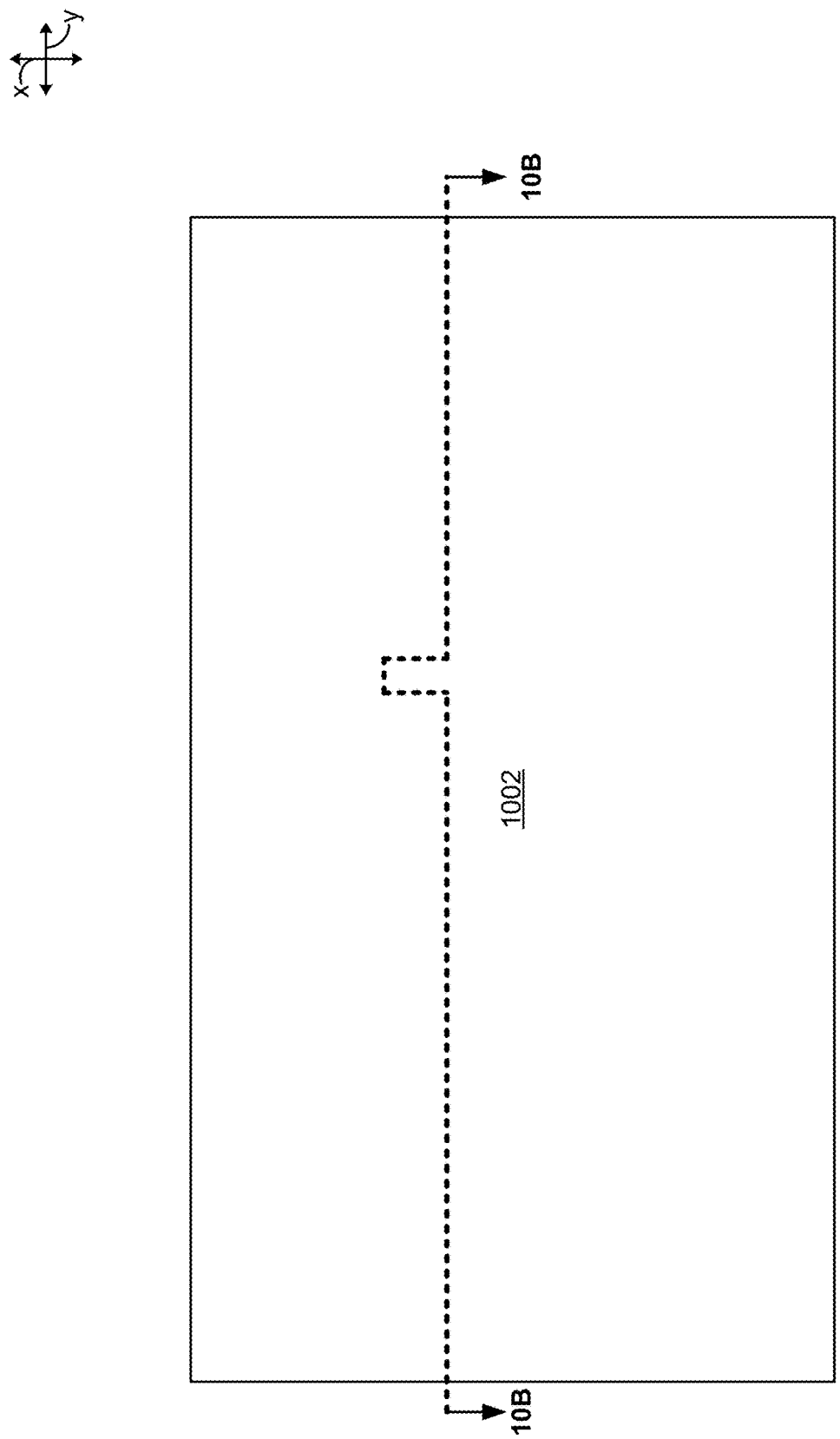

As shown in FIGS. 10A-10B, the process may include filling (e.g., depositing or growing within) voids 802, that are unmasked as a result of forming the unmasked trench region 906, with insulative material 1002. As shown, masked voids (e.g., that are masked by the mask 902) are not filled with the insulative material 1002. The insulative material 1002 may form the separation structure 518 and may comprise, consist of, or consist essentially of one or more of the materials described above in connection with the separation structure 518. As shown, the insulative material 1002 may be deposited on the electrically conductive material 704 in a void 802 between pillars, may fill the unmasked trench region 906 between the mask 902, and may be deposited on the mask 902.

Figure 11A:
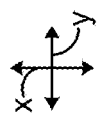
Figure 11A:
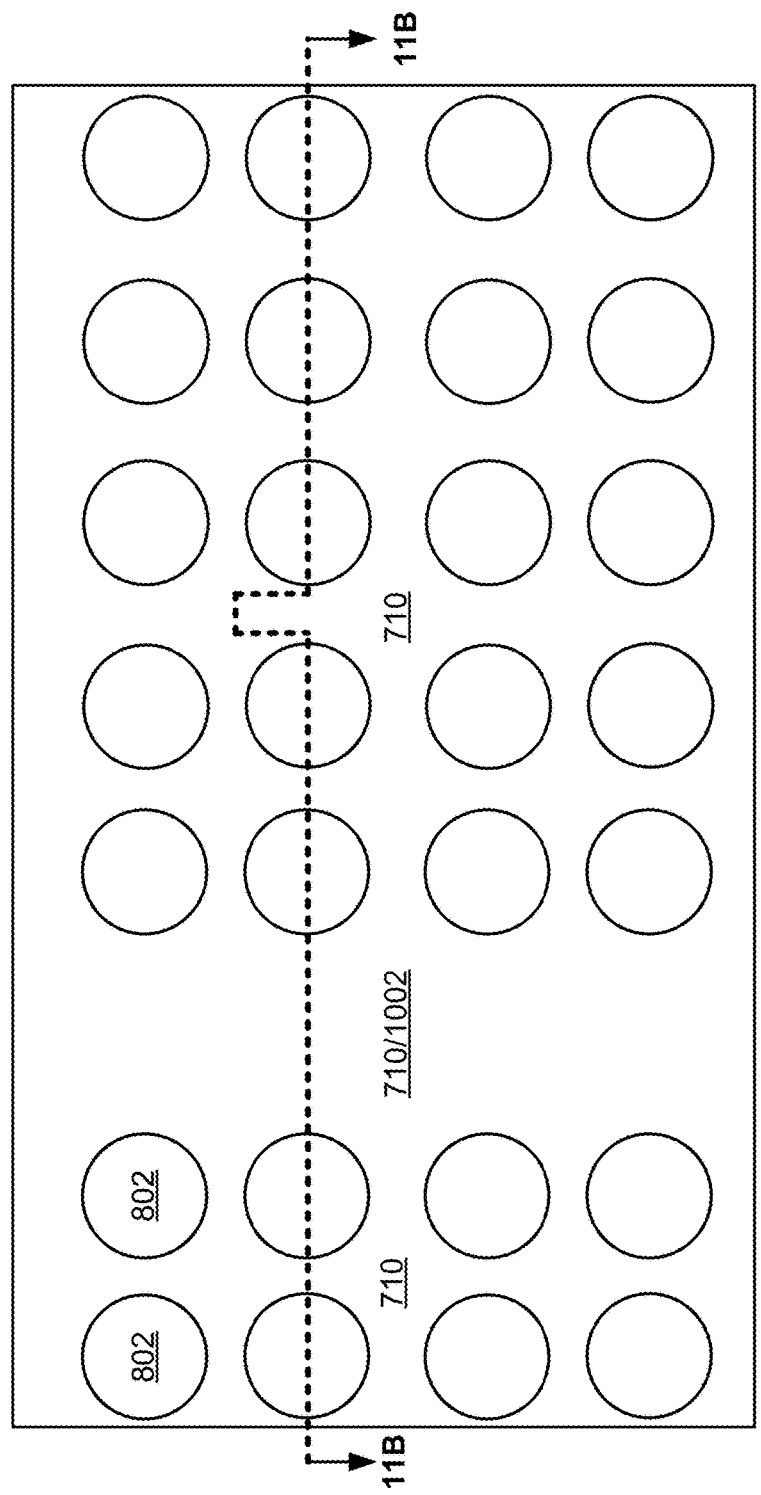

As shown in FIGS. 11A-11B, the process may include removing (e.g., etching) the mask 902 (e.g., an entirety of the mask 902) and removing (e.g., etching) a portion of the insulative material 1002 down to the horizontal surface 904. In some implementations, the process may include planarizing the horizontal surface 904 of the integrated assembly. For example, the horizontal surface 904 may be planarized using chemical-mechanical polishing or another suitable planarization technique.

Figure 12A:
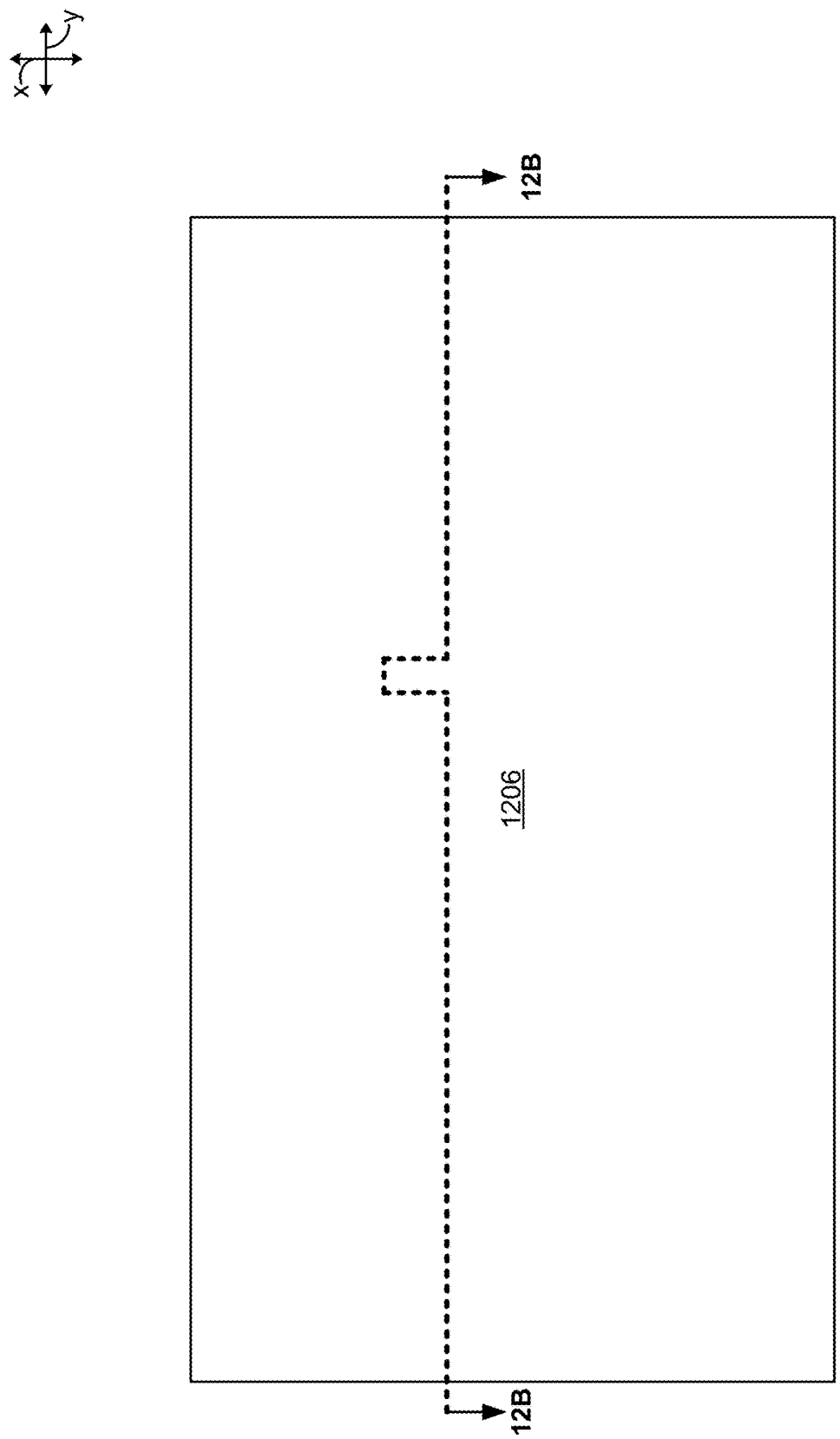
FIGS. 12A and 12B are diagrammatic views showing formation of the structure of FIGS. 5A-5B at an example process stage that is after the example process stage of FIGS. 11A and 11B.
Figure 12B:
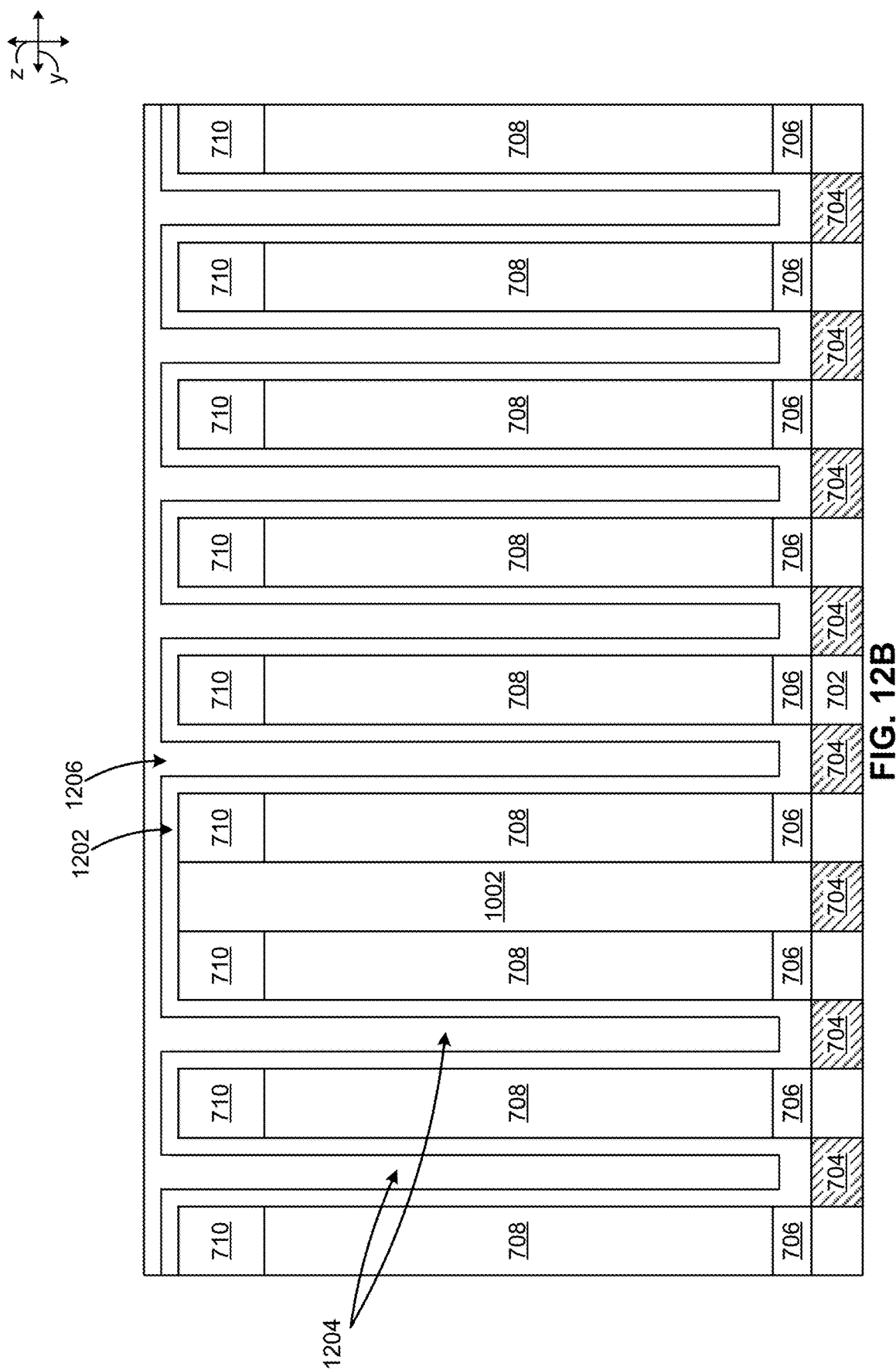

As shown in FIGS. 12A-12B, the process may include forming (e.g., depositing or growing) electrically conductive material 1202 on the electrically conductive material 704, the insulative material 706, the insulative material 708, the insulative material 710, and the insulative material 1002. For example, the electrically conductive material 1202 may be formed in the remaining (unmasked) voids 802 along surfaces of materials that are exposed to those voids 802. The electrically conductive material 1202 may be formed such that a void 1204 is formed in a region contained by a shape of the electrically conductive material 1202. The electrically conductive material 1202 may form the bottom electrodes 135 and may comprise, consist of, or consist essentially of one or more of the materials described above in connection with the bottom electrode 135.

As shown in FIGS. 12A-12B, the process may include forming (e.g., depositing or growing) material 1206 on the electrically conductive material 1202. For example, the material 1206 may be formed in the voids 1204. The material 1206 may form support pillars 504 and may comprise, consist of, or consist essentially of one or more of the materials described above in connection with the support pillar 504.

Figure 13A:
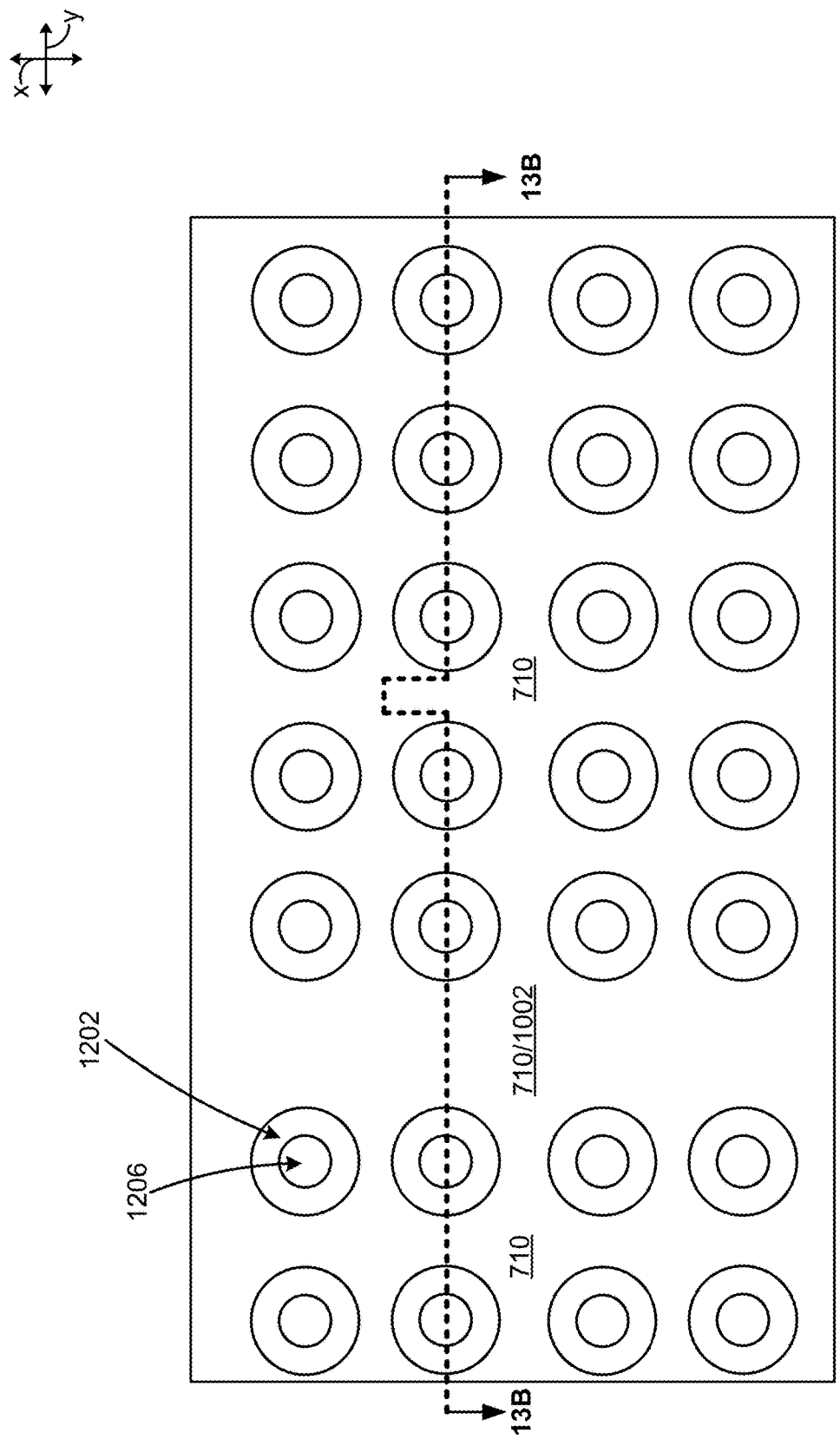
FIGS. 13A and 13B are diagrammatic views showing formation of the structure of FIGS. 5A-5B at an example process stage that is after the example process stage of FIGS. 12A and 12B.
Figure 13B:
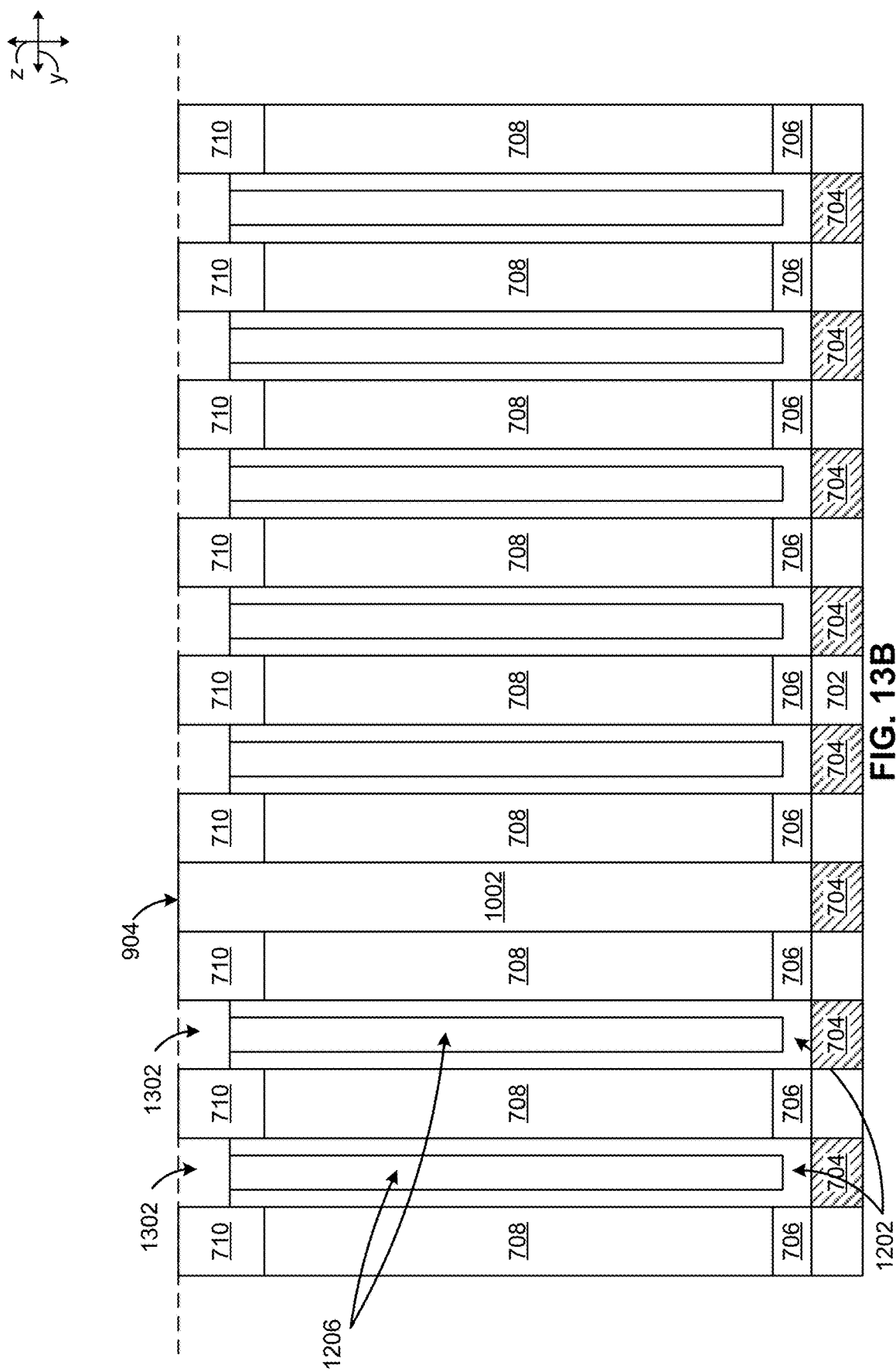

As shown in FIGS. 13A-13B, the process may include removing (e.g., etching) a portion of the electrically conductive material 1202 and a portion of the material 1206 to form recessed regions 1302. In some implementations, the depth of the recessed regions along the z-axis (e.g., measured down from the horizontal surface 904) may be approximately equal to 40 nanometers. In some implementations, the process may include planarizing the horizontal surface 904 (e.g., using chemical-mechanical polishing or another suitable planarization technique) and removing (e.g., etching) electrically conductive material 1202 and material 1206 between pillars of insulative material.

Figure 14A:
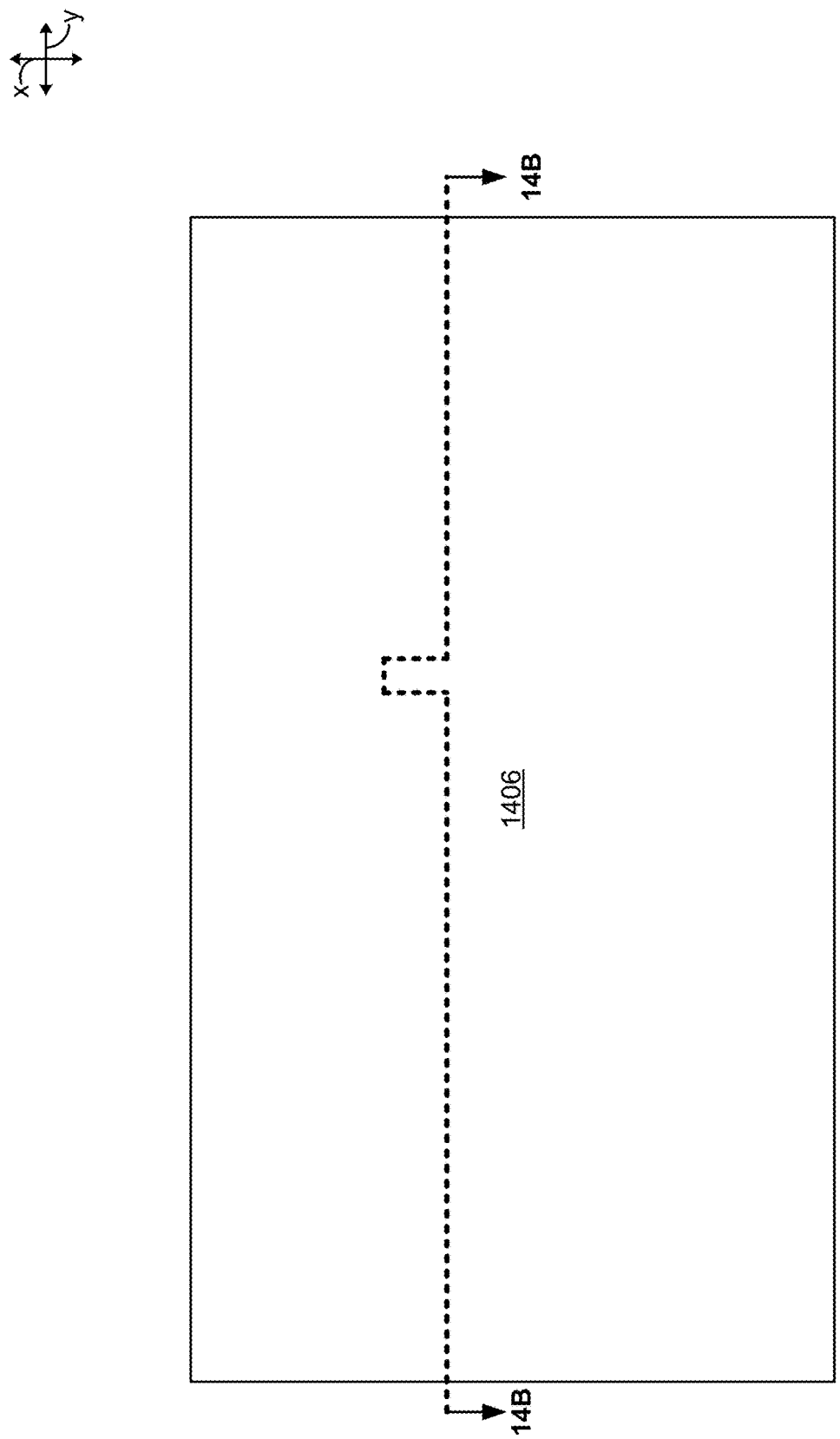
FIGS. 14A and 14B are diagrammatic views showing formation of the structure of FIGS. 5A-5B at an example process stage that is after the example process stage of FIGS. 13A and 13B.
Figure 14B:
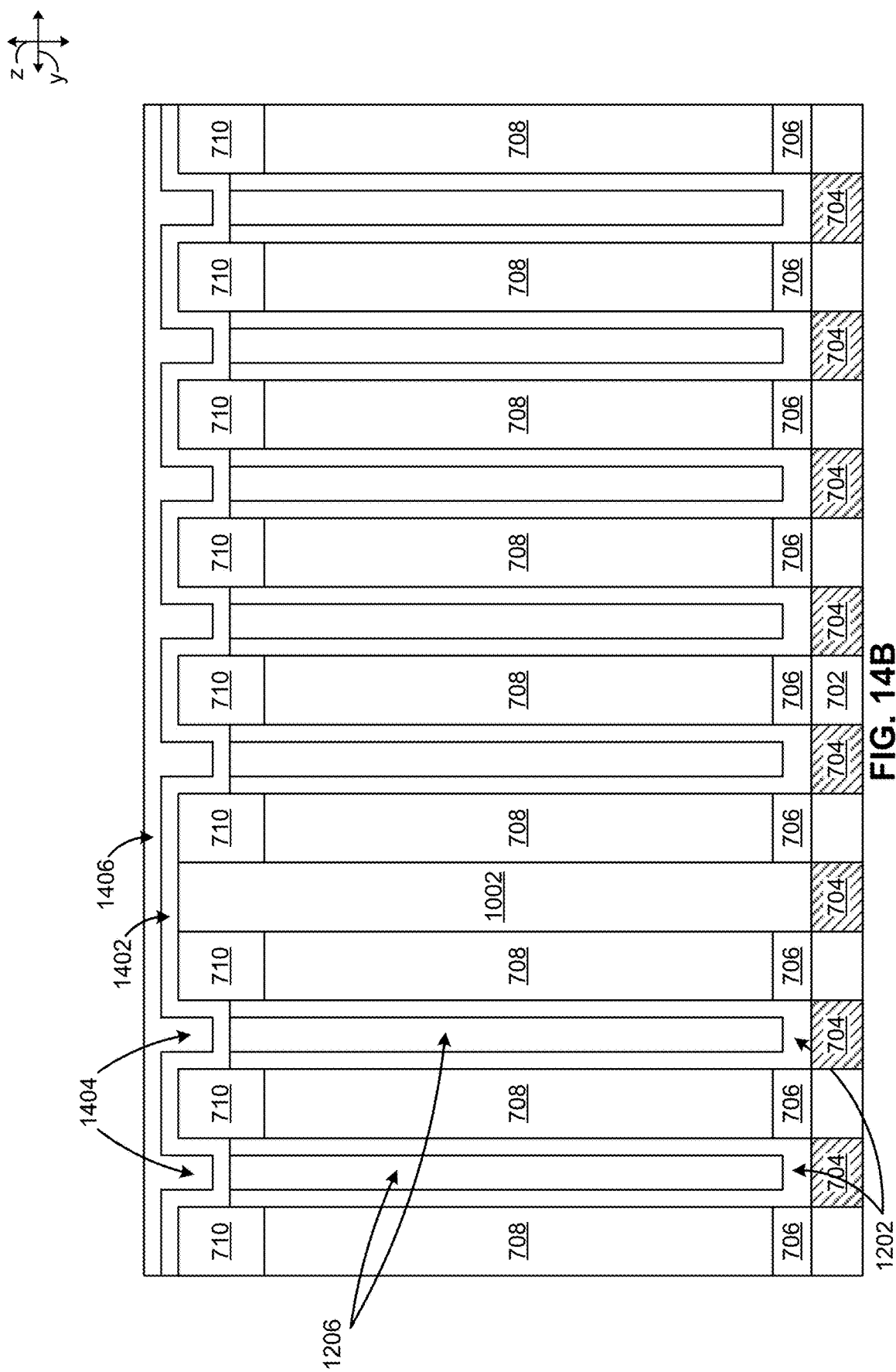

As shown in FIGS. 14A-14B, the process may include forming (e.g., depositing or growing) electrically conductive material 1402 on the electrically conductive material 1202, the material 1206, the insulative material 710, and the insulative material 1002. For example, the electrically conductive material 1402 may be formed in the recessed regions 1302. The electrically conductive material 1402 may be formed such that a void 1404 is formed in a region contained by a shape of the electrically conductive material 1402. The electrically conductive material 1402 may form the leaker devices 155 and may comprise, consist of, or consist essentially of one or more of the materials described above in connection with the leaker device 155.

As shown in FIGS. 14A-14B, the process may include forming (e.g., depositing or growing) material 1406 on the electrically conductive material 1402. For example, the material 1406 may be formed in the voids 1404. The material 1406 may form the leaker fill material 506 and may comprise, consist of, or consist essentially of one or more of the materials described above in connection with the leaker fill material 506. In some implementations, the material 1406 has a higher etch resistivity than the insulative material 708 so that the material 1406 is maintained after the exhume process described below in connection with FIGS. 17A-17B.

In some implementations, depending on a desired configuration and/or resistance of the leaker device 155, the process step of forming the material 1406 may be omitted. In this case, the electrically conductive material 1402 may fill the recessed regions 1302 (e.g., rather than the recessed regions 1302 being filled with both the electrically conductive material 1402 and the material 1406).

Figure 15A:
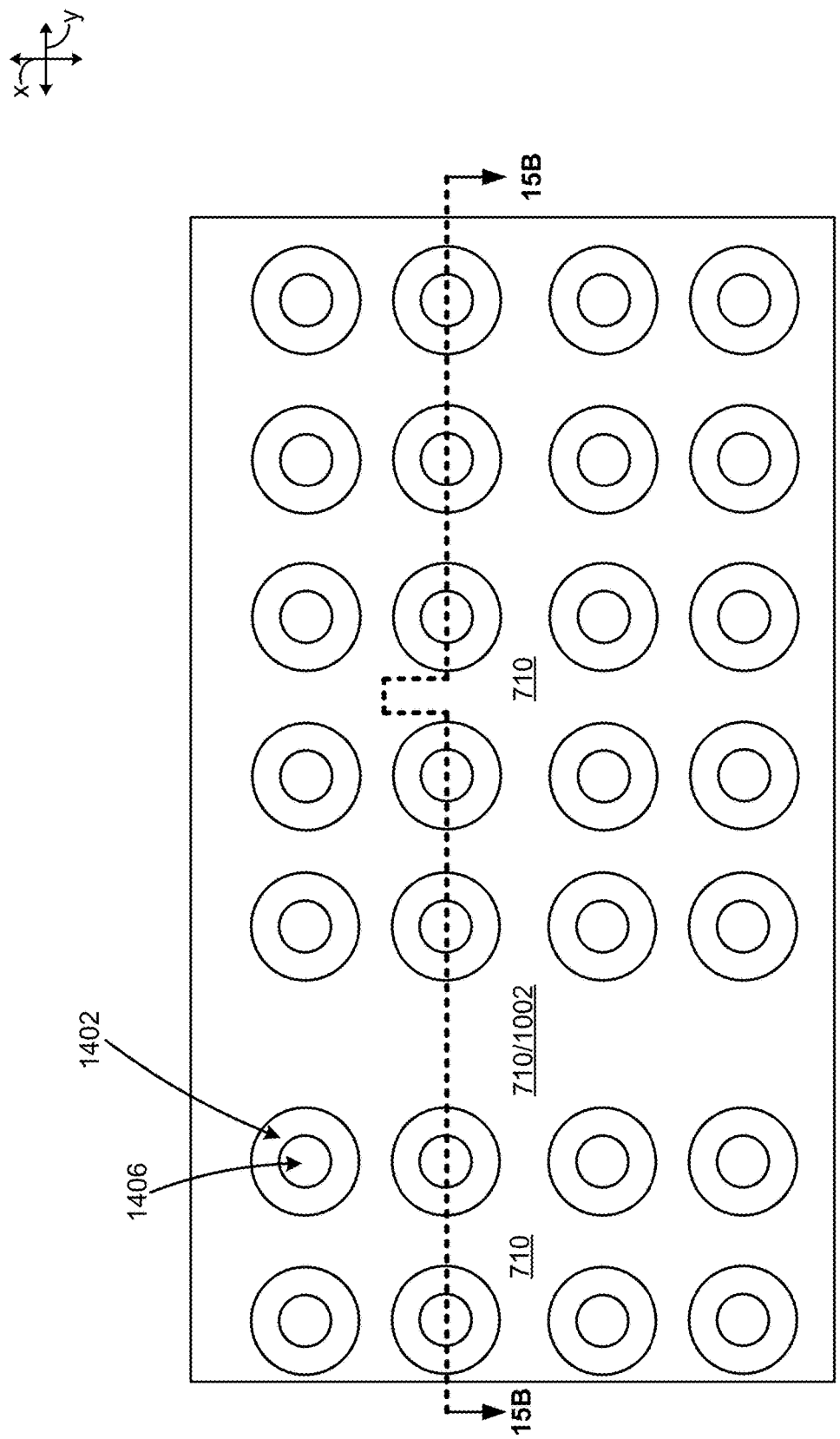
FIGS. 15A and 15B are diagrammatic views showing formation of the structure of FIGS. 5A-5B at an example process stage that is after the example process stage of FIGS. 14A and 14B.
Figure 15B:
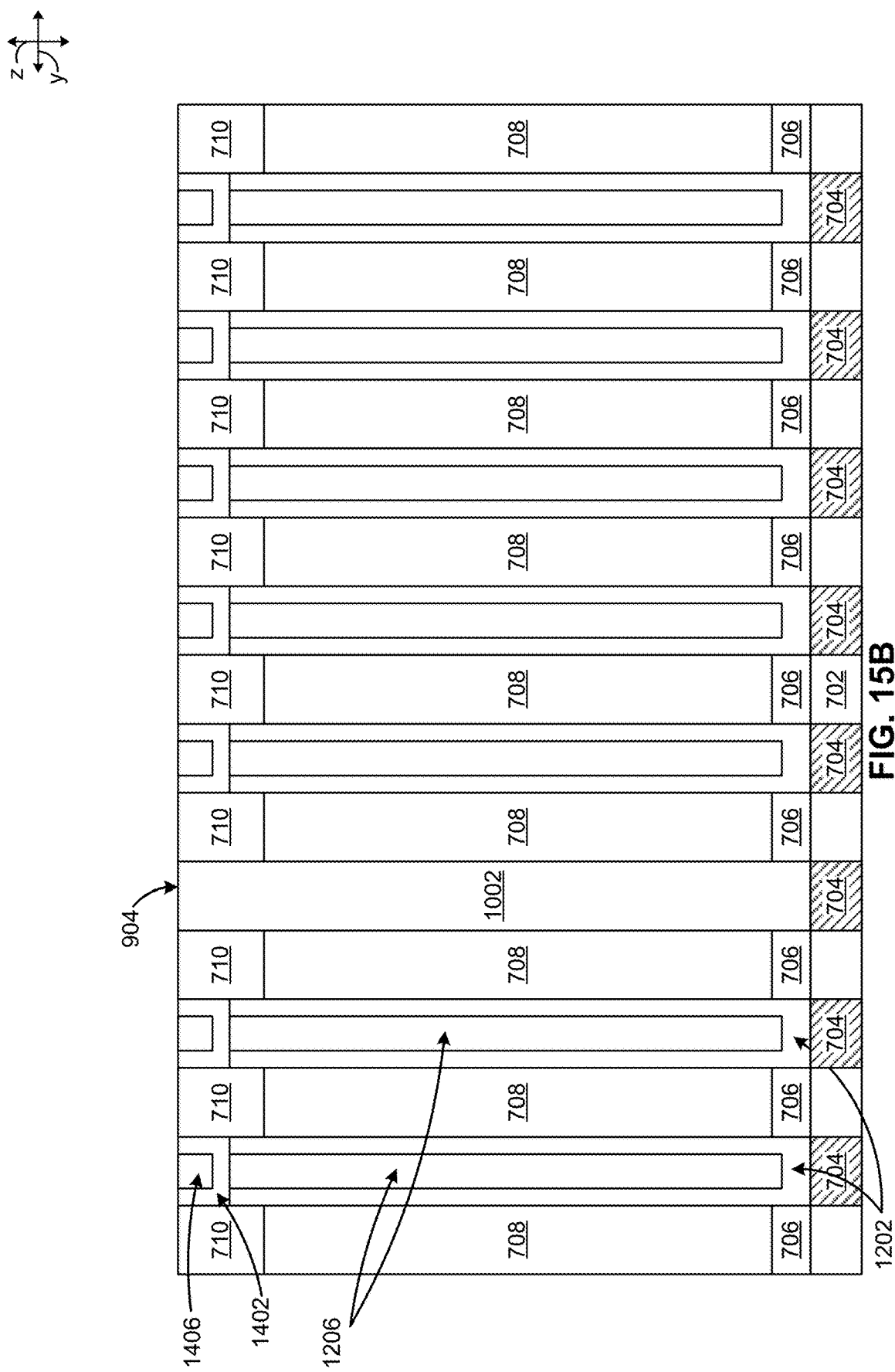

As shown in FIGS. 15A-15B, the process may include removing (e.g., etching) a portion of the electrically conductive material 1402 and/or removing (e.g., etching) a portion of the material 1406 down to the horizontal surface 904. In some implementations, the process may include planarizing the horizontal surface 904 of the integrated assembly. For example, the horizontal surface 904 may be planarized using chemical-mechanical polishing or another suitable planarization technique.

Figure 16A:
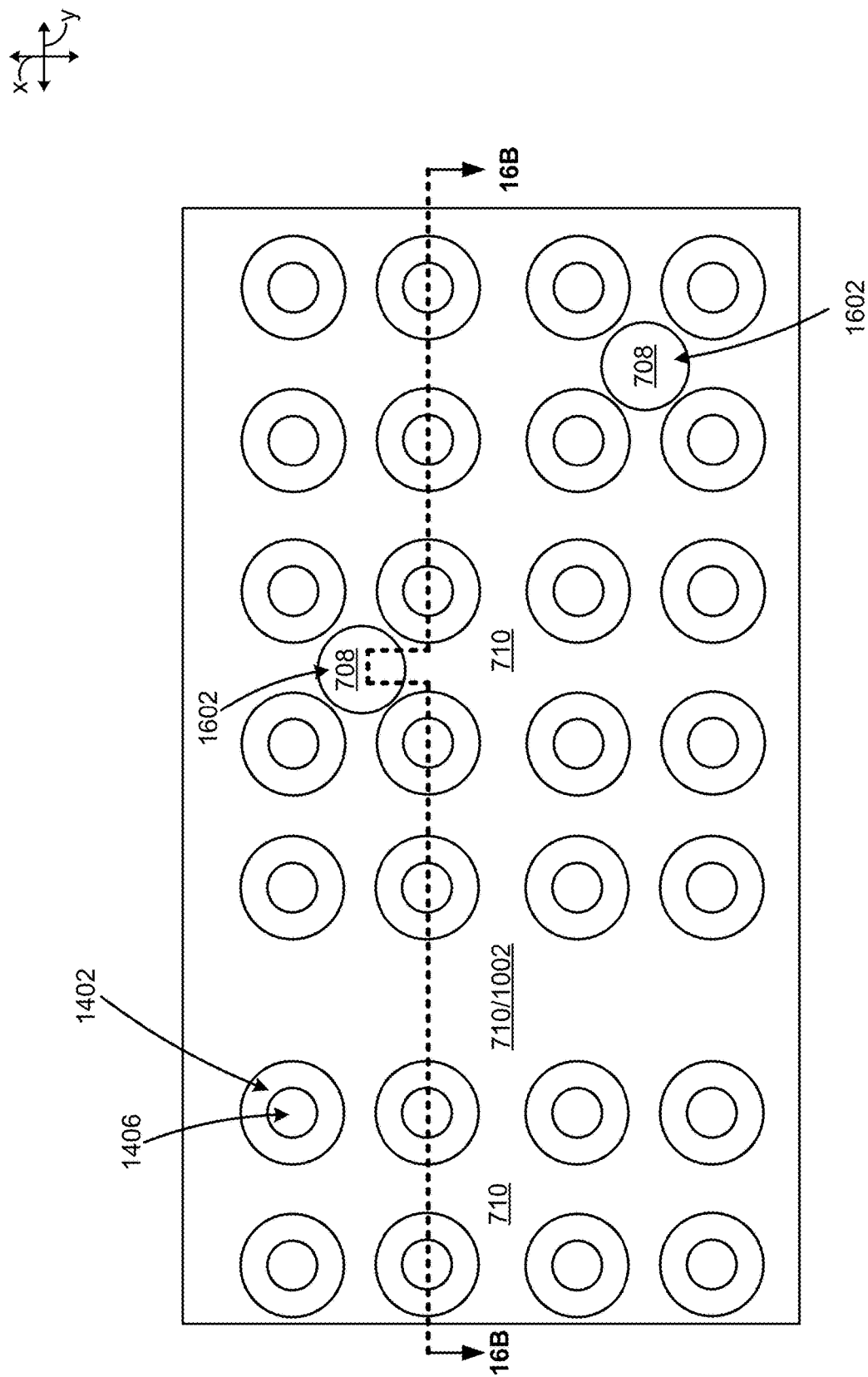
FIGS. 16A and 16B are diagrammatic views showing formation of the structure of FIGS. 5A-5B at an example process stage that is after the example process stage of FIGS. 15A and 15B.
Figure 16B:
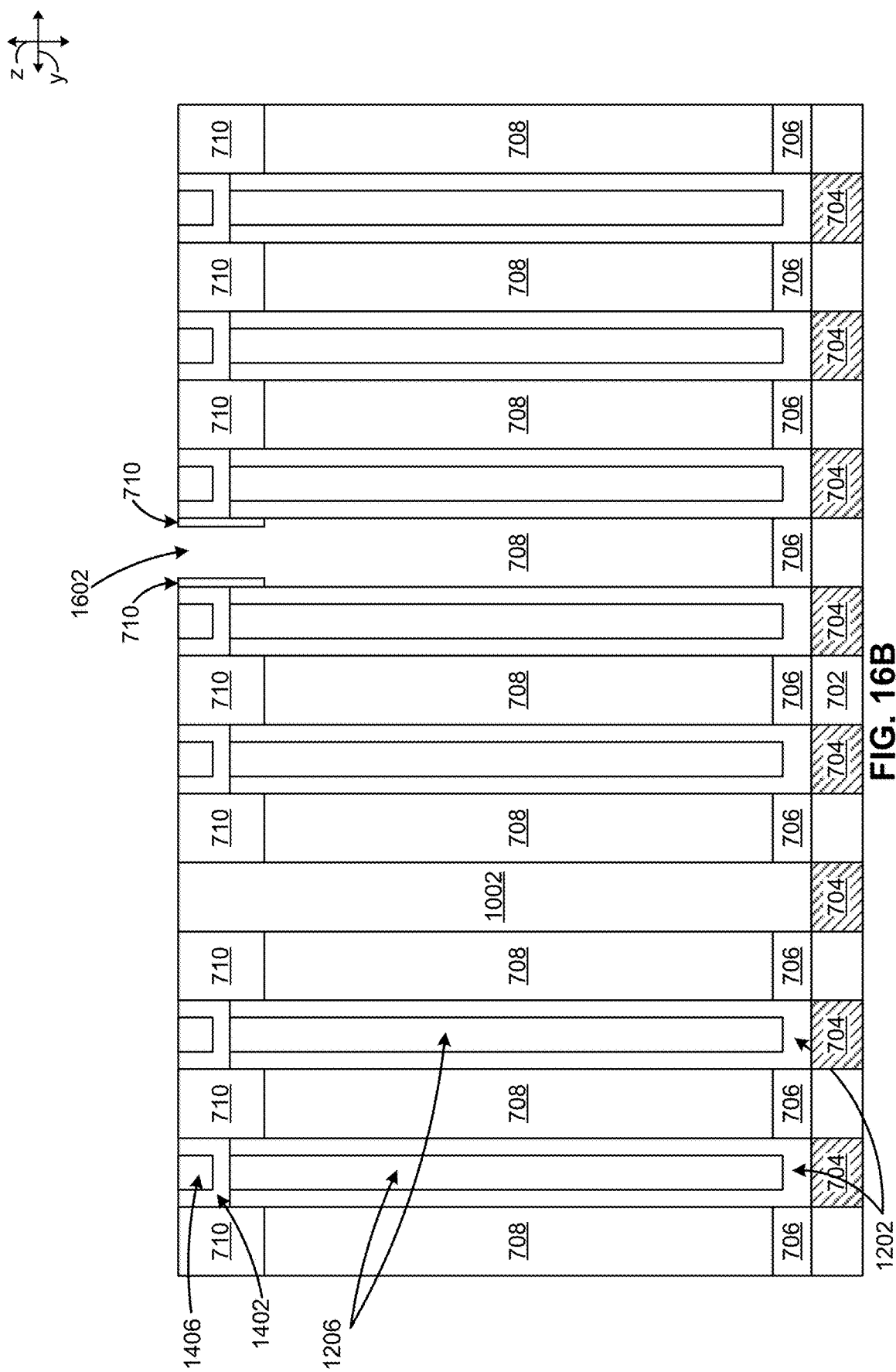

As shown in FIGS. 16A-16B, the process may include removing (e.g., etching) a portion of the insulative material 710 to form an opening 1602. The opening 1602 may expose the insulative material 708 (e.g., may remove insulative material 710 from a top surface of the insulative material 710 to the insulative material 708). The opening 1602 may be a first opening or a smaller opening (e.g., with a size that is smaller than a second opening or a larger opening, described below). In some implementations, the opening 1602 is formed using a dry etching process. As shown, in some implementations, the opening 1602 does not abut the electrically conductive material 1402 (e.g., of the leaker devices 155 in a first group 520, wherein the opening 1602 is in a first region 524). In some implementations, the opening 1602 is circular or cylindrical in shape, and the opening 1602 may have a diameter that is less than or equal to approximately 20 nanometers. In some implementations, adjacent leaker devices 155 are separated by approximately 23 nanometers (e.g., at a closest point between the leaker devices 155). Thus, a portion of the insulative material 710 may remain between the opening 1602 and the leaker devices 155 (e.g., approximately 1.5 nanometers on both sides of the opening 1602).

Figure 17A:
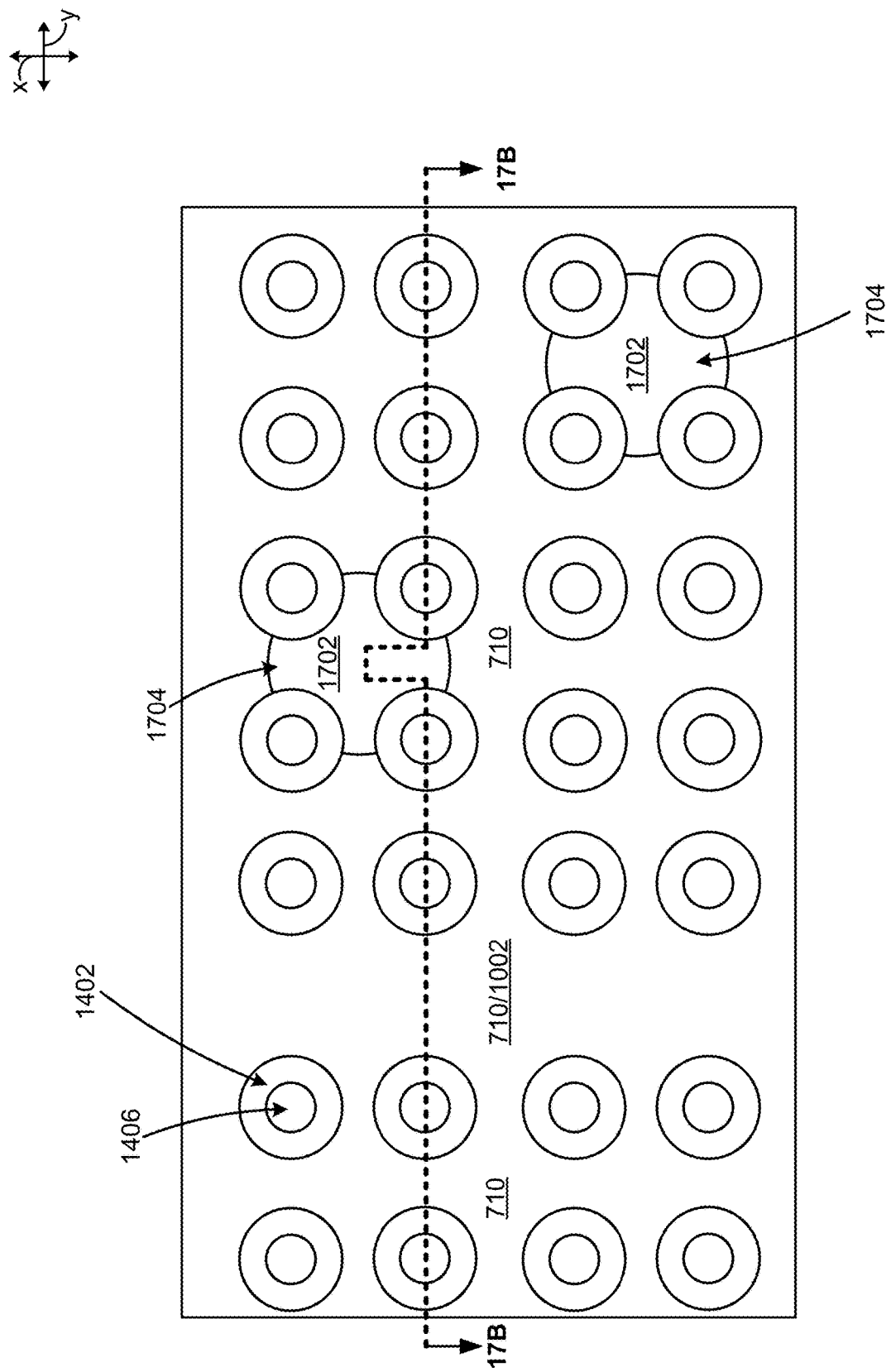
FIGS. 17A and 17B are diagrammatic views showing formation of the structure of FIGS. 5A-5B at an example process stage that is after the example process stage of FIGS.
Figure 17B:
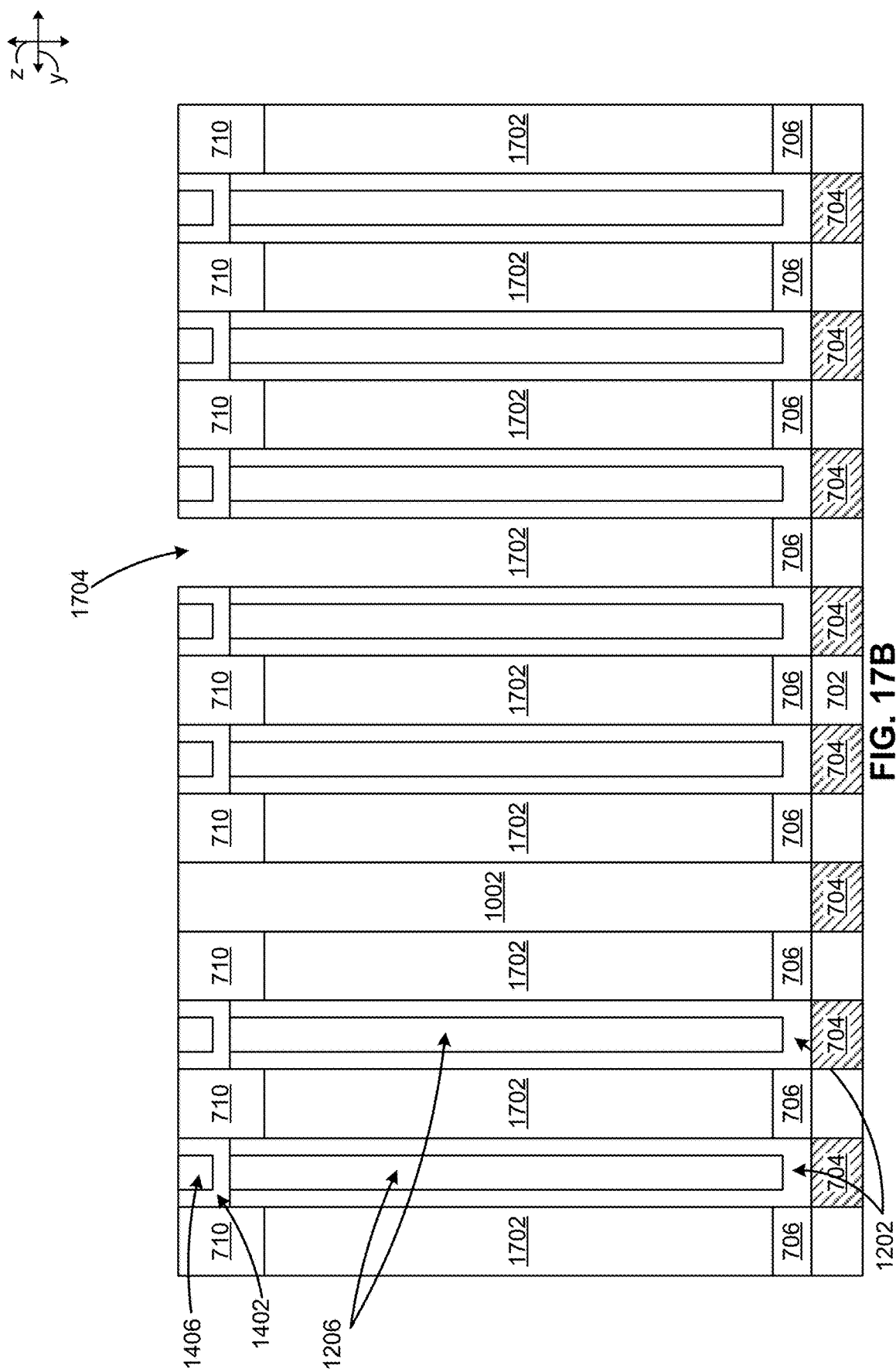

As shown in FIGS. 17A-17B, the process may include removing (e.g., etching) material to form voids 1702. The removed material may include the insulative material 708. For example, the insulative material 708 may be exhumed, such as by using a wet etching process that selectively removes the insulative material 708 (e.g., an oxide) without removing material (or without removing a significant amount of the material) of the bottom electrode 135 (e.g., the electrically conductive material 1202), the leaker device 155 (e.g., the electrically conductive material 1402), the separation structure 518 (e.g., the insulative material 1002, which may be a nitride), and/or the insulative layer 516 (e.g., the insulative material 706, which may be a nitride). In some implementations, the removed material may include a portion of the insulative material 710. For example, the insulative material 710 may have a lower etch rate in a solution used to remove the insulative material 708, such as a hydrogen fluoride solution (e.g., a 49% hydrogen fluoride solution), as compared to an etch rate of the insulative material 708 in the solution.

As shown in FIGS. 17A-17B, the removal process (e.g., the wet etching or exhuming process) may expand the first opening 1602 (e.g., the smaller opening) to form an opening 1704, sometimes called a second opening or a larger opening. As shown, in some implementations, the opening 1704 abuts the electrically conductive material 1402 (e.g., of each leaker device 155 in a first group 520, where the opening 1704 is in a first region 524). In some implementations, the opening 1704 is circular or cylindrical in shape, and the opening 1704 may have a diameter that is less than or equal to approximately 40 nanometers. In some implementations, the removal process removes a portion of the insulative material 710 that remains between the opening 1602 and the leaker devices 155 after the dry etching process.

Figure 18A:
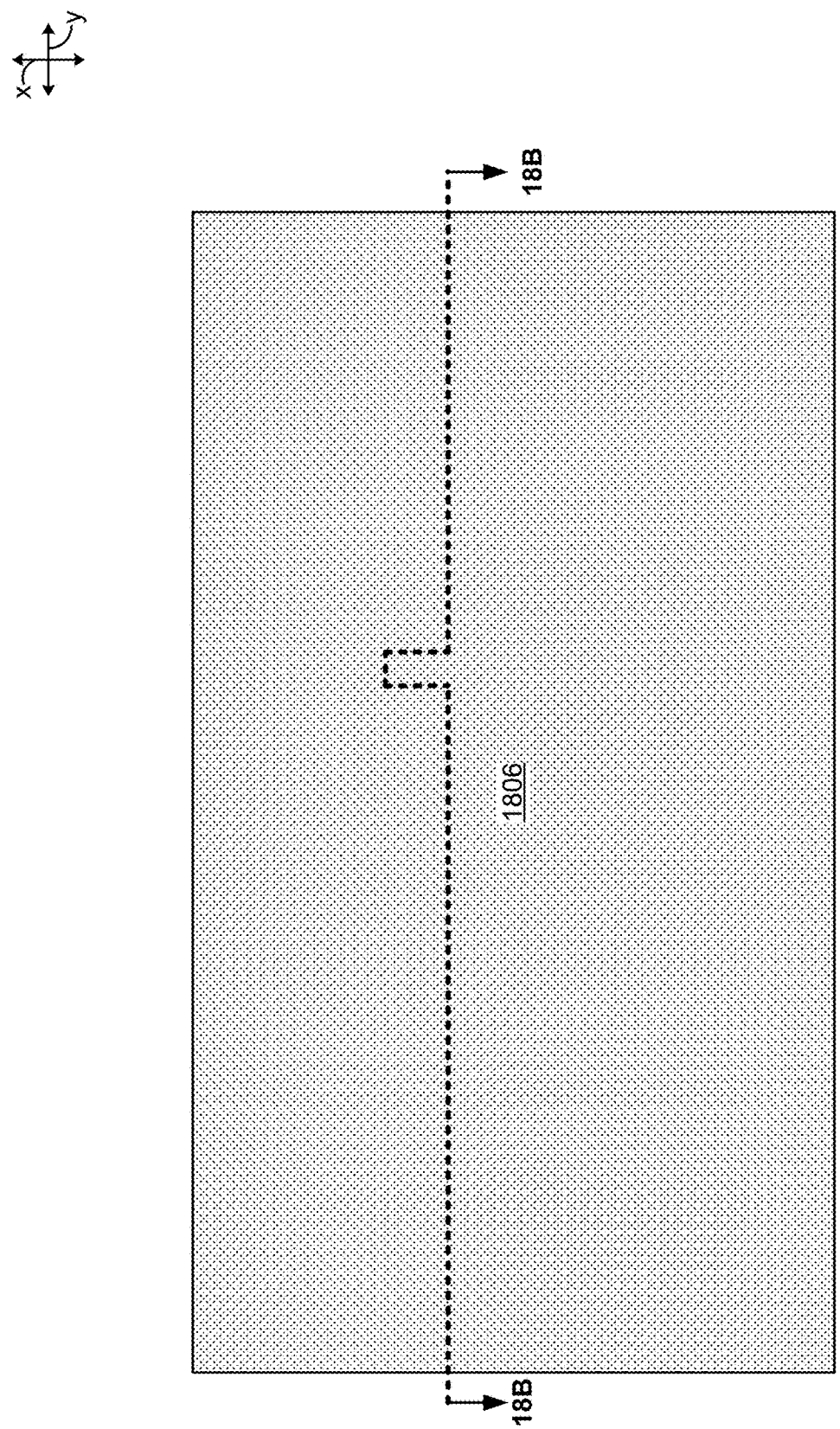
FIGS. 18A and 18B are diagrammatic views showing formation of the structure of FIGS. 5A-5B at an example process stage that is after the example process stage of FIGS. 17A and 17B.
Figure 18B:
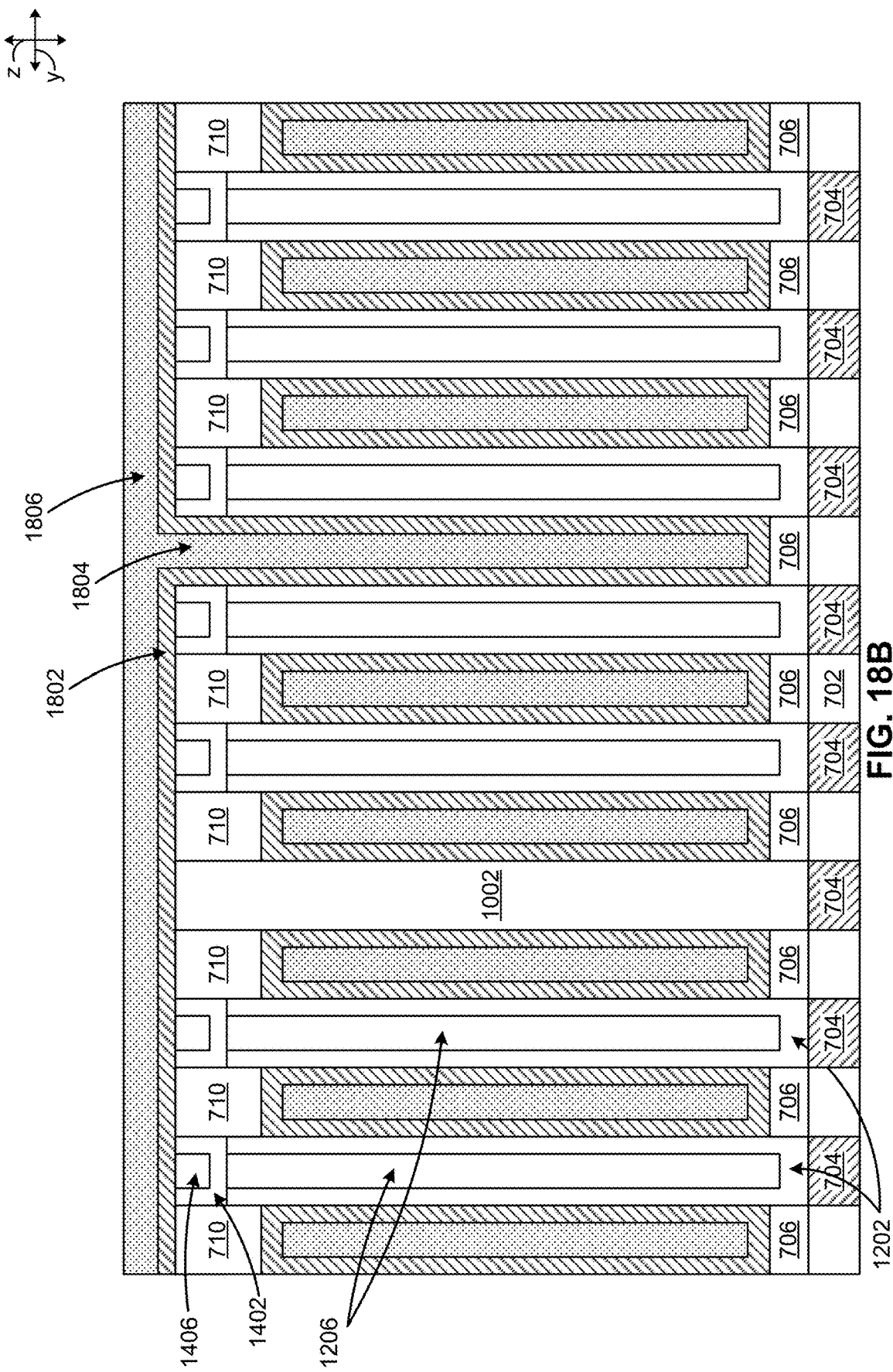

As shown in FIGS. 18A-18B, the process may include forming (e.g., depositing or growing) insulative material 1802 on the insulative material 706, the electrically conductive material 1202, the electrically conductive material 1402, the material 1406, the insulative material 710, and the insulative material 1002. For example, the insulative material 1802 may be formed in the voids 1702 along surfaces of materials that are exposed to the voids 1702. The insulative material 1802 may be formed such that a void 1804 is formed in a region contained by a shape of the insulative material 1802. The insulative material 1802 may form the insulator 145 and may comprise, consist of, or consist essentially of one or more of the materials described above in connection with the insulator 145.

As shown in FIGS. 18A-18B, the process may include forming (e.g., depositing or growing) electrically conductive material 1806 on the insulative material 1802. For example, the electrically conductive material 1806 may be formed in the voids 1804. In some implementations, the electrically conductive material 1806 may fill the voids 1804. The electrically conductive material 1806 may form top electrodes 140 and may comprise, consist of, or consist essentially of one or more of the materials described above in connection with the top electrode 140.

Figure 19A:
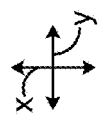
FIGS. 19A and 19B are diagrammatic views showing formation of the structure of FIGS. 5A-5B at an example process stage that is after the example process stage of FIGS. 18A and 18B.
Figure 19A:
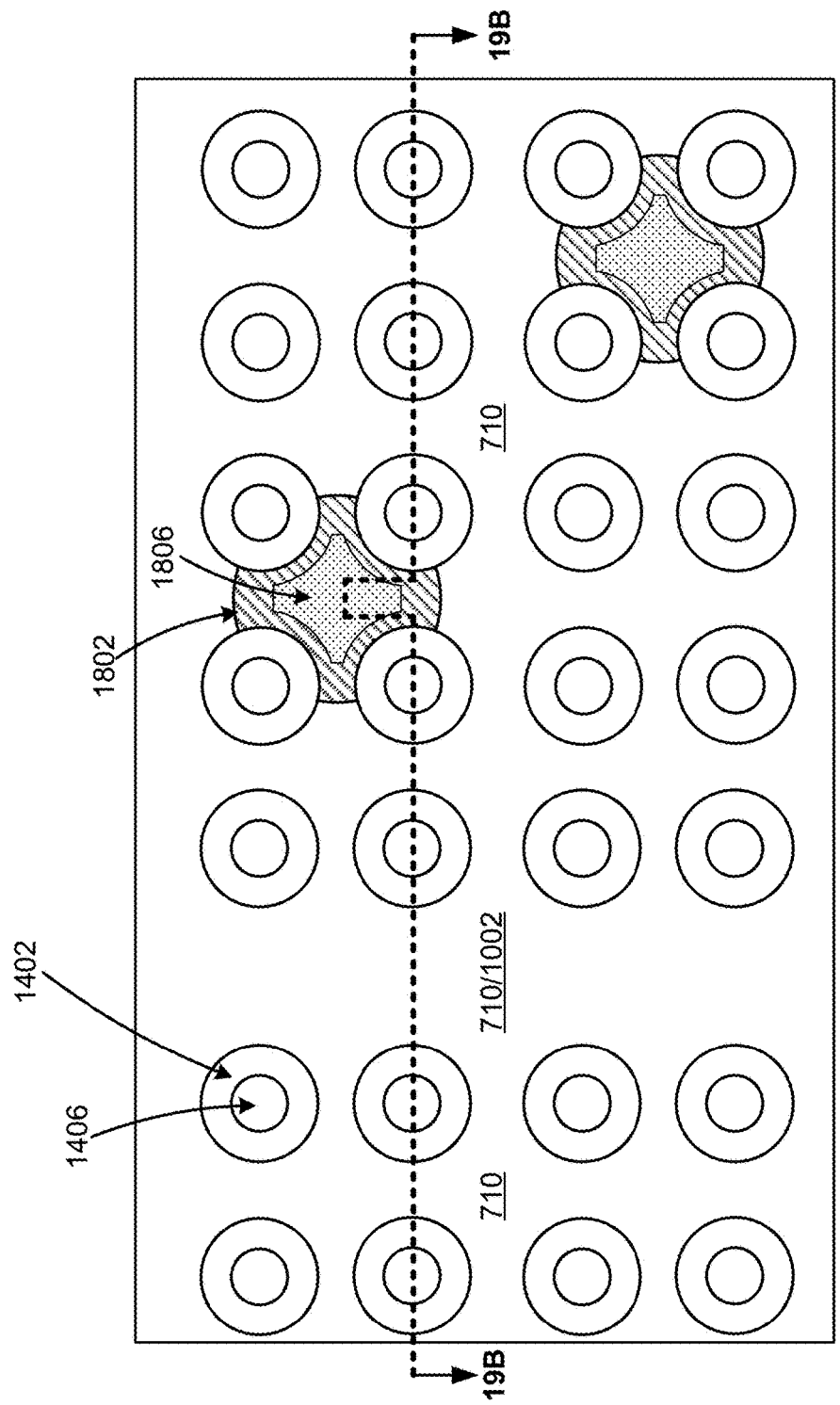
Figure 19B:
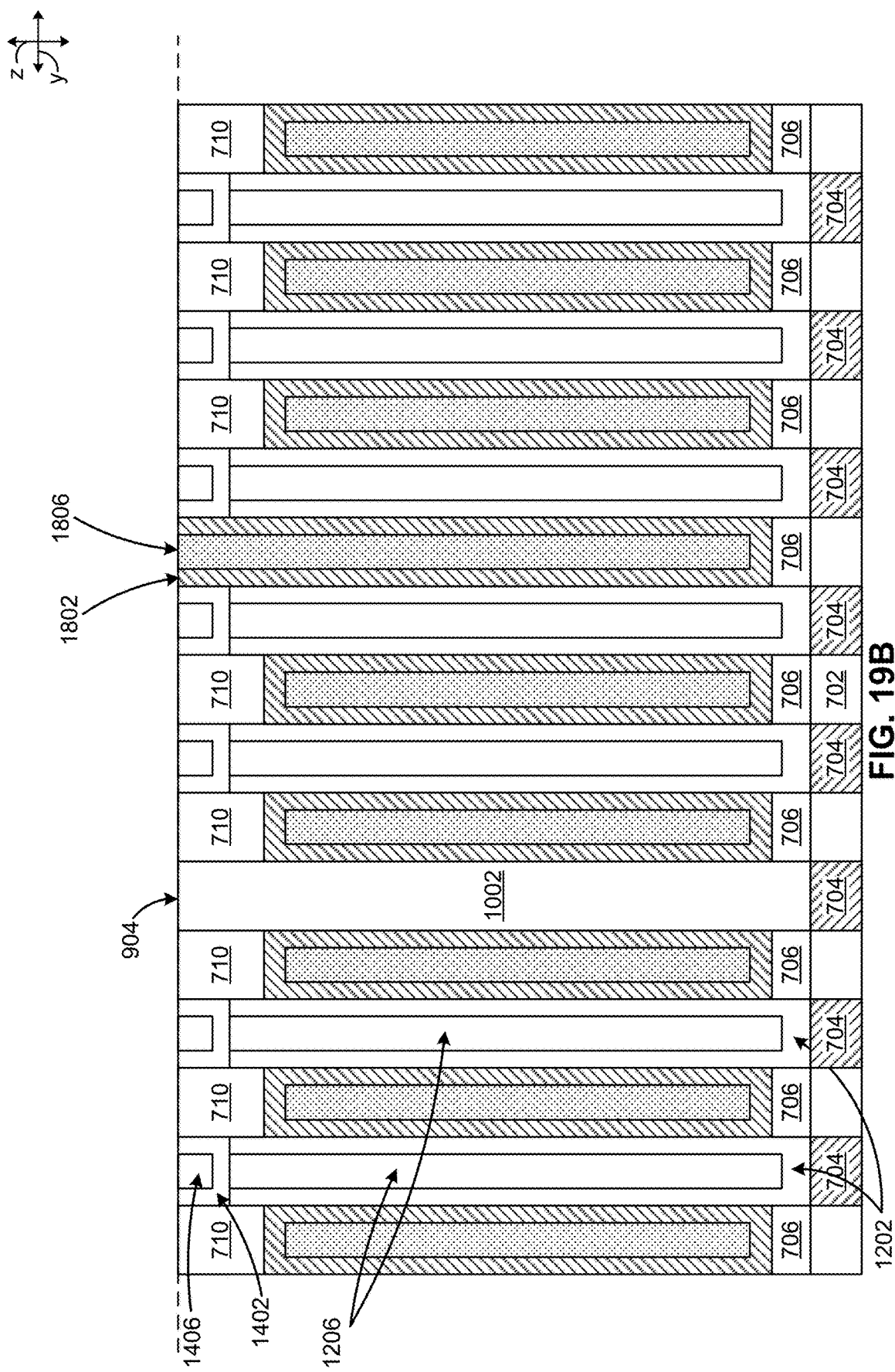

As shown in FIGS. 19A-19B, the process may include removing (e.g., etching) a portion of the insulative material 1802 and/or removing (e.g., etching) a portion of the electrically conductive material 1806 down to the horizontal surface 904. In some implementations, the process may include planarizing the horizontal surface 904 of the integrated assembly. For example, the horizontal surface 904 may be planarized using chemical-mechanical polishing or another suitable planarization technique.

Figure 20A:
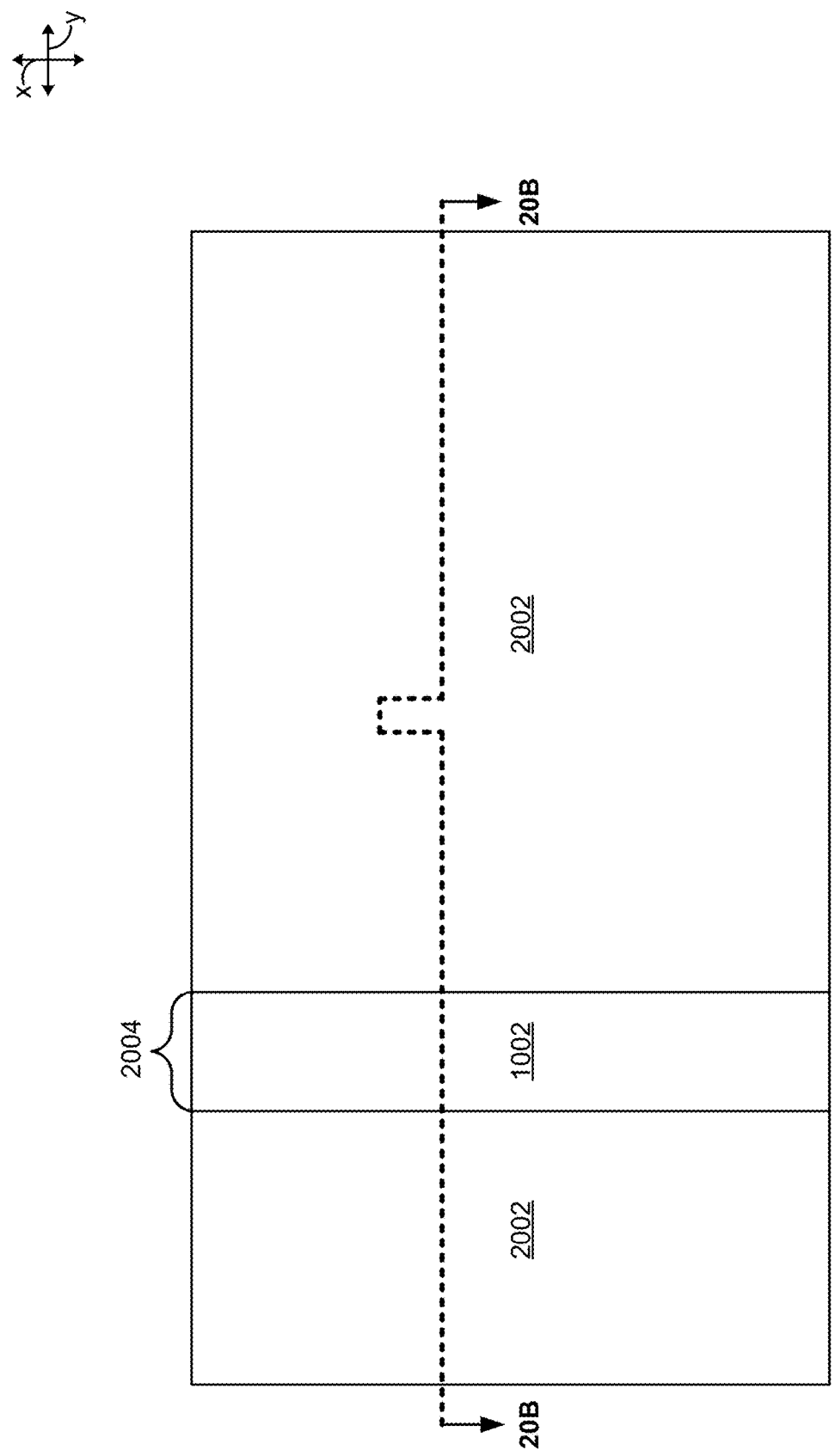
FIGS. 20A and 20B are diagrammatic views showing formation of the structure of FIGS. 5A-5B at an example process stage that is after the example process stage of FIGS. 19A and 19B.
Figure 20B:
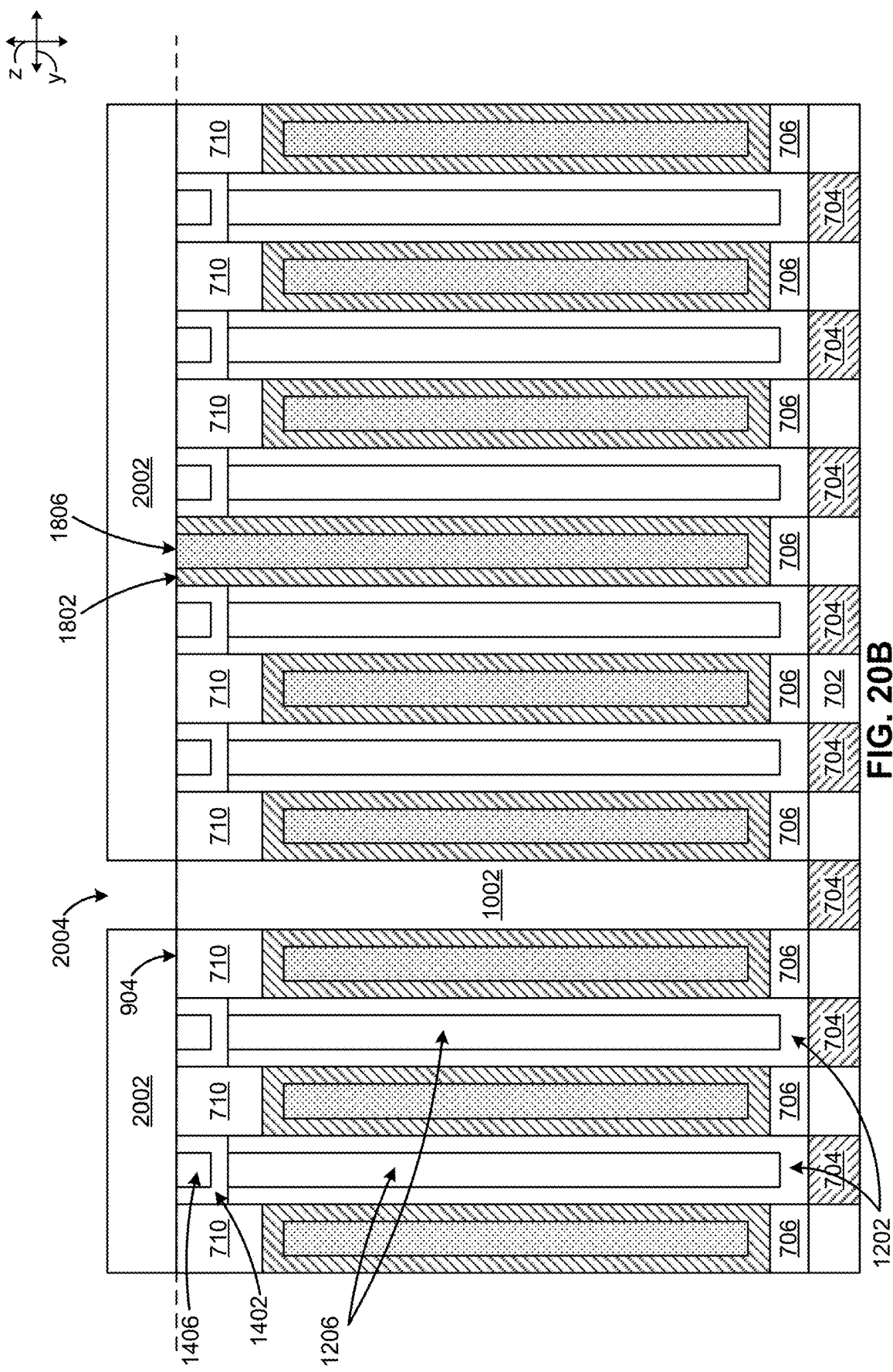

As shown in FIGS. 20A-20B, the process may include forming (e.g., depositing or growing) electrically conductive material 2002 on the insulative material 710, the electrically conductive material 1402, the material 1406, the insulative material 1802, the electrically conductive material 1806, and the insulative material 1002. The electrically conductive material 2002 may form the cell plates 150 and may comprise, consist of, or consist essentially of one or more of the materials described above in connection with the cell plate 150.

As shown in FIGS. 20A-20B, the process may include removing (e.g., etching) a portion of the electrically conductive material 2002 to form a gap 2004. The gap 2004 may remove all of the electrically conductive material 2002, along a trench, down to the insulative material 710 and/or the insulative material 1002 (e.g., down to the horizontal surface 904).

As indicated above, the process steps described in connection with FIGS. 7A-7B through 20A-20B are provided as examples. Other examples may differ from what is described with respect to FIGS. 7A-7B through 20A-20B. The structure shown in FIGS. 20A-20B may be equivalent to the structure 500 described elsewhere herein. In process steps above that describe forming material, such material may be formed, for example, using chemical vapor deposition, atomic layer deposition, physical vapor deposition, or another deposition technique. In process steps above that describe removing material, such material may be removed, for example, using a wet etching technique (e.g., wet chemical etching), a dry etching technique (e.g., plasma etching), an ion etching technique (e.g., sputtering or reactive ion etching), atomic layer etching, or another etching technique.

Figure 21:
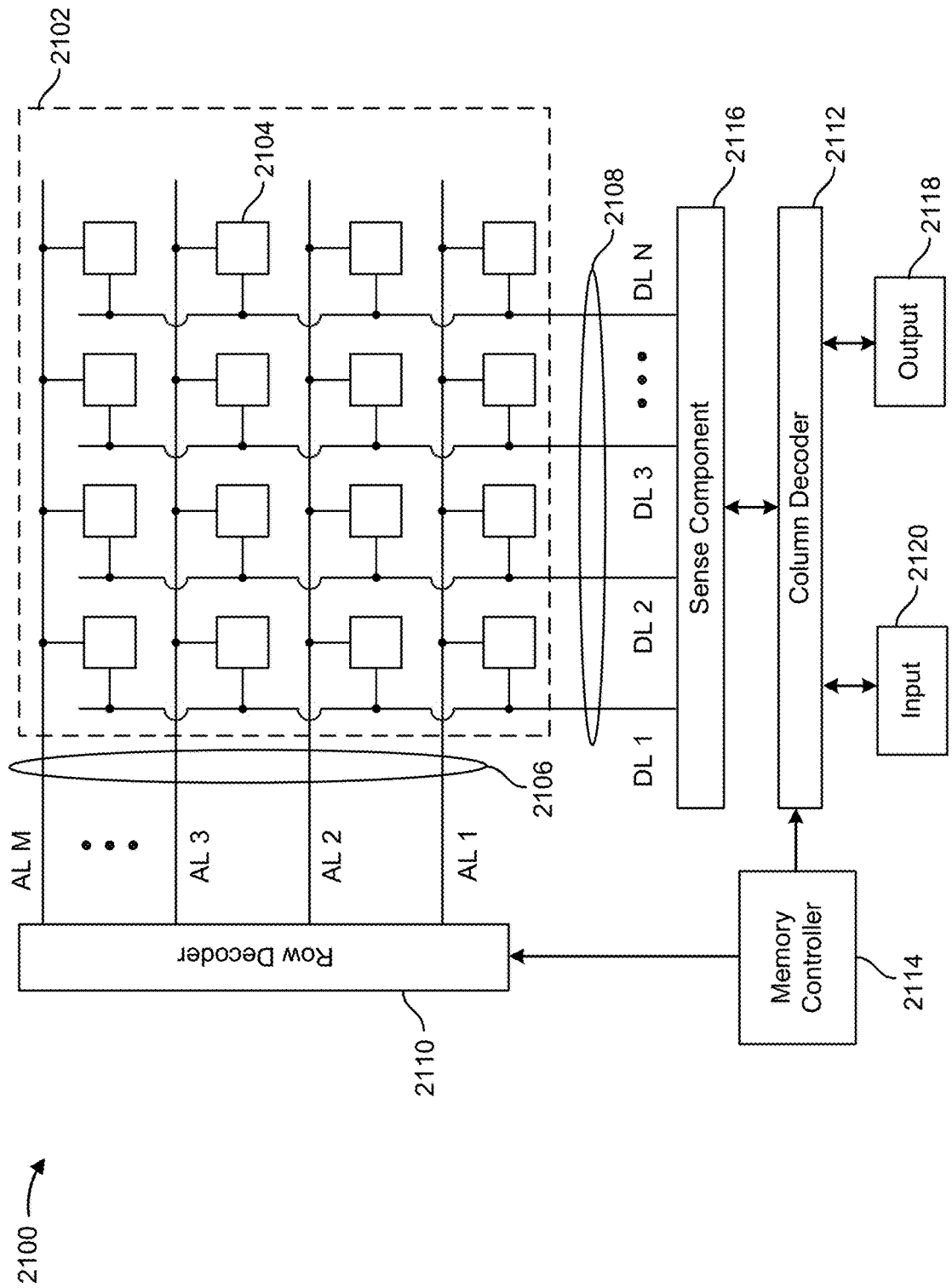
FIG. 21 is a diagrammatic view of an example memory device.

FIG. 21 is a diagrammatic view of an example memory device 2100. The memory device 2100 may include a memory array 2102 that includes multiple memory cells 2104. A memory cell 2104 is programmable or configurable into a data state of multiple data states (e.g., two or more data states). For example, a memory cell 2104 may be set to a particular data state at a particular time, and the memory cell 2104 may be set to another data state at another time. A data state may correspond to a value stored by the memory cell 2104. The value may be a binary value, such as a binary 0 or a binary 1, or may be a fractional value, such as 0.5, 1.5, or the like. A memory cell 2104 may include a capacitor to store a charge representative of the data state. For example, a charged and an uncharged capacitor may represent a first data state and a second data state, respectively. As another example, a first level of charge (e.g., fully charged) may represent a first data state, a second level of charge (e.g., fully discharged) may represent a second data state, a third level of charge (e.g., partially charged) may represent a third data state, and so son.

Operations such as reading and writing (i.e., cycling) may be performed on memory cells 2104 by activating or selecting the appropriate access line 2106 (shown as access lines AL 1 through AL M) and digit line 2108 (shown as digit lines DL 1 through DL N). An access line 2106 may also be referred to as a "row line" or a "word line," and a digit line 2108 may also be referred to a "column line" or a "bit line." Activating or selecting an access line 2106 or a digit line 2108 may include applying a voltage to the respective line. An access line 2106 and/or a digit line 2108 may comprise, consist of, or consist essentially of a conductive material, such as a metal (e.g., copper, aluminum, gold, titanium, or tungsten) and/or a metal alloy, among other examples. In FIG. 21, each row of memory cells 2104 is connected to a single access line 2106, and each column of memory cells 2104 is connected to a single digit line 2108. By activating one access line 2106 and one digit line 2108 (e.g., applying a voltage to the access line 2106 and digit line 2108), a single memory cell 2104 may be accessed at (e.g., is accessible via) the intersection of the access line 2106 and the digit line 2108. The intersection of the access line 2106 and the digit line 2108 may be called an "address" of a memory cell 2104.

In some implementations, the logic storing device of a memory cell 2104, such as a capacitor, may be electrically isolated from a corresponding digit line 2108 by a selection component, such as a transistor. The access line 2106 may be connected to and may control the selection component. For example, the selection component may be a transistor, and the access line 2106 may be connected to the gate of the transistor. Activating the access line 2106 results in an electrical connection or closed circuit between the capacitor of a memory cell 2104 and a corresponding digit line 2108. The digit line 2108 may then be accessed (e.g., is accessible) to either read from or write to the memory cell 2104.

A row decoder 2110 and a column decoder 2112 may control access to memory cells 2104. For example, the row decoder 2110 may receive a row address from a memory controller 2114 and may activate the appropriate access line 2106 based on the received row address. Similarly, the column decoder 2112 may receive a column address from the memory controller 2114 and may activate the appropriate digit line 2108 based on the column address.

Upon accessing a memory cell 2104, the memory cell 2104 may be read (e.g., sensed) by a sense component 2116 to determine the stored data state of the memory cell 2104. For example, after accessing the memory cell 2104, the capacitor of the memory cell 2104 may discharge onto its corresponding digit line 2108. Discharging the capacitor may be based on biasing, or applying a voltage, to the capacitor. The discharging may induce a change in the voltage of the digit line 2108, which the sense component 2116 may compare to a reference voltage (not shown) to determine the stored data state of the memory cell 2104. For example, if the digit line 2108 has a higher voltage than the reference voltage, then the sense component 2116 may determine that the stored data state of the memory cell 2104 corresponds to a first value, such as a binary 1. Conversely, if the digit line 2108 has a lower voltage than the reference voltage, then the sense component 2116 may determine that the stored data state of the memory cell 2104 corresponds to a second value, such as a binary 0. The detected data state of the memory cell 2104 may then be output (e.g., via the column decoder 2112) to an output component 2118 (e.g., a data buffer). A memory cell 2104 may be written (e.g., set) by activating the appropriate access line 2106 and digit line 2108. The column decoder 2112 may receive data, such as input from input component 2120, to be written to one or more memory cells 2104. A memory cell 2104 may be written by applying a voltage across the capacitor of the memory cell 2104.

The memory controller 2114 may control the operation (e.g., read, write, re-write, refresh, and/or recovery) of the memory cells 2104 via the row decoder 2110, the column decoder 2112, and/or the sense component 2116. The memory controller 2114 may generate row address signals and column address signals to activate the desired access line 2106 and digit line 2108. The memory controller 2114 may also generate and control various voltages used during the operation of the memory array 2102.

In some implementations, the memory device 2100 includes the structure 500 and/or an integrated assembly that includes the structure 500. For example, the memory array 2102 may include the structure 500 and/or an integrated assembly that includes the structure 500. Additionally, or alternatively, the memory cell 2104 may include a memory cell described elsewhere herein.

As indicated above, FIG. 21 is provided as an example. Other examples may differ from what is described with respect to FIG. 21.

In some implementations, an integrated assembly includes a cell plate; a first pillar that includes a first bottom electrode and a first leaker device that couples the first bottom electrode to the cell plate; a second pillar that includes a second bottom electrode and a second leaker device that couples the second bottom electrode to the cell plate; a third pillar that includes a third bottom electrode and a third leaker device that couples the third bottom electrode to the cell plate; a fourth pillar that includes a fourth bottom electrode and a fourth leaker device that couples the fourth bottom electrode to the cell plate; an insulator in contact with the first leaker device, the second leaker device, the third leaker device, and the fourth leaker device, wherein the insulator is not directly on top of any of the first leaker device, the second leaker device, the third leaker device, or the fourth leaker device; and a top electrode separated from the first bottom electrode, the second bottom electrode, the third bottom electrode, and the fourth bottom electrode by the insulator.

In some implementations, a memory device includes a cell plate; a top electrode; an insulator that separates the top electrode from a plurality of bottom electrodes; a first group of bottom electrodes, of the plurality of bottom electrodes, that are electrically coupled to the cell plate via a corresponding first group of leaker devices, wherein a first region between the first group of leaker devices along a horizontal plane includes the top electrode and the insulator; and a second group of bottom electrodes, of the plurality of bottom electrodes, that are electrically coupled to the cell plate via a corresponding second group of leaker devices, wherein a second region between the second group of leaker devices along the horizontal plane does not include the top electrode and does not include the insulator, wherein the first group of leaker devices and the second group of leaker devices have substantially identical electrical properties.

In some implementations, a method includes forming a lattice structure; forming a plurality of bottom electrode pillars supported by the lattice structure, forming a plurality of leaker devices, wherein each leaker device, of the plurality of leaker devices, is situated on top of a corresponding bottom electrode pillar of the plurality of bottom electrode pillars; forming an insulator in contact with the plurality of bottom electrode pillars and in contact with the plurality of leaker devices, wherein the insulator is not directly on top of any leaker device of the plurality of leaker devices; forming a top electrode that is separated from the plurality of bottom electrode pillars by the insulator; and forming a cell plate, wherein each leaker device, of the plurality of leaker devices, couples a corresponding bottom electrode pillar to the cell plate and is configured to discharge excess charge from that bottom electrode pillar to the cell plate.

The foregoing disclosure provides illustration and description but is not intended to be exhaustive or to limit the implementations to the precise forms disclosed. Modifications and variations may be made in light of the above disclosure or may be acquired from practice of the implementations described herein.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections and do not show materials behind those planes, unless indicated otherwise, to simplify the figures.

As used herein, the terms "substantially" and "approximately" mean "within reasonable tolerances of manufacturing and measurement." As used herein, "satisfying a threshold" may, depending on the context, refer to a value being greater than the threshold, greater than or equal to the threshold, less than the threshold, less than or equal to the threshold, equal to the threshold, not equal to the threshold, or the like.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a+b, a+c, b+c, and a+b+c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. An integrated assembly, comprising:
    a cell plate;
    a first pillar that includes a first bottom electrode and a first leaker device that couples the first bottom electrode to the cell plate;
    a second pillar that includes a second bottom electrode and a second leaker device that couples the second bottom electrode to the cell plate;
    a third pillar that includes a third bottom electrode and a third leaker device that couples the third bottom electrode to the cell plate;
    a fourth pillar that includes a fourth bottom electrode and a fourth leaker device that couples the fourth bottom electrode to the cell plate;
    an insulator in contact with the first leaker device, the second leaker device, the third leaker device, and the fourth leaker device,
        wherein the insulator is not directly on top of any of the first leaker device, the second leaker device, the third leaker device, or the fourth leaker device; and
    a top electrode separated from the first bottom electrode, the second bottom electrode, the third bottom electrode, and the fourth bottom electrode by the insulator.

2. The integrated assembly of claim 1, wherein a width of a first annulus that forms a top surface of the first leaker device is substantially identical along an entire circumference of the first annulus,
    wherein a width of a second annulus that forms a top surface of the second leaker device is substantially identical along an entire circumference of the second annulus,
    wherein a width of a third annulus that forms a top surface of the third leaker device is substantially identical along an entire circumference of the third annulus, and
    wherein a width of a fourth annulus that forms a top surface of the fourth leaker device is substantially identical along an entire circumference of the fourth annulus.

3. The integrated assembly of claim 1, wherein the insulator includes a first curved portion that abuts the first leaker device, a second curved portion that abuts the second leaker device, a third curved portion that abuts the third leaker device, and a fourth curved portion that abuts the fourth leaker device,
    wherein respective top surfaces of the first curved portion, the second curved portion, the third curved portion, and the fourth curved portion are substantially horizontally aligned with respective top surfaces of the first leaker device, the second leaker device, the third leaker device, and the fourth leaker device.

4. The integrated assembly of claim 1, further comprising first leaker fill material contained within the first leaker device, second leaker fill material contained within the second leaker device, third leaker fill material contained within the third leaker device, and fourth leaker fill material contained within the fourth leaker device,
    wherein the insulator is not directly on top of any of the first leaker fill material, the second leaker fill material, the third leaker fill material, or the fourth leaker fill material.

5. The integrated assembly of claim 4, wherein the top electrode is not directly on top of any of the first leaker fill material, the second leaker fill material, the third leaker fill material, or the fourth leaker fill material.

6. The integrated assembly of claim 1, wherein the top electrode is not directly on top of any of the first leaker device, the second leaker device, the third leaker device, or the fourth leaker device.

7. The integrated assembly of claim 1, further comprising a lattice structure that is in contact with the first leaker device, the second leaker device, the third leaker device, and the fourth leaker device,
    wherein the lattice structure has an etch rate between approximately 3 Angstroms per second and approximately 7 Angstroms per second in an approximately 49% hydrogen fluoride solution.

8. The integrated assembly of claim 1, wherein a top surface of the insulator and a top surface of the top electrode are substantially horizontally aligned with respective top surfaces of the first leaker device, the second leaker device, the third leaker device, and the fourth leaker device in a region between the first leaker device, the second leaker device, the third leaker device, and the fourth leaker device.

9. The integrated assembly of claim 1, further comprising:
    a lattice structure;
    a fifth pillar that includes a fifth bottom electrode and a fifth leaker device that couples the fifth bottom electrode to the cell plate;
    a sixth pillar that includes a sixth bottom electrode and a sixth leaker device that couples the sixth bottom electrode to the cell plate;
    a seventh pillar that includes a seventh bottom electrode and a seventh leaker device that couples the seventh bottom electrode to the cell plate; and an eighth pillar that includes an eighth bottom electrode and an eighth leaker device that couples the eighth bottom electrode to the cell plate,
  wherein a top surface of the insulator and a top surface of the top electrode are horizontally lower than respective top surfaces of the fifth leaker device, the sixth leaker device, the seventh leaker device, and the eighth leaker device in a region between the fifth leaker device, the sixth leaker device, the seventh leaker device, and the eighth leaker device, and
  wherein a top surface of the lattice structure is substantially horizontally aligned with respective top surfaces of the fifth leaker device, the sixth leaker device, the seventh leaker device, and the eighth leaker device in the region between the fifth leaker device, the sixth leaker device, the seventh leaker device, and the eighth leaker device.

10. The integrated assembly of claim 9, wherein the first leaker device, the second leaker device, the third leaker device, the fourth leaker device, the fifth leaker device, the sixth leaker device, the seventh leaker device, and the eighth leaker device all have substantially identical electrical properties.

11. The integrated assembly of claim 9, wherein the first leaker device, the second leaker device, the third leaker device, the fourth leaker device, the fifth leaker device, the sixth leaker device, the seventh leaker device, and the eighth leaker device all have at least one of:
  a substantially identical electrical conductivity,
  a substantially identical electrical resistance,
  a capability to discharge a substantially identical amount of excess charge from a respective bottom electrode, or
  a capability to discharge excess charge at a substantially identical rate of discharge.

12. A memory device, comprising:
  a cell plate;
  a top electrode;
  an insulator that separates the top electrode from a plurality of bottom electrodes;
  a first group of bottom electrodes, of the plurality of bottom electrodes, that are electrically coupled to the cell plate via a corresponding first group of leaker devices,
    wherein a first region between the first group of leaker devices along a horizontal plane includes the top electrode and the insulator; and
  a second group of bottom electrodes, of the plurality of bottom electrodes, that are electrically coupled to the cell plate via a corresponding second group of leaker devices,
    wherein a second region between the second group of leaker devices along the horizontal plane does not include the top electrode and does not include the insulator,
    wherein the first group of leaker devices and the second group of leaker devices have substantially identical electrical properties.

13. The memory device of claim 12, wherein the second region includes a lattice structure that is in contact with the second group of leaker devices.

14. The memory device of claim 13, wherein the lattice structure is a nitride having an etch rate between approximately 3 Angstroms per second and approximately 7 Angstroms per second in an approximately 49% hydrogen fluoride solution.

15. The memory device of claim 13, wherein the lattice structure is also in contact with the first group of leaker devices.

16. The memory device of claim 12, wherein the first group of leaker devices and the second group of leaker devices have substantially identical physical dimensions.

17. The memory device of claim 12, wherein the insulator includes a first curved portion that abuts a first leaker device included in the first group of leaker devices, a second curved portion that abuts a second leaker device included in the first group of leaker devices, a third curved portion that abuts a third leaker device included in the first group of leaker devices, and a fourth curved portion that abuts a fourth leaker device included in the first group of leaker devices,
  wherein respective top surfaces of the first curved portion, the second curved portion, the third curved portion, and the fourth curved portion are substantially horizontally aligned with respective top surfaces of the first leaker device, the second leaker device, the third leaker device, and the fourth leaker device.

18. The memory device of claim 12, wherein each leaker device, included in the first group of leaker devices, has an annular-shaped top surface with a width that is substantially uniform along an entire circumference of the annular-shaped top surface.

19. The memory device of claim 12, wherein the insulator is not directly on top of any of the leaker devices included in the first group of leaker devices.

20. The memory device of claim 12, wherein the first group of leaker devices includes four leaker devices.

21. A method, comprising:
  forming a lattice structure;
  forming a plurality of bottom electrode pillars supported by the lattice structure,
  forming a plurality of leaker devices,
    wherein each leaker device, of the plurality of leaker devices, is situated on top of a corresponding bottom electrode pillar of the plurality of bottom electrode pillars;
  forming an insulator in contact with the plurality of bottom electrode pillars and in contact with the plurality of leaker devices,
    wherein the insulator is not directly on top of any leaker device of the plurality of leaker devices;
  forming a top electrode that is separated from the plurality of bottom electrode pillars by the insulator; and
  forming a cell plate,
    wherein each leaker device, of the plurality of leaker devices, couples a corresponding bottom electrode pillar to the cell plate and is configured to discharge excess charge from that bottom electrode pillar to the cell plate.

22. The method of claim 21, wherein the insulator includes a first curved portion that abuts a first leaker device of the plurality of leaker devices, a second curved portion that abuts a second leaker device of the plurality of leaker devices, a third curved portion that abuts a third leaker device of the plurality of leaker devices, and a fourth curved portion that abuts a fourth leaker device of the plurality of leaker devices,
  wherein respective top surfaces of the first curved portion, the second curved portion, the third curved portion, and the fourth curved portion are substantially horizontally aligned with respective top surfaces of the first leaker device, the second leaker device, the third leaker device, and the fourth leaker device.

23. The method of claim 21, further comprising forming an opening in the lattice structure in a region between a group of leaker devices of the plurality of leaker devices,
- wherein the opening abuts each leaker device included in the group of leaker devices, and
- wherein forming the opening does not remove material of the group of leaker devices;
- wherein forming the insulator comprises depositing insulative material into the opening; and
- wherein forming the top electrode comprises depositing conductive material into the opening.

24. The method of claim 23, wherein forming the opening comprises:
- forming a first opening using a dry etching process, wherein the first opening has a size that is smaller than the opening, and wherein the first opening does not abut any leaker device included in the group of leaker devices; and
- expanding the first opening, to form the opening, using a wet etching process.

25. The method of claim 21, wherein the lattice structure has an etch rate between approximately 3 Angstroms per second and approximately 7 Angstroms per second in an approximately 49% hydrogen fluoride solution.

\* \* \* \* \*